US009075122B2

(12) United States Patent     (10) Patent No.: US 9,075,122 B2
Fleysher et al.     (45) Date of Patent: Jul. 7, 2015

(54) METHOD, SYSTEM AND COMPUTER-ACCESSIBLE MEDIUM FOR PROVIDING MULTIPLE-QUANTUM-FILTERED IMAGING

(75) Inventors: Lazar Fleysher, Brooklyn, NY (US); Matilde Inglese, New York, NY (US)

(73) Assignee: New York University, New York, NY (US)

( * ) Notice: Subject to any disclaimer, the term of this patent is extended or adjusted under 35 U.S.C. 154(b) by 1066 days.

(21) Appl. No.: 12/941,923

(22) Filed: Nov. 8, 2010

(65) Prior Publication Data

US 2011/0163748 A1    Jul. 7, 2011

Related U.S. Application Data

(60) Provisional application No. 61/259,046, filed on Nov. 6, 2009.

(51) Int. Cl.
*G01R 33/56*     (2006.01)
*G01R 33/485*    (2006.01)
*G01R 33/565*    (2006.01)
*G01R 33/46*     (2006.01)

(52) U.S. Cl.
CPC ...... *G01R 33/56563* (2013.01); *G01R 33/4608* (2013.01); *G01R 33/485* (2013.01); *G01R 33/56* (2013.01); *G01R 33/5605* (2013.01)

(58) Field of Classification Search
USPC ............ 324/300–322; 600/407–435; 604/20; 424/490, 9.1; 343/700 MS; 382/128–131; 702/20, 19
See application file for complete search history.

(56) References Cited

U.S. PATENT DOCUMENTS

| 3,404,332 | A | * | 10/1968 | Solomon et al. | 324/301 |
| 4,680,546 | A | * | 7/1987 | Dumoulin | 324/307 |
| 5,166,616 | A | * | 11/1992 | Doddrell et al. | 324/307 |

(Continued)

OTHER PUBLICATIONS

Borthakur et al. "In vivo triple quantum filtered twisted projection sodium mri of human articular cartilage" J Magn Reson 14, 286-290 (1999).

(Continued)

*Primary Examiner* — Melissa Koval
*Assistant Examiner* — Tiffany Fetzner
(74) *Attorney, Agent, or Firm* — Andrews Kurth LLP

(57) ABSTRACT

The present disclosure describes exemplary embodiments of process, system, computer-accessible medium and processing arrangement which can be used to provide multiple-quantum-filtered imaging. For example, provided herein is an exemplary system that can include an arrangement which can be configured to extract and/or determine at least one Nuclear Magnetic Resonance (NMR) signal provided from an anatomical sample utilizing differences of phases of excitation pulses provided from an apparatus. The NMR signal(s) can relate to at least one multiple-quantum coherence in a presence of $B_0$ inhomogeneities associated with the anatomical sample. The exemplary arrangement can be or include a triple and/or double quantum filter arrangement. Exemplary extraction or detection can be from quantum systems having up to N orders of coherence using a pair of paired phase cycles. Further, it is possible to quantify the intracellular concentration contribution based on the signals, in accordance with certain exemplary embodiments of the present disclosure.

39 Claims, 42 Drawing Sheets

(56) References Cited

U.S. PATENT DOCUMENTS

| | | | | |
|---|---|---|---|---|
| 5,521,504 | A * | 5/1996 | Cory et al. | 324/309 |
| 5,818,230 | A * | 10/1998 | Katz et al. | 324/307 |
| 5,951,473 | A * | 9/1999 | Sherry et al. | 600/420 |
| 6,373,250 | B1 * | 4/2002 | Tsoref et al. | 324/309 |
| 6,681,132 | B1 * | 1/2004 | Katz et al. | 600/410 |
| 7,586,306 | B2 * | 9/2009 | Szyperski et al. | 324/309 |
| 2003/0180766 | A1 * | 9/2003 | Farnet et al. | 435/6 |
| 2007/0020181 | A1 * | 1/2007 | Workman et al. | 424/9.1 |
| 2007/0061084 | A1 * | 3/2007 | Farnet et al. | 702/19 |
| 2008/0010025 | A1 * | 1/2008 | Farnet et al. | 702/20 |
| 2009/0033326 | A1 * | 2/2009 | Szyperski et al. | 324/307 |
| 2011/0163748 | A1 * | 7/2011 | Fleysher et al. | 324/307 |
| 2012/0212375 | A1 * | 8/2012 | Depree, IV | 343/700 MS |
| 2012/0263793 | A1 * | 10/2012 | Vitaliano | 424/490 |
| 2013/0144156 | A1 * | 6/2013 | Boulant | 600/410 |
| 2013/0237899 | A1 * | 9/2013 | Pepperberg et al. | 604/20 |

OTHER PUBLICATIONS

Brown et al. "NMR measurements of spin-3/2 transverse relaxation in an inhomogeneous field" Chem Phys Lett 224, 508-516 (1994).

Hancu et al. "Three-Dimensional Triple-Quantum-Filtered Na Imaging of In Vivo Human Brain" Magn Reson Med 42, 1146-1154 (1999).

Jaccard et al. "Multiple-quantum NMR spectroscopy of s=3/2 spins in isotropic phase: a new probe for multiexponential relaxation" J. Chem. Phys. 185, 6282-6293 (1986).

Kalyanapuram et al. "Three-Dimensional Triple-Quantum-Filtered 23Na Imaging of the Dog Head In Vivo" J Magn Reson Imag 8, 1182-1189 (1995).

Kemp-Harper et al. "Three-Dimensional Triple-Quantum-Filtration Na NMR Imaging" J Magn Reson 108, 280-284 (1995).

LaVerde et al, "Serial Triple Quantum Sodium MRI During Non-human Primate Focal Brain Ischemia" Magn Reson Med 57, 201-205 (2007).

Ouwerkerk et al. "Tissue sodium concentration in human brain tumors as measured with 23Na MR imaging" Radiology 2003;227(2):529-537.

Pelligrino et al. "Interregional differences in brain intracellular pH and water compartmentation during acute normoxic and hypoxic . . . " Brain Res 1981;214(2):387-404.

Reddy et al. "Multiple-Quantum Filters of Spin-3/2 with Pulses of Arbitrary Flip Angle" J Magn Reson, Series B 104, 148-152 (1994).

Reddy et al. "Triple quantum sodium imaging of articular cartilage" Magn Reson Med 38, 279-284 (1997).

Tanase et al. "Triple Quantum Sodium MRI During Non-human Primate Focal Brain Ischemia" Magn Reson Med 57, 201-205 (2007).

Wimperis et al. Triple-Quantum-Filtration NMR Imaging of 200 mM Sodium at 1.9 Tesla, J Magn Reson 98, 628-636 (1992).

Boulton et al. "Neuromethods" vol. 9. Clifton: Humana Press; p. 105 (1988).

Zhu et al. "Selectin of coherence transfer pathways by pulsed-field gradients in NMR spectroscopy" Concepts Magn Reson 7, 281-291 (1995).

* cited by examiner

Fig. 13C
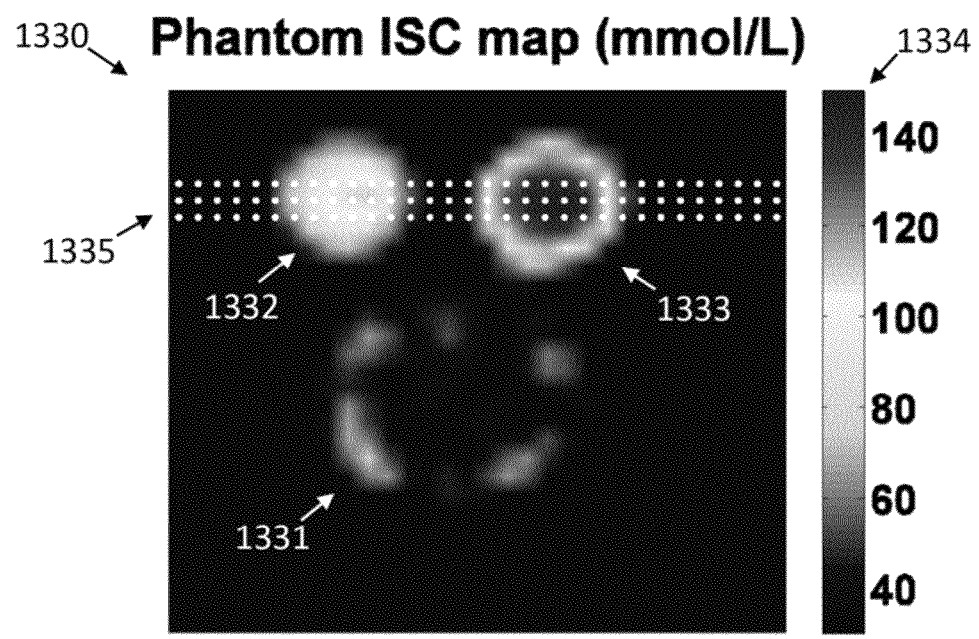
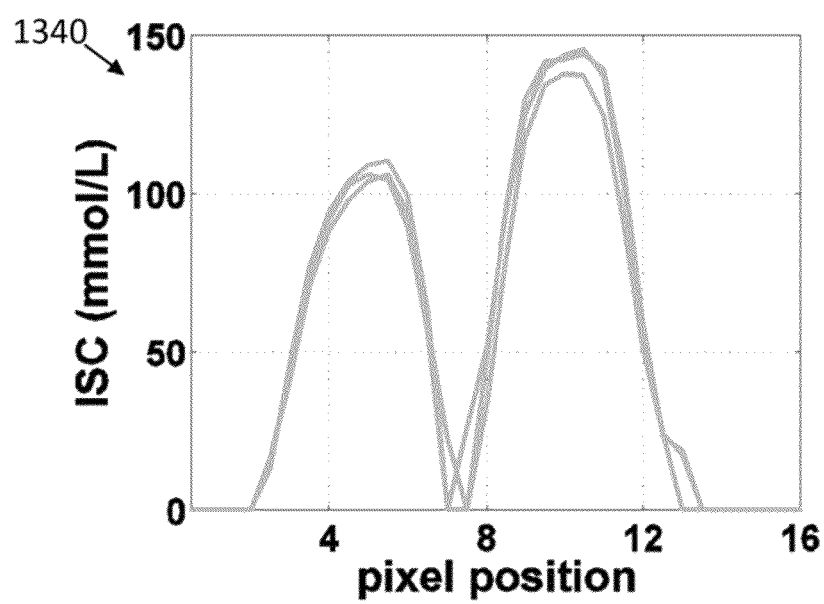
Fig. 13D

Fig. 13E
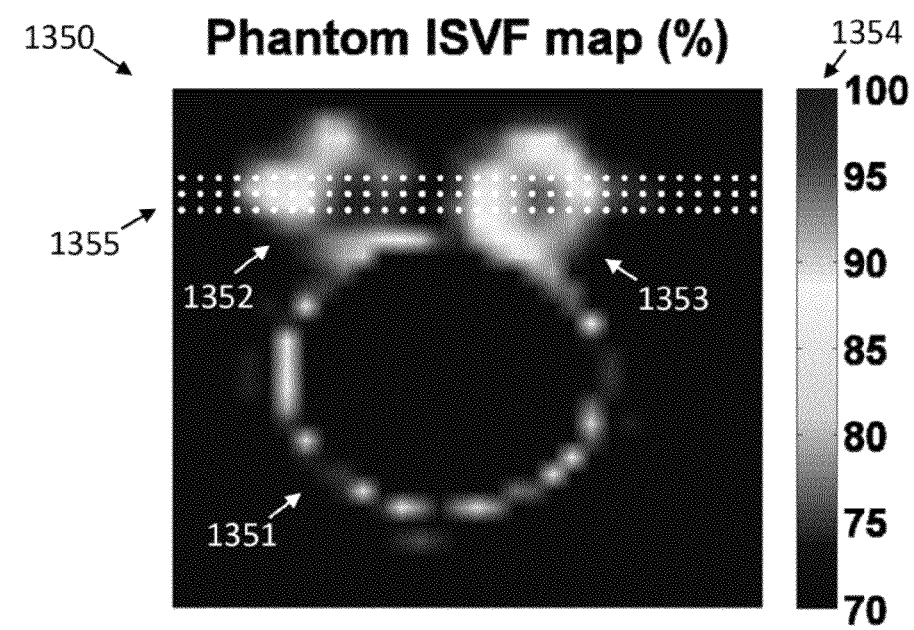
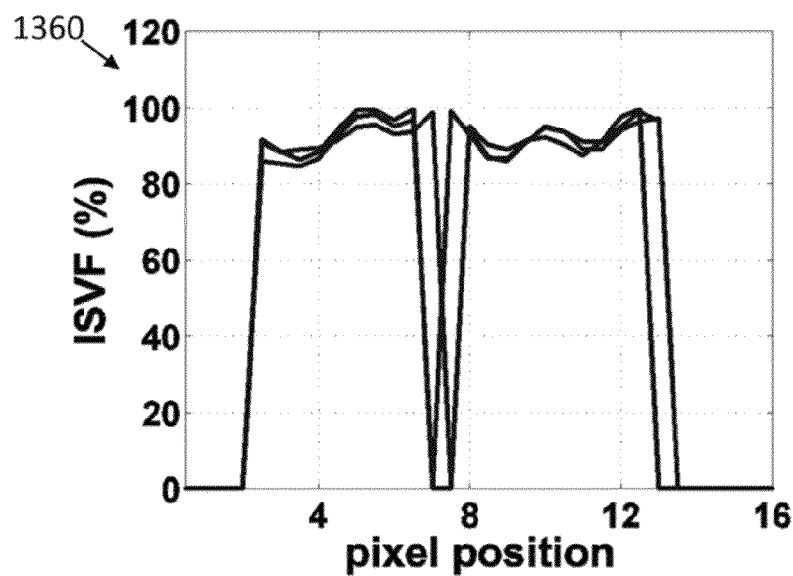
Fig. 13F

Fig. 14A
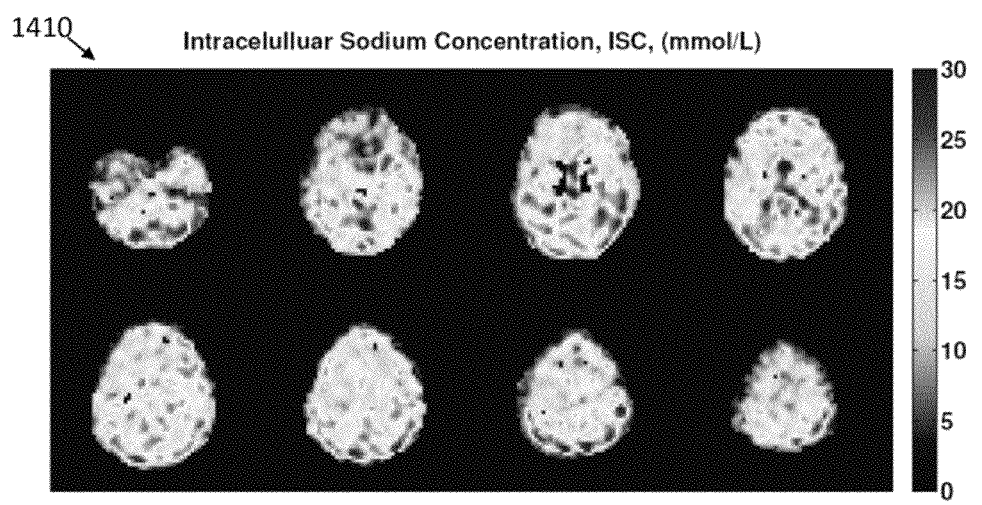
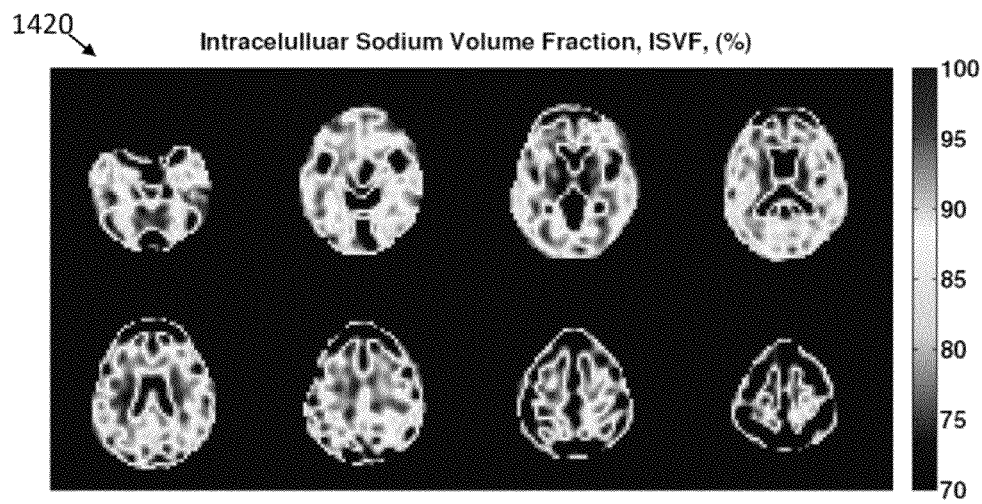
Fig. 14B

METHOD, SYSTEM AND COMPUTER-ACCESSIBLE MEDIUM FOR PROVIDING MULTIPLE-QUANTUM-FILTERED IMAGING

CROSS-REFERENCE TO RELATED APPLICATION(S)

The present application relates to and claims priority from U.S. Patent Application Ser. No. 61/259,046 filed on Nov. 6, 2009, the entire disclosure of which is hereby incorporated herein by reference.

STATEMENT REGARDING FEDERALLY SPONSORED RESEARCH

The present disclosure was developed, at least in part, using Government support under Grant No. R01NS051623 awarded by the National Institutes of Health. Therefore, the Federal Government may have certain rights in the present disclosure.

FIELD OF THE DISCLOSURE

The present disclosure relates to multiple-quantum-filtered imaging (MQF). In particular, exemplary embodiments of the present disclosure relate to systems, arrangements, procedures and computer-accessible medium for utilizing a phase-cycling procedure based on a plurality of radio-frequency (RF) pulses which can facilitate, e.g., a compensation of $B_0$ variations.

BACKGROUND INFORMATION

The potential of triple-quantum procedures for imaging sodium nuclei for which the correlation time can be longer than the Larmor period in-vivo has been pursued. ([See, e.g., R. Kemp-Harper, P. Styles, S. Wimperis, Three-Dimensional Triple-Quantum-Filtration Na NMR Imaging, J Magn Reson 108 (1995) 280-284; R. Kalyanapuram, V. Seshan, N. Bansal, Triple-Quantum-Filtered Na Imaging of the Dog Head In Vivo, J Magn Reson Imag 8 (1995) 1182-1189; R. Reddy, E. K. Insko, J. S. Leigh, Triple quantum sodium imaging of articular cartilage, Magn Reson Med 38 (1997) 279-284; A. Borthakur, I. Hancu, F. Boada, G. Shen, E. Shapiro, R. Reddy, In vivo triple quantum filtered twisted projection sodium imaging of human articular cartilage., J Magn Reson 14 (1999) 286-290; I. Hancu, F. E. Boada, G. X. Shen, Three-Dimensional Triple-Quantum-Filtered Na Imaging of In Vivo Human Brain, Magn Reson Med 42 (1999) 1146-1154; and G. LaVerde, E. Nemoto, C. A. Jungreis, C. Tanase, F. E. Boada, Serial Triple Quantum Sodium MRI During Non-human Primate Focal Brain Ischemia, Magn Reson Med 57 (2007) 201-205). For example, a conventional implementation of a triple-quantum-filter (TQF) can rely on three hard pulses 111, 112, 113 with one additional hard refocusing pulse 114 between the first pulse 111 and the second pulse 112, as illustrated in FIG. 1A, which is an exemplary illustration a pulse sequence 110 and coherence-transfer-pathway diagram 115 for triple-quantum-filtration generated using a TQF procedure as described in, e.g., G. Jaccard, S. Wimperis, G. Bodenhausen, Multiple-quantum NMR spectroscopy of s=3/2 spins in isotropic phase: a new probe for multiexponential relaxation., J. Chem. Phys. 185 (1986) 6282-6293, and R. Reddy, M. Shinar, Z. Wang, J. S. Leight, Multiple-Quantum Filters of Spin-3/2 with Pulses of Arbitrary Flip Angle, J Magn Reson, Series B 104 (1994) 148-152. For example, these publications indicate that the sequence can employ a 180-refocusing pulse 114 which can provide $B_0$ stability, but at a cost of increased SAR requirements. If appropriate phase-cycling procedures (as described in, e.g., such references) can be performed, the four coherence-transfer pathways contributing to the TQF signal can add-up to produce a relatively high signal-to-noise ratio (SNR). However, it is likely that a high efficiency of such procedure can not be achieved in in-vivo applications at relatively high magnetic fields (e.g., greater than or equal to about 3.5 Tesla, such as 7 Tesla), which can be due to specific absorption rate (SAR) limitations counteracting gains offered by high signal levels at the relatively high fields. In addition, in such implementations of TQF, transmitted $B_1$-field inhomogeneities can introduce a relatively strong modulation in obtained images which can be difficult to correct in post processing. (See, e.g., I. Hancu et al., supra.; and S. P. Brown, S. Wimperis, NMR measurements of spin-3/2 transverse relaxation in an inhomogeneous field, Chem Phys Lett 224 (1994) 508-516).

A three-pulse TQF was likely therefore used by another exemplary procedure which can be performed without employing a refocusing pulse, such as described in, e.g., I. Hancu et al., and illustrated in FIG. 1B. For example, FIG. 1B shows an exemplary illustration a pulse sequence 120 and coherence-transfer-pathway diagram 125 for triple-quantum-filtration using three hard pulses 121, 122, 123. (See, e.g., I. Hancu et al., supra.; G. LaVerde et al., supra.; and C. Tanase, F. E. Boada, Triple-quantum-filtered imaging of sodium in presence of inhomogeneities, J Magn Reson 174 (2005) 270-278). Instead of using a refocusing pulse, the $B_0$ stability can be provided by particular phase-cycling and post processing. (See, e.g., C. Tanase et al., supra.). The procedure described in, e.g., I. Hancu et al. can potentially offer a relatively simple $B_1$-correction in post-processing and reduce the energy deposits in the body/sample associated with the filter use, and thereby likely making it potentially appealing for use in certain in-vivo applications. However, a disadvantage of the sequence 120 design can be an increased sensitivity to $B_0$ inhomogeneities. (See, e.g., R. Reddy et al, supra.; C. Tanase et al., supra.; and J. M. Zhu, I. C. P. Smith, Selection of coherence transfer pathways by pulsed-field gradients in NMR spectroscopy., Concepts Magn Reson 7 (1995) 281-291). Such increased sensitivity can manifest itself as a signal loss which can arise due to a destructive interference between the different pathways contributing to the triple-quantum-coherence signal in the areas with $B_0$ offsets, for example.

Additionally, because heretofore known clinical magnetic resonance imaging (MRI) systems likely cannot provide $B_0$ homogeneity significantly better than about 0.5 ppm in-vivo, $B_0$-correcting procedures of TQF sodium imaging can be of interest to anyone involved in the research and development of MRI systems, or the use thereof. One such $B_0$-correcting procedure is described in, e.g., S. Wimperis, P. Cole, P. Styles, Triple-Quantum-Filtration NMR Imaging of 200 mM Sodium at 1.9 Tesla, J Magn Reson 98 (1992) 628-636, in which only two out of four contributing pathways can be selected. For example, FIG. 1C shows an exemplary illustration a pulse sequence 130 and coherence-transfer-pathway diagram 135 with gradient indication 136 according to a procedure described in such reference. As illustrated in FIG. 1C, the procedure described in this reference can employ three hard RF pulses 131, 132, 133, phase-cycling and gradients which can be for coherence pathway selection. This can reduce sensitivity of the procedure with respect to $B_0$ offsets, but also reduce the measured signal and SNR-efficiency by a factor of about two. Another procedure that can be potentially used to resolve the problem is described in C. Tanase et al. For example, this publication describes a procedure which can be based on concurrent acquisition of the four signal constituents contributing to the triple-quantum signal and their appropriate recombination in post-processing with an ancillary $B_0$-map. (Id.) However, because 24-steps can used to complete the TQF phase-cycle procedure described in this publication, the SNR-efficiency of the such procedure is likely also only about one half of a conventional procedure, such as described in, e.g., G. Jaccard et al. and R. Reddy et al., and herein above, and illustrated in FIG. 1A, for example.

Most of the damage to the TQF signal due to possible $B_0$-offset is likely done during the creation time between the first and the second excitation-pulses. The procedure described in, e.g., S. Wimperis, P. Cole, P. Styles, Triple-Quantum-Filtration NMR Imaging of 200 mM Sodium at 1.9 Tesla, J Magn Reson 98 (1992) 628-636 can address this problem by dephasing two out of the four contributing pathways using a gradient pulse, while the procedures described in, e.g., Tanase and Boada can include extracting the four contributing signals and correcting for $B_0$ in post processing. However, both of these approaches can lead to a loss of SNR efficiency.

Accordingly, there can be a need to address and/or overcome at least some of the above-described deficiencies and limitations, and to provide exemplary embodiments of arrangement and procedure according to the present disclosure as described in further detail herein.

SUMMARY OF EXEMPLARY EMBODIMENTS OF THE DISCLOSURE

Indeed, one of the objects of certain exemplary embodiments of the present disclosure can be to address the exemplary problems described herein above, and/or to overcome the exemplary deficiencies commonly associated with the prior art as, e.g., described herein.

Accordingly, the present disclosure describes exemplary embodiments of procedure, process, system, computer-accessible medium and processing arrangement which can be used to provide multiple-quantum-filtered imaging. For example, provided herein is an exemplary system that can include, inter alia, at least one arrangement which can be configured to extract and/or determine at least one Nuclear Magnetic Resonance (NMR) signal provided from an anatomical sample utilizing differences of phases of excitation pulses provided from an apparatus. The NMR signal(s) can relate to at least one multiple-quantum coherence in a presence of $B_0$ inhomogeneities associated with the anatomical sample. At least one arrangement can be or include a triple quantum filter arrangement and/or a double quantum filter arrangement, for example.

According to certain exemplary embodiments of the present disclosure, the phase cycling arrangement can utilize twelve and/or fourteen phase cycling procedures. At least one arrangement can be further configured to phase correct amplitudes due to, e.g., coherence pathways of the at least one NMR signal based on a $B_0$-map prior to a recombination of the amplitudes. The NMR signal(s) can be measured without a separated measurement of each of the coherence pathways, and the arrangement(s) can be further configured to generate and/or correct multiple-quantum-filtered images associated with the anatomical structure for $B_0$ inhomogeneity without a $B_0$ map regarding the anatomical structure.

Further provided herein is an exemplary process that can include, inter alia, extracting and/or determining at least one NMR signal provided from an anatomical sample utilizing differences of phases of excitation pulses provided from an apparatus. The NMR signal(s) can relate to at least one multiple-quantum coherence in a presence of $B_0$ inhomogeneities associated with the anatomical sample, for example. The exemplary process can further include, inter alia, displaying and/or storing one or more images based on the NMR signal in a storage arrangement in a user-accessible format and/or a user-readable format.

In accordance with certain exemplary embodiments of the present disclosure, an exemplary system is provided which can include, e.g., an arrangement configured to extract or determine a NMR signal associated with a signal returning from an anatomical structure. For example, the exemplary NMR signal can be associated with multiple-quantum coherences having an order of up to M in a presence of $B_0$ inhomogeneities. The arrangement can perform the extraction or the detection from or based on a quantum system within the anatomical structure having up to N orders of coherence using a pair of paired phase cycles. The number of phase cycles can be less than or equal to (i) N+M+1, (ii) 2*(N+M+1), (iii) 2*M and/or (iv) 2*(2M), and M and/or N can be controlled so that M≤N.

The exemplary arrangement can be further configured to phase correct amplitudes $B_{\pm 1 \pm m}$ using a $B_0$-map recombination of the amplitudes, where m≤(M−N/3). The exemplary arrangement can be further configured to use combinations of $(B_{+1-M}+B_{+1+M})$ and $(B_{-1-M}+B_{-1+M})$ for the phase cycling. The signal can include a plurality of amplitudes defined by $B_{\pm 1 \pm m}$, and the arrangement can be further configured to phase-correct the amplitudes using a $B_0$-map before recombining the amplitudes.

Further provided herein is an exemplary process that can include, inter alia, extracting and/or determining a Nuclear Magnetic Resonance (NMR) signal associated with a signal returning from an anatomical structure. For example, the NMR signal can be associated with multiple-quantum coherences having an order of up to M in a presence of $B_0$ inhomogeneities. The extraction or detection can be based on a quantum system within the anatomical structure having up to N orders of coherence using a pair of paired phase cycles. The number of phase cycles can be less than or equal to (i) N+M+1, (ii) 2*(N+M+1), (iii) 2*M and/iv) 2*(2M), and M and/or can be controlled so that M≤N. The exemplary process can further include displaying and/or storing one or more images based on the NMR signal in a storage arrangement in user-accessible format and/or a user-readable format.

According to certain exemplary embodiments of the present disclosure, an exemplary system is provided herein which can include, inter alia, at least one arrangement configured to receive at least one first signal associated with intracellular and extracellular compartments of an anatomical structure, receive at least one second signal associated with the intracellular compartment, and quantify an intracellular concentration contribution from the at least one first signal based on information associated with the at least one second signal. The first signal and/or the second can be or include a single-quantum signal (S_SQ), and the second signal can be or include a triple-quantum filtered signal (S_TQF). The exemplary arrangement can be further configured to quantify the intracellular concentration contribution by determining a signal decay associated with the S_SQ and/or the S_TQF, compensating the S_SQ and/or the S_TQF for the signal decay, determining a presence of flip angle errors associated with the S_SQ and/or the S_TQF, and correcting the S_SQ and/or the S_TQF based on the presence of flip angle errors.

According to certain exemplary embodiments of the system, the exemplary arrangement can be further configured to quantify the intracellular concentration contribution by converting the S_SQ to a tissue molecular concentration (TMC) using a further S_SQ obtained from a reference, and computing an intracellular molecular molar fraction (IMMF) from at least one of the S_SQ and the S_TQF. The TMC can be or include a tissue sodium concentration (TSC), and the IMMF can be or include an intracellular sodium molar fraction (ISMF). Further, the exemplary arrangement can be further configured to quantify the intracellular concentration contribution by computing an intracellular molecular concentration (IMC) and an intracellular molecular volume fraction (IMVF) based on the IMMF and the TMC, and quantifying the intracellular concentration contribution based on the IMC and/or the IMVF. The IMC can be or include an intracellular sodium concentration (ISC), and the IMVF can be or include an intracellular sodium volume fraction (ISVF). The ISMF can be computed based on (i) a measured relaxation constant and/or (ii) information associated with the S_SQ and/or the S_TQF. The exemplary arrangement can be further configured to quantify the intracellular concentration contribution using an intracellular sodium molar fraction (ISMF).

Further provided herein is an exemplary process that can include, inter alia, receiving at least one first signal associated with intracellular and extracellular compartments of an anatomical structure, receiving at least one second signal associated with the intracellular compartment, and quantifying an intracellular concentration contribution from the at least one first signal based on information associated with the at least one second signal. The exemplary process can further include displaying and/or storing one or more images based on the NMR signal in a storage arrangement in a user-accessible format and/or a user-readable format.

These and other objects, features and advantages of the exemplary embodiment of the present disclosure will become apparent upon reading the following detailed description of the exemplary embodiments of the present disclosure, when taken in conjunction with the appended claims.

BRIEF DESCRIPTION OF THE DRAWINGS

For a more complete understanding of the present disclosure and its advantages, reference is now made to the following description, taken in conjunction with the accompanying drawings, in which:

FIG. 13C is an illustration of an exemplary ISC map of the slice of FIG. 13A in accordance with certain exemplary embodiments of the presented disclosure;

FIG. 13D is an illustration of an exemplary one-dimensional profile corresponding to the map of FIG. 13C generated using a system, arrangement and/or computer-accessible medium in accordance with certain exemplary embodiments of the present disclosure;

FIG. 13E is an illustration of an exemplary ISVF map of the slice of FIG. 13A in accordance with certain exemplary embodiments of the presented disclosure;

FIG. 13F is an illustration of an exemplary one-dimensional profile corresponding to the map of FIG. 13E generated using a system, arrangement and/or computer-accessible medium in accordance with certain exemplary embodiments of the present disclosure;

FIG. 14A is an exemplary ISC map derived from MRI measurements from an ill person, generated using a system, arrangement and/or computer-accessible medium in accordance with certain exemplary embodiments of the present disclosure;

FIG. 14B is an exemplary ISVF map derived from MRI measurements from an ill person, generated using a system, arrangement and/or computer-accessible medium in accordance with certain exemplary embodiments of the present disclosure;

Figure 1A:
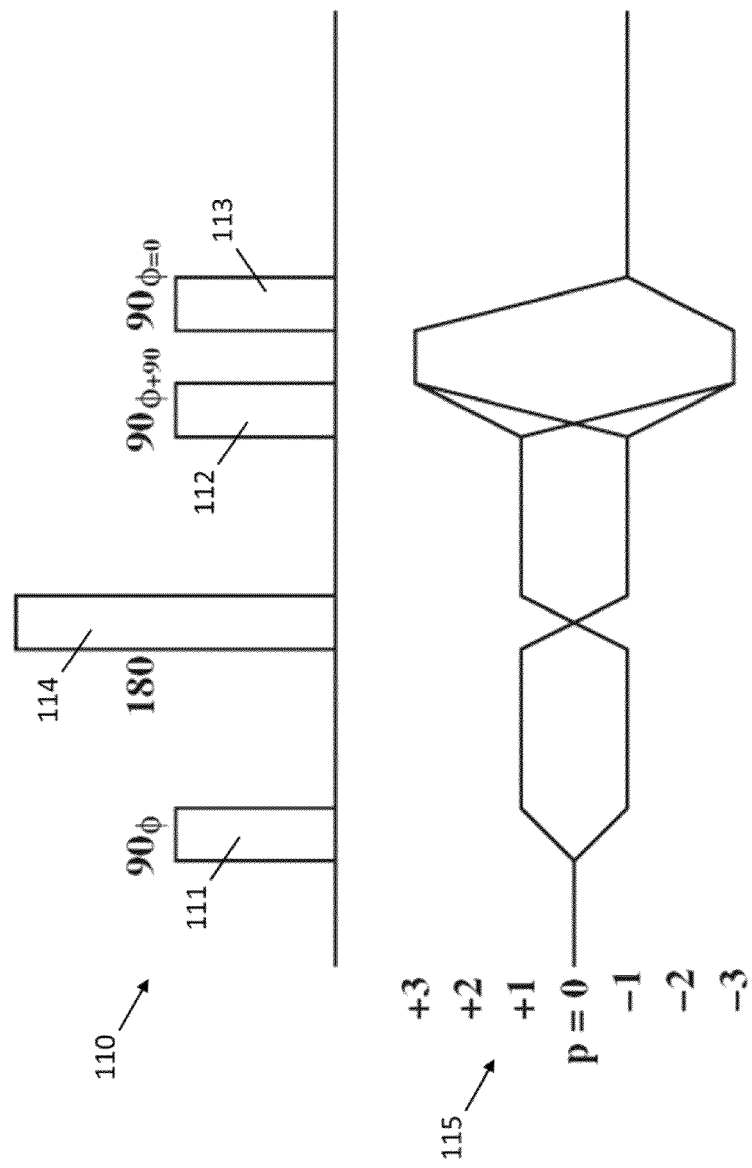
FIG. 1A is a pulse sequence and coherence-transfer-pathway diagram for triple-quantum-filtration generated using a TQF procedure as described according to a first exemplary implementation.

Throughout the figures, the same reference numerals and characters, unless otherwise stated, is used to denote like features, elements, components or portions of the illustrated embodiments. Moreover, while the subject disclosure will now be described in detail with reference to the figures, it is done so in connection with the illustrative embodiments. It is intended that changes and modifications can be made to the described embodiments without departing from the true scope and spirit of the subject disclosure.

DETAILED DESCRIPTION OF EXEMPLARY EMBODIMENTS OF THE DISCLOSURE

Provided and described herein, for example, are exemplary embodiments of a high-efficiency three-RF-pulse 12-step phase-cycling procedure which can, e.g., allow reconstruction of $B_0$-corrected TQF images. The exemplary procedure can have many advantages.

Exemplary phase-cycling systems, procedures and computer-accesssible medium according to certain exemplary embodiments of the present disclosure are provided which can facilitate acquisition and reconstruction of the TQ coherences in presence of magnetic field inhomogeneities for one or more anatomical structures (e.g., human organs such as a human brain, joints, muscles, and portion(s) and/or tissue thereof). According to certain exemplary embodiments, excitation pulses can be generated and/or sent from, e.g., a system configured to generate electro-magnetic radiation, to a target, such as an anatomical structure, and signals can be received from the target associated with the excitation pulses. The exemplary embodiments can control phases associated with the excitation pulses and signals, and how information related to the signals are received and processed, in each of a number of cycles to improve an associated signal to noise ratio with relatively less acquisition time and/or generate corresponding images have relatively higher quality than previously known systems and procedures.

For example, in accordance with an exemplary procedure according to the present disclosure, the signal can be split into two pairs of two coherence transfer pathways and the corresponding $B_0$ correction can be applied to each pair separately. The exemplary procedure can increase the TQF SNR efficiency by a factor of about $\sqrt{2}$, as compared to heretofore-known procedures, such as described in C. Tanase et al. and S. Wimperis et al., for example. In addition, if the SNR is relatively high, e.g., (SNR≥about 10), the exemplary procedure according to the present disclosure can produce accurate (or substantially accurate) $B_0$-corrected TQF images, even without additional $B_0$-map information, for example.

Also described herein is an exemplary embodiment of a three-RF-pulse 14-step phase-cycling procedure which can allow reconstruction of $B_0$-corrected TQF images. The exemplary 14-step procedure can utilize a $B_0$-map and allow up to about a 40% reduction in imaging time without loss (or substantial loss) in SNR efficiency, for example. Similarly to the exemplary 12-step phase-cycling procedure, if the signal to noise ratio can be relatively high e.g., (SNR≥about 10), the exemplary procedure can produce accurate $B_0$-corrected TQF images even without additional $B_0$-map information.

TQF Overview

Figure 2:
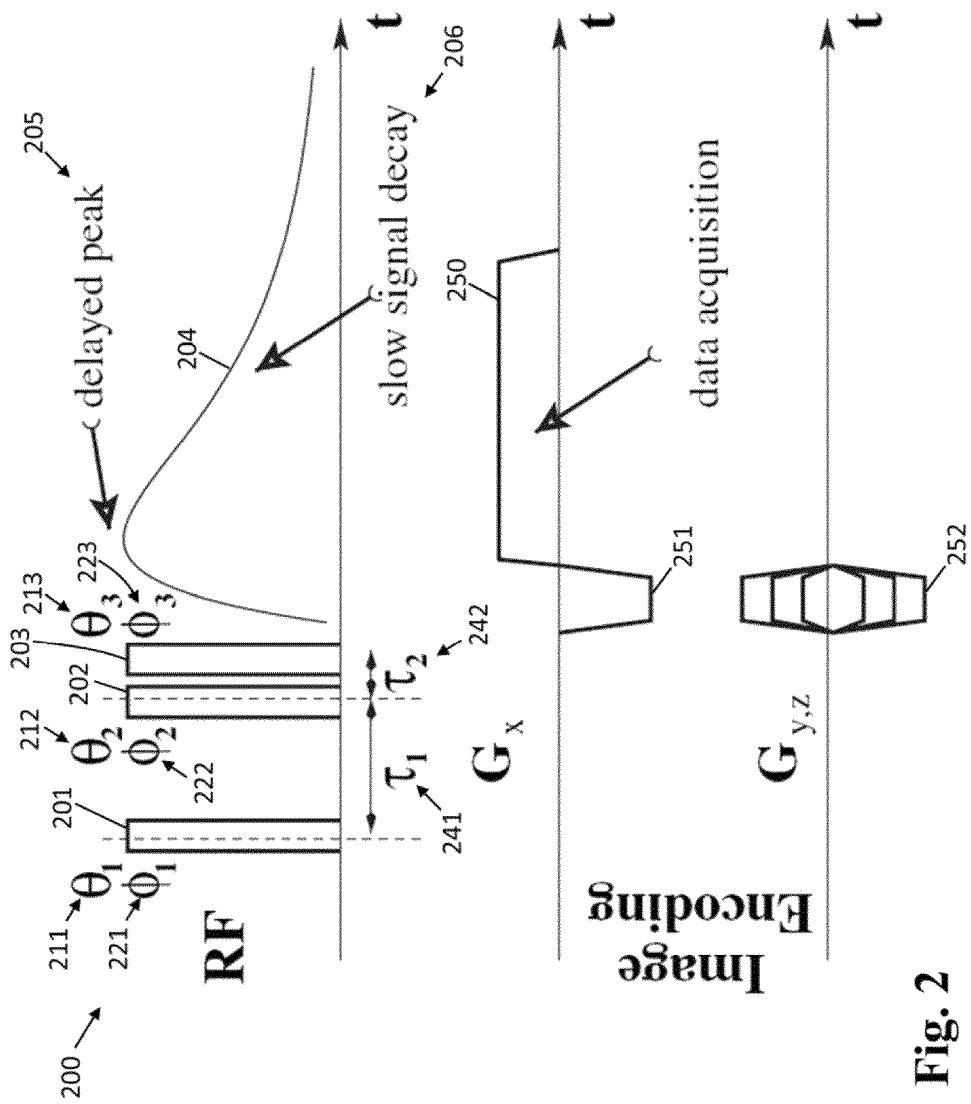
FIG. 2 is an exemplary schematic diagram of an exemplary triple-quantum-filter (TQF) excitation block superposed with TQF signal evolution and imaging readout, in accordance with certain exemplary embodiments of the present disclosure.

FIG. 2 shows an exemplary schematic diagram of an exemplary triple-quantum-filter (TQF) excitation block superposed with TQF signal evolution and imaging readout, in accordance with certain exemplary embodiments of the present disclosure. An exemplary Cartesian gradient echo readout can be well suited for sodium TQF imaging as a result of delayed peak formation and slow signal decay, for example.

As illustrated in FIG. 2, for example, an Exemplary TQF sequence 200 can include three excitation pulses 201, 202, 203 of the same flip angle $\theta$ 211, 212, 213, and corresponding phases $\phi_1$ 221, $\phi_2$ 222 and $\phi_3$ 223, followed by a readout 204. The delays $\tau_1$ 241 and $\tau_2$ 242 after the first pulse 201 and the second pulse 202, respectively, can facilitate a generation of the higher-order coherences and their propagation. For example, the readout 204 can have a delayed peak 205 followed by a gentle downward slope 206 representing a slow signal decay. The recorded signal 250 can include contributions from up to all of the allowed coherence pathways, as can be depicted by portion 251 of the recorded signal 250 and illustrated by encoded data representation 252. As further illustrated in FIG. 2, for example, one of the tasks of an exemplary triple-quantum filter can be to discard the undesired signal components, as also illustrated by encoded data representation 252. Since every pathway should end at coherence level of −1 to be observable, each pathway can be completely characterized by two numbers $p_1$ and $p_2$ which can represent the levels of coherence after the first two excitations, respectively. Accordingly, the received signal can be expressed as:

$$S_\Omega(\phi_1, \phi_2, \phi_3, \psi, t) = e^{i\psi} \sum_{p_1=-1}^{1} \sum_{p_2=-3}^{3} e^{-i(p_1\phi_1 + (p_2-p_1)\phi_2 - (1+p_2)\phi_3)} B_{p_1 p_2} \quad (1)$$

$$B_{p_1 p_2} = e^{-i(p_1\tau_1 + p_2\tau_2)\Omega} e^{i\Omega t} A_{p_1 p_2} \quad (2)$$

where $A_{p_1 p_2} = A_{p_1 p_2}(\tau_1, \tau_2, \theta, t)$ represents the amplitude of the specified coherence pathway and can be a function of the delays $\tau_{1,2}$, flip angle $\theta$ and measurement time t and receiver phase $\psi$. The presence of magnetic field inhomogeneity $\Omega$ can be described, e.g., by deviation of the Larmor frequency $\omega_0 = \gamma B_0$ from the frequency of the RF field $\omega$:

$$\Omega = \omega_0 - \omega \quad (3)$$

The maximum signal due to the presence of order 3-coherence can be expressed as the sum of $A_{\pm 1 \pm 3}$:

$$S^{TQ} = A_{+1-3} - A_{-1-3} - A_{-1+3} + A_{+1+3} \quad (4)$$

In the absence of magnetic field inhomogeneities $\Omega = 0$, the maximum signal can be obtained from exemplary Equation (1) by, e.g., a six-step phase-cycle procedure:

$$S^{TQ} = \frac{i}{6} \sum_{k=0}^{5} (-1)^k S_\Omega(\phi_{1;k}, \phi_{2;k}, \phi_{3;k}, t), \quad (5)$$

$$\phi_{1;k} = \frac{\pi}{6} + \frac{\pi k}{3}, \quad \phi_{2;k} = \frac{2\pi}{3} + \frac{\pi k}{3}, \quad \phi_{3;k} = 0,$$

$$k = 0, 1, \ldots, 5$$

Application of a classical filter, such as described in, e.g., G. Jaccard et al. and R. Reddy et al., in the presence of magnetic field inhomogeneities $\Omega \neq 0$ can result in significant signal dropouts. Indeed, substituting exemplary Equation (1) into exemplary Equation (5) can yield:

$$S_{\Omega;Cl}^{TQ} = ([A_{+1-3} - A_{-1-3}]e^{+i3\tau_2\Omega} + [A_{+1+3} - A_{-1+3}]e^{-i3\tau_2\Omega})e^{i\omega t} \quad (6)$$

The different terms can annihilate each other when the frequency offset $\Omega$ approaches $\pi/6\tau_2 + \pi/3\tau_2 n$, n=0, ±1, ±2 .... However, it is possible that this dephasing will not lead to significant signal loss if $\Omega = 160$ Hz and $\tau_2 < 500$ μs, for example. These conditions can often be satisfied in various applications. The same or similar conditions can also apply to the modified 6-step cycle procedure described in, e.g., Wimperis et al., even though exemplary contributions due to −1−2 ($A_{-1-3}$ term) and −1+4 ($A_{-1+3}$ term) pathways can have been suppressed.

In contrast, the 6-step cycle procedure described in, e.g., I Hancu et. al., can be more sensitive to $B_0$-inhomogeneities. (See, e.g, C. Tanase et al., supra.):

$$S_\Omega^{TQ} = B_{+1-3} - B_{-1-3} - B_{-1+3} + B_{+1+3} = (A_{+1-3}e^{-i\tau_1-3\tau_2)\Omega} - A_{-1-3}e^{+i\tau_1+3\tau_2)\Omega} - A_{-1+3}e^{+i(\tau_1-3\tau_2)\Omega} + A_{+1+3}e^{-i(\tau_1+3\tau_2)\Omega})e^{i\Omega t} \quad (7)$$

For example, as described in, e.g., C. Tanase et al., a combination of $\tau_1 \approx 5$ ms, $\tau_2 \approx 0$ ms and $\Omega \approx 50$ Hz already can lead to a total signal annihilation (or substantial annihilation, cancellation, substantial cancellation, etc.). Such $B_0$-sensitivity is generally not acceptable. One way to address this problem is described in, e.g., C. Tanase et al. According to such procedure, the amplitudes $B_{\pm 1 \pm 3}$ can be extracted from the measured data, phase-corrected using a $B_0$-map, and recombined into exemplary Equation (4), yielding:

$$S_\Omega^{TQ} = (B_{+1-3} e^{+i(\tau_1 - 3\tau_2)\Omega} - B_{-1-3} e^{-i(\tau_1 + 3\tau_2)\Omega} - B_{-1+3} e^{-i(\tau_1 - 3\tau_2)\Omega} + B_{+1+3} e^{+i(\tau_1 + 3\tau_2)\Omega}) e^{-i\Omega t} \quad (8)$$

This procedure can provide the $B_0$-corrected TQF signal but at reduced SNR efficiency, as described further herein below. According to certain exemplary embodiments of the present disclosure, provided is a $B_0$-correcting phase-cycling procedure which can provide an SNR efficiency that can be at least about $\sqrt{2}$ higher than previously known procedures.

Exemplary 12-Step Cycle Procedure

As described herein, possible dephasing between the coherence pathways due to $B_0$-offset in a conventional TQ filter, such as described in, e.g., G. Jaccard et al. and R. Reddy et al., and modified filter, such as described in, e.g., S. Wimperis et al., can be considered to be negligible. This can be because in many practical situations, it is possible to arrange that $\Omega\tau_2 = 1$ by setting $\tau_2$ to be as small as possible. Under these exemplary conditions, the expression for triple-quantum filtered signal of exemplary Equation (8) can be simplified to be:

$$S^{TQ} \approx ([B_{+1-3} + B_{+1+3}] e^{+i\Omega\tau_1} - \quad (9)$$

$$[B_{-1-3} + B_{-1+3}] e^{-i\Omega\tau_1}) e^{-i\Omega t} =$$

$$= e^{-i\Omega t} \sum_{p_1 = \pm 1} p_1 [B_{p_1-3} + B_{p_1+3}] e^{+ip_1\Omega\tau_1}$$

$$= \sum_{p_1 = \pm 1} p_1 [A_{p_1-3} e^{3i\Omega\tau_2} + A_{p_1+3} e^{-3i\Omega\tau_2}]$$

Thus, the task of phase-cycling can primarily be to select the needed combinations $(B_{+1-3} + B_{+1+3})$ and $(B_{-1-3} + B_{-1+3})$. After the selection can be performed, the $B_0$ correction can be applied to remove destructive interference between the different coherence pathways contributing to the signal, which can be achieved in exemplary 12 phase-cycling steps. For example, the following expression can be used:

$$\xi_1 = (\phi_1 - \phi_2), \xi_2 = (\phi_2 - \phi_3) \quad (10)$$

It is possible to set $\phi_3 = 0$ and $\psi$ to any arbitrary constant, for example $\psi = 0$, and re-arrange the terms in exemplary Equation (1) to yield:

$$S(\phi_1, \phi_2, \phi_3) = S(\xi_1, \xi_2) = \sum_{p_1 = -1}^{1} \sum_{p_2 = -3}^{3} e^{-i(p_1 \xi_1 + p_2 \xi_2)} B_{p_1 p_2} \quad (11)$$

From exemplary Equation (11), one having ordinary skill in the art should appreciate that by cycling the phases $\xi_1$ and $\xi_2$, the target amplitude-combinations $(B_{p_1-3} + B_{p_1+3})$ of exemplary Equation (9) can be extracted. A six-step cycle procedure in $\xi_2$ according to $$\xi_{2;k} = \frac{2\pi k}{6},$$

$k = 0, 1, \ldots, 5$ followed by an inverse Fourier transform applied to the collected signals along the cycle index k can lead to:

$$C_m(\xi_1) = \frac{1}{6} \sum_{k=0}^{5} S(\xi_1, \xi_{2;k}) e^{i\frac{2\pi mk}{6}}, m = 0, 1, \ldots, 5 \quad (12)$$

The amplitude $C_3(\xi_1)$ can be of interest, and expressed as:

$$C_3(\xi_1) = \sum_{p_1 = \pm 1} e^{-i\xi_1 p_1} [B_{p_1 + 3} + B_{p_1 - 3}] \quad (13)$$

Further, by cycling the phase $\xi_1$ according to $\xi_{1;1} = 0$ and $\xi_{1;2} = \pi/2$, using exemplary Equation (13), it is possible to recover $(B_{\pm 1 + 3} + B_{\pm 1 - 3})$ combinations:

$$B_{+1+3} + B_{+1-3} = \frac{1}{2}(C_3(0) + iC_3(\pi/2)) \quad (14)$$

$$B_{-1+3} + B_{-1-3} = \frac{1}{2}(C_3(0) + iC_3(\pi/2))$$

Thus, e.g., up to all amplitude combinations $B_{\pm 1 \pm 3}$ contributing to the TQF signal can be measured using the exemplary 12-step cycle procedure according to certain exemplary embodiments of the present disclosure. After application of $B_0$ correction, the appropriate triple-quantum filtered signal can be recovered using, e.g., exemplary Equation (9).

Accordingly, the acquisition of $B_0$-corrected triple-quantum filtered data can include a $B_0$-mapping acquisition followed by an exemplary 12-step phase cycle procedure according to certain exemplary embodiments of the present disclosure. For example, an exemplary cycle can include 2×6 paired (or grouped, nested, etc.) acquisitions with the following exemplary phase-cycling procedural rules:

1. Acquire signals with $$\phi_{1;k} = 0 + \frac{2\pi k}{6}, \phi_{2;k} = \frac{2\pi k}{6},$$

$\phi_{3;k} = 0$ for $k = 0, 1, \ldots, 5$.

2. Acquire signals with $$\phi_{1;k} = \frac{\pi}{2} + \frac{2\pi k}{6}, \phi_{2;k} = \frac{2\pi k}{6},$$

$\phi_{3;k} = 0$ for $k = 0, 1, \ldots, 5$.

The exemplary processing of the acquired data can include the application of one-dimensional (1D) Fourier transformation to the 2×6 data set along the larger phase-cycle index and appropriate recombination of the obtained amplitudes, for example.

Exemplary Validation of Approximation and/or Determination

Comparing exemplary Equations (6) and (9), one having ordinary skill in the art should appreciate in view of the teachings provided herein that the sensitivity of the exemplary 12-step TQF cycle procedure provided and described herein to the $B_0$-inhomogeneities can be the same (or substantially similar) to that of the classical SAR-intense 6-step TQF cycle procedure with the 180° refocusing pulse described in, e.g., G. Jaccard et al. and R. Reddy et al., and that of the modified less SNR-efficient cycle procedure described in [12]. To demonstrate the validity of the $\Omega\tau_2=1$ approximation used in exemplary Equations (6) and (9), up to a normalization constant, the amplitudes $A_{\pm 1 \pm 3}$ can be given by:

$$\begin{pmatrix} A_{-1-3} \\ A_{-1+3} \\ A_{+1-3} \\ A_{+1+3} \end{pmatrix} = (e^{-t/T_s} - e^{-t/T_f})(e^{-\tau_1/T_s} - e^{-\tau_1/T_f}) \quad (15)$$

$$e^{-\tau_2/T_s} \times \times \sin^5(\theta) \cdot \begin{pmatrix} -\sin^2(\theta/2)\cos^2(\theta/2) \\ -\sin^2(\theta/2)\cos^2(\theta/2) \\ \cos^4(\theta/2) \\ \sin^4(\theta/2) \end{pmatrix}$$

where $T_f$ and $T_s$ represent the fast and slow relaxation times. Therefore, up to a normalization constant, the true TQF signal of exemplary Equation (4) can be expressed as:

$$S^{TQ} = (e^{-t/T_s} - e^{-t/T_f})(e^{-\tau_1/T_s} - e^{-\tau_1/T_f})e^{-\tau_2/T_s} \cdot \sin^5(\theta) \quad (16)$$

From exemplary Equations (15), (2) and (9), the approximate TQF signal can be expressed as:

$$S^{TQ} \approx e^{-i\Omega t} \sum_{p_1 = \pm 1} p_1 [b_{p_1-3} + B_{p_1+3}] e^{+ip_1 \Omega \tau_1} \quad (17)$$

$$= (e^{-t/T_s} - e^{-t/T_f})(e^{-\tau_1/T_s} - e^{-\tau_1/T_f})e^{-\tau_2/T_s} \times \times$$

$$\sin^5(\theta) \cdot (\cos(3\Omega\tau_2) + i\cos(\theta)\sin(3\Omega\tau_2))$$

One having ordinary skill in the art would appreciate in view of the disclosure provided herein from exemplary Equations (16) and (17) that under the condition of $\Omega\tau_2=1$, the approximated signal can be virtually identical to the true signal. More specifically, it is possible that appreciable deviation of the approximated signal from the true signal will occur only when the flip angle $\theta$ approaches $\pi/2$ and the frequency offset $\Omega$ approaches $\pi/6\tau_2$ simultaneously. In practical terms, the neglect of the signal evolution under frequency offset $\Omega$ during the evolution time $\tau_2$ generally may not lead to significant signal loss if $\Omega=160$ Hz and $\tau_2 < 500$ μs. These conditions can be significantly more favorable (and/or preferred) as compared to $\Omega < 50$ Hz which can be needed for correct operation of the exemplary 6-step cycle procedure described in, e.g., I. Hancu et al., and herein above with respect to exemplary Equation (7). This possible partial dephasing between the coherence pathways can occur in a conventional TQ filter, such as described in, e.g., G. Jaccard et al. and R. Reddy et al., and in a modified filter such as described in, e.g., S. Wimperis et al., due to absence of $B_0$-stabilization during the propagation time $\tau_2$, for example. As one having ordinary skill in the art should appreciate in view of the teachings provided herein, however, since $\Omega\tau_2=1$ can be arranged in many practical situations, this possible dephasing can generally be insignificant and ignored.

Exemplary $B_0$ Correction without an Ancillary $B_0$ Map

While in spectroscopic applications it can be important to keep the signal in a complex form, magnetic resonance imaging can mostly rely on the magnitude reconstruction. For example, it is possible to perform magnitude reconstruction directly by replacing the TQF image created from exemplary Equations (2), (4) and (9) with:

$$|S^{TQ}| = |A_{+1-3} - A_{-1-3} - A_{-1+3} + A_{+1+3}| = \quad (18)$$

$$= |A_{+1-3} + A_{+1+3}| + |A_{-1-3} + A_{-1+3}| \approx$$

$$\approx |B_{+1-3} + B_{+1+3}| + |B_{-1-3} + B_{-1+3}|$$

Accordingly, a dependence of the TQF signal on the magnetic field offset $\Omega$ can vanish. Indeed, based on that amplitudes $A_{+1\pm 3}$ can be real-valued and positive, whereas amplitudes $A_{-1\pm 3}$ can be real-valued and negative (see, e.g., exemplary Equation (15)), it is possible to enter values having opposite signs into the signal equation. The approximation in the exemplary Equation (18) can be due to the exemplary Equation (9), for example. Accordingly, $B_0$-corrected magnitude TQF images can be reconstructed correctly in the presence of $B_0$-inhomogeneities without knowledge of the $B_0$ distribution.

Exemplary Signal-to-Noise Ratio (SNR) Analysis

Because, e.g., exemplary Equation (9) can be relatively simple, and because noise in an Exemplary NMR receiver can be considered Gaussian with a standard deviation $\sigma_0$, SNR analysis can be performed analytically. For example, as described in detail herein below, the exemplary SNR in such a measurement can be:

$$SNR_{12} = \frac{S^{TQ}}{\sigma_0} \sqrt{6}$$

For comparison with other TQF procedures, it can be convenient to express the SNR efficiency or SNR per unit time $\epsilon = SNR/\sqrt{N}$, where N represents the number of phase-cycle steps. Since the exemplary procedure according to certain exemplary embodiments of the present disclosure can involve 12 steps, the SNR efficiency can be expressed as:

$$\epsilon_{12} = \frac{SNR_{12}}{\sqrt{12}} = \frac{S^{TQ}}{\sigma_0 \sqrt{2}}$$

A similar exemplary analysis can be performed for the 24-step TQF acquisition procedure. For example, from Equation (27) C. Tanase et al., $SNR_{24}$ can be expressed as:

$$SNR_{24} = \frac{S^{TQ}}{\sigma_0} \sqrt{6}$$

and the SNR efficiency as:

$$\varepsilon_{24} = \frac{SNR_{24}}{\sqrt{24}} = \frac{S^{TQ}}{2\sigma_0}$$

Assessment of the SNR efficiency $\varepsilon_6$ of the 6-step cycle procedure described in, e.g., S. Wimperis et al., can dicatei that this procedure can have the same SNR efficiency as the 24-step cycle procedure described in, e.g., C. Tanase et al. The rationale for this SNR penalty can be that the signal from two out of four contributing pathways can be rejected by the pathway selection rules.

Accordingly, an exemplary procedure according to certain exemplary embodiments of the present disclosure can provide the $\sqrt{2}$ (or about) higher SNR efficiency as compared to the procedures described in, e.g., [11, 12]. Moreover, the SNR improvement of an exemplary procedure according to the present disclosure can be independent of the $B_0$ offset within the limits of applicability of the approximation used. For relatively high magnetic field offsets, destructive interference between contributing pathways can reduce the achievable SNR, as illustrated by exemplary Equation (17).

Verification of the SNR-efficiency differences between the exemplary 12-step TQF cycle procedure according to certain exemplary embodiments of the present disclosure and the 24-step TQF cycle procedure can be performed by, e.g., evaluating the noise in the image backgrounds since the mean value in the image background outside of the object can be proportional to the noise level. Therefore, the ratio of these mean values, corrected for acquisition duration, can provide the ratio of the SNR efficiencies of the exemplary procedures. For example, if $\eta_{24}$ and $\eta_{12}$ can be the mean noise levels observed in the 24- and 12-step cycles, respectively, the ratio of the respective efficiencies $\varepsilon_{12}/\varepsilon_{24}$ can be expressed as:

$$\frac{\varepsilon_{12}}{\varepsilon_{24}} = \frac{\eta_{24}}{\eta_{12}} \sqrt{\frac{24 N_{24}}{12 N_{12}}} \quad (19)$$

where $N_{24}$ and $N_{12}$ can represent the number of averages used for the 24- and 12-step cycles, respectively.

Considering that $\eta_{24}$ and $\eta_{12}$ can be subject to measurement noise themselves, it can be possible that SNR efficiency ratio expressed by exemplary Equation (19) can randomly deviate from the computed value of $\sqrt{2}$. This random deviation can be evaluated by comparing the SNR efficiency ratios from different slices in the three-dimensional (3D) volume. For example, the single-quantum images can be used to select regions outside of the imaged object on the TQF images, and the mean noise levels in the TQF data can be evaluated in each slice independently. Since there can be no slice-to-slice noise correlations in Fourier-encoded data, noise measurements from each slice can be treated as noise measurements from independent experiments providing the TQF noise-level error estimate.

Further, with respect to the noise level in magnitude reconstruction of exemplary Equation (18), because each of the measured quantities $B_{p_1 p_2}$ can be subject to random Gaussian noise with $\sigma = \sigma_0/\sqrt{12}$, the magnitudes $|B_{p_1 p_2}|$ can come from a Rician distribution with parameters $B_{p_1 p_2}$ and $\sigma_0/\sqrt{12}$. Therefore, it can be possible that a loss of precision and accuracy can occur in the areas of small SNR (such as regions outside of the imaged sample). However, the Rician distribution can rapidly approach the Gaussian distribution when SNR in the data increases. Accordingly, the difference between the Rician and the Gaussian distributions can be insignificant and neglected for SNR levels above about 10. Thus, $B_0$-corrected magnitude TQF image can be reconstructed without any knowledge (or with only significantly limited knowledge) of the $B_0$ distribution, and without loss (or significant or substantial loss) in accuracy and precision when SNR≤about 10.

Exemplary Procedures and Experiments

Exemplary MRI procedures can be performed on a whole-body MAGNETOM 3T Tim Trio scanner (Siemens AG, Erlangen, Germany) with a custom-built dual-tuned transmit-receive proton-sodium head coil (Stark Contrast, Erlangen, Germany) and a modified GRE sequence, such as illustrated in FIG. 2. The exemplary RF excitation train can be comprised of three non-selective pulses of about 500 μs duration each.

For purposes of $B_0$ mapping, e.g., two single-quantum GRE images with a TE difference of about 2.0 ms can be acquired without changes in other acquisition parameters. The offset frequency $\Omega$ can be obtained from the phase difference of the two images on a voxel-by-voxel basis. Performance of a phase unwrapping measurement is not necessary because frequency offsets were smaller than the 500 Hz bandwidth of this measurement.

To demonstrate the utility of the exemplary procedure, three cylindrical phantoms were used. A 2 L bottle was filled with about 90 mM sodium water solution. Two smaller 250 mL bottles were filled with about 4% agar gel, and contained about 100 mM and 140 mM sodium concentrations, respectively. One having ordinary skill in the art should appreciate that third-order coherences can be produced in such gels.

Acquisition parameters for the TQF imaging were set at a 240×240×240 mm³ field of view with a 16×16×16 encoding matrix; TR=165 ms; TE=6.6 ms; flip angle 90°; $\tau_1$=5.5 ms; $\tau_2$=150 μs. The acquisition parameters were optimized (or substantially optimized) to produce the highest TQF signal. The exemplary images were acquired both with a 24-step cycle procedure and with an exemplary 12-step phase cycle procedure in accordance with the present disclosure as described here without averaging. The procedures took about 25 minutes, providing a SNR of about 20.

Exemplary $B_0$ mapping was performed with single-quantum sodium imaging at TE=6.6 ms and TE=8.6 ms, TR=61 ms using the same field of view and spacial resolution.

Exemplary Results

Figure 3A:
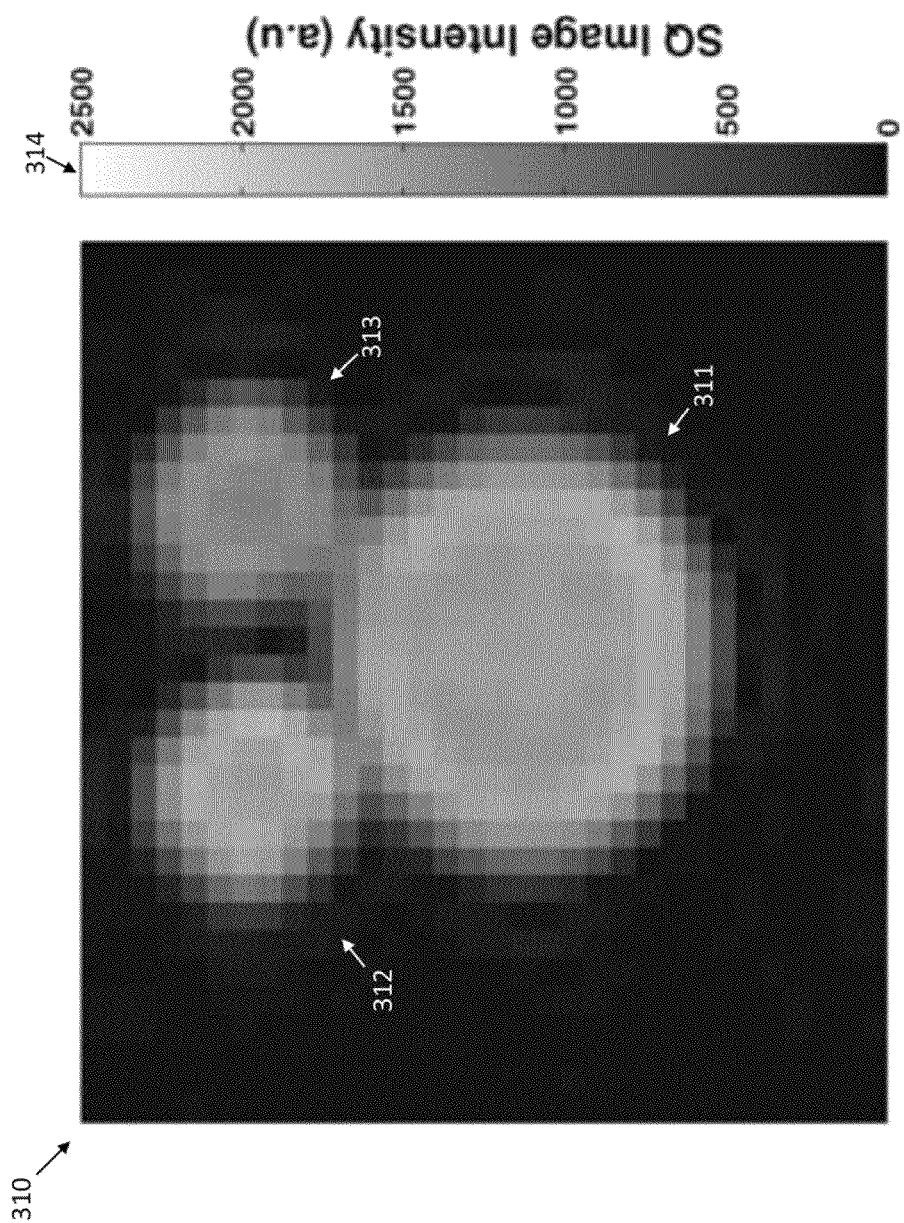
FIG. 3A is an exemplary single-quantum sodium image of an axial section of a phantom setup generated using a system, arrangement and/or computer-accessible medium in accordance with certain exemplary embodiments of the present disclosure.

FIG. 3A shows an exemplary single-quantum sodium image 310 of an axial section of the phantom setup described herein above which can be generated using the system, arrangement, process and computer-accessible medium in accordance with certain exemplary embodiments of the present disclosure. For example, an image portion 311 corresponds with the 2 L bottle containing the sodium water solution, and represents the SQ image intensity thereof. Exemplary image portions 312, 313 correspond with the two smaller bottles containing the agar gel with sodium, and represent the SQ image intensity thereof. An exemplary image intensity scale 314 can be used for, e.g., visually identifying and quantifying the SQ image intensity of the exemplary image.

Figure 3B:
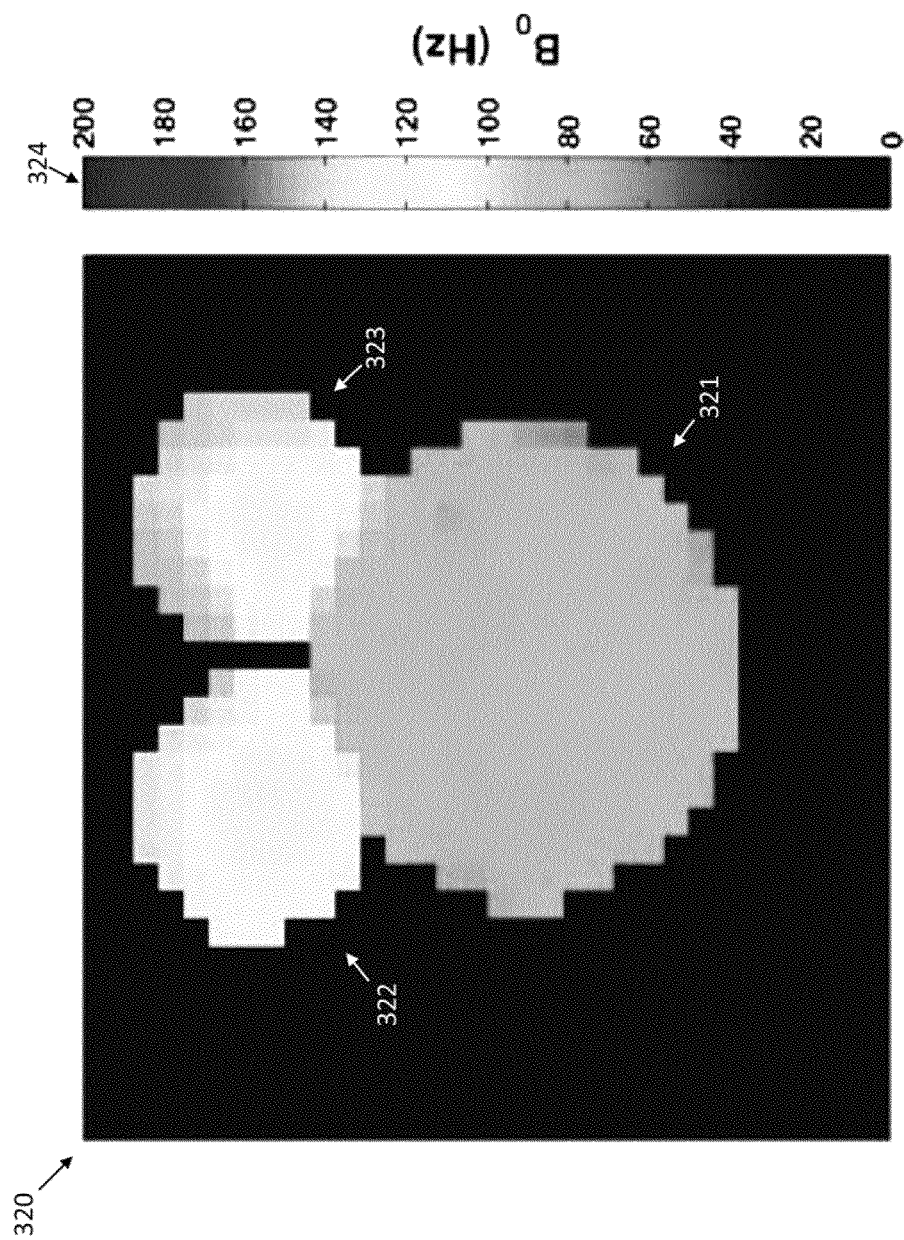
FIG. 3B is an exemplary $B_0$-map of the same slice illustrated in the exemplary image shown in FIG. 3A generated using a system, arrangement and/or computer-accessible medium in accordance with certain exemplary embodiments of the present disclosure.

FIG. 3B is an exemplary $B_0$-map 320 of the same slice illustrated in the exemplary image 310 shown in FIG. 3A, in accordance with certain exemplary embodiments of the present disclosure. Similarly to FIG. 3A, in FIG. 3B, and exemplary image portion 321 corresponds to the 2 L bottle containing the sodium water solution, image portions 322, 323 correspond with the two smaller bottles containing the agar gel with sodium. An exemplary $B_0$ scale 324 can be provided which can be used for, e.g., visually identifying and quantifying the $B_0$ levels throughout the exemplary image.

TQF images of the same slice illustrated in the exemplary image 310 shown in FIG. 3A can be shown in FIGS. 4A-4D. For example, exemplary images 410, 420 in FIGS. 4A and 4B, respectively, illustrate TQF reconstruction with the use of a $B_0$ map and a magnitude-based correction procedure, respectively. The image portions 411, 421 correspond to the 2 L bottle containing the sodium water solution, and image portions 412, 413, 422, 423 correspond with the two smaller bottles containing the agar gel with sodium. Exemplary intensity scales 414, 424 can be provided. As illustrated in FIGS. 4A-4D, it is possible for the exemplary images 410, 420 to be substantially similar to one another, and also be robust against existing $B_0$ inhomogeneities.

Figure 4A:
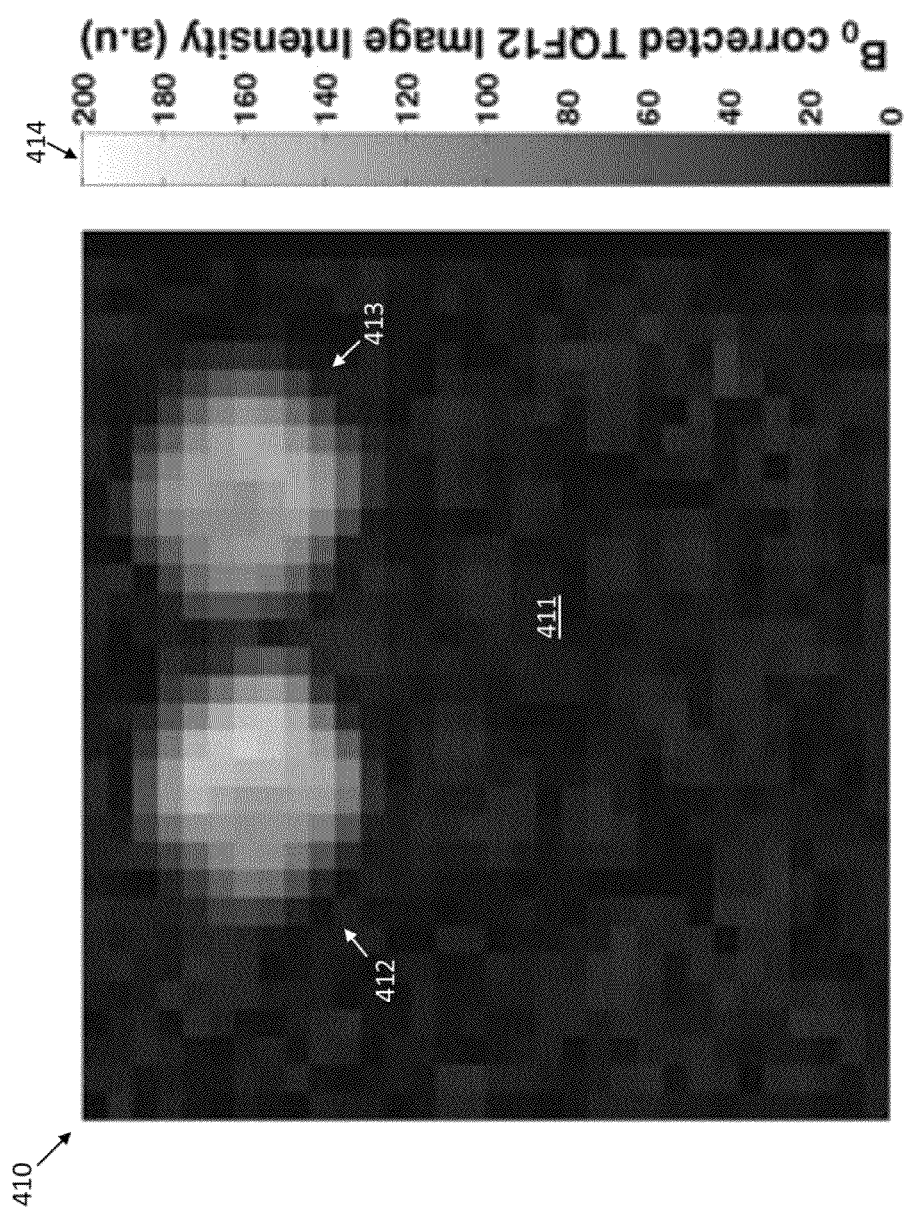
FIG. 4A is an exemplary triple-quantum-filtered image produced by an exemplary 12-step cycle procedure after $B_0$ correction generated in accordance with certain exemplary embodiments of the present disclosure.
Figure 4B:
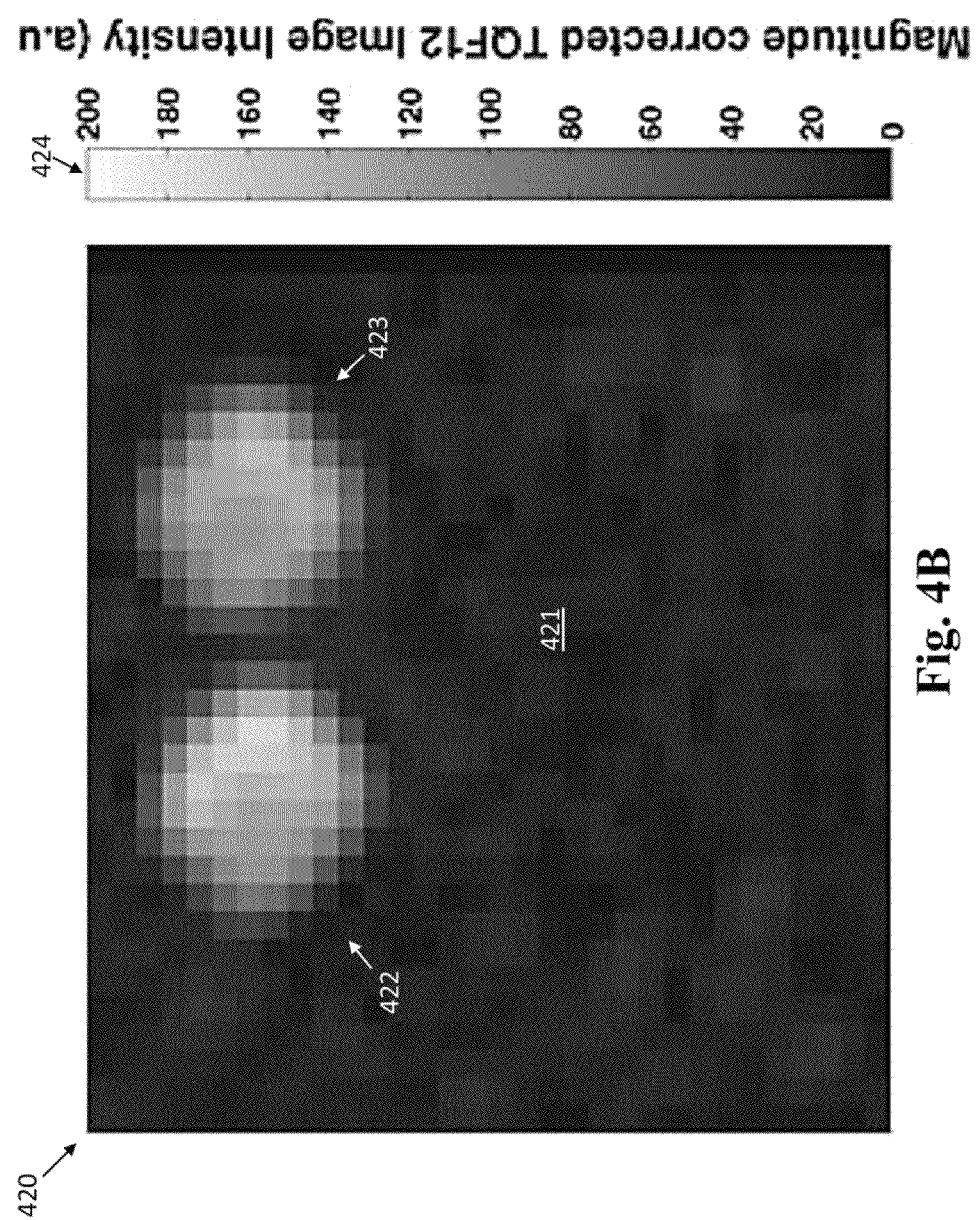
FIG. 4B is an exemplary triple-quantum-filtered image produced by the exemplary 12-step cycle procedure after magnitude $B_0$ correction, in accordance with certain exemplary embodiments of the present disclosure.
Figure 4C:
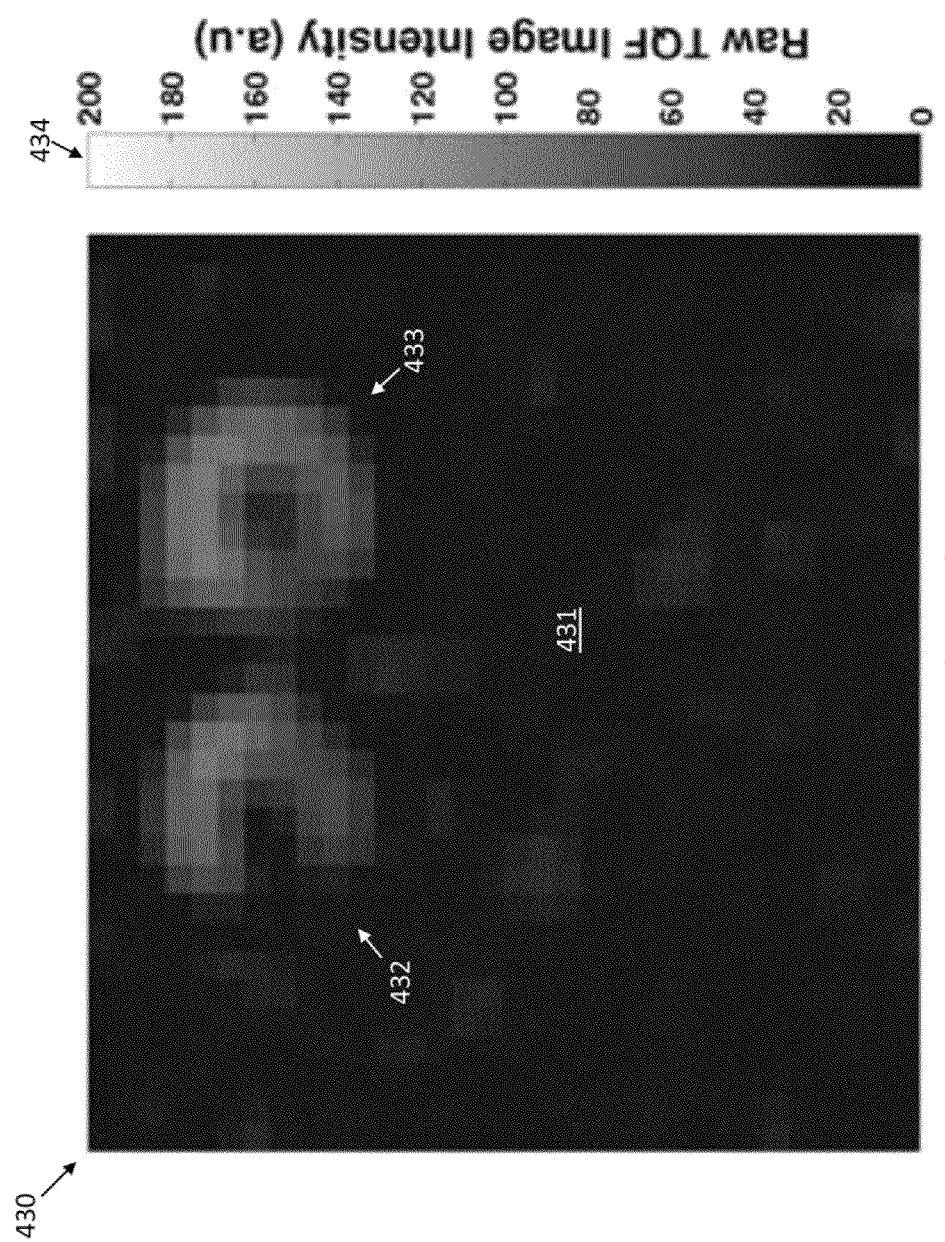
FIG. 4C is an exemplary uncorrected triple-quantum-filtered image produced by the exemplary 12-step cycle procedure in accordance with certain exemplary embodiments of the present disclosure.

For comparison, an exemplary $B_0$-uncorrected TQF image 430 is illustrated in FIG. 4C, which shows, e.g., that there can be substantial signal dropouts in the areas of magnetic field offset. Image portion 431 corresponds with the 2 L bottle containing the sodium water solution, and image portions 432, 433 correspond with the two smaller bottles containing the agar gel with sodium. An exemplary raw TQF image intensity scale 434 can be provided. Based on the acquisition parameters, the areas with field offsets of $\Omega \approx 45 + 91n$ (Hz), $n=0, \pm 1, \pm 2, \ldots$ can show significant signal loss whereas it is possible that areas with $\Omega \approx 0 + 91n$ (Hz), $n=0, \pm 1, \pm 2, \ldots$ do not show any substantial effect. This result can be confirmed by, e.g., comparing the TQF images of FIGS. 4A-4D with the $B_0$ map of FIG. 3B. Signal dropouts due to $B_0$ offset can be clearly visible and the image artefacts due to $B_0$ inhomogeneities and offsets can be largely removed after $B_0$ correction has been applied.

Figure 4D:
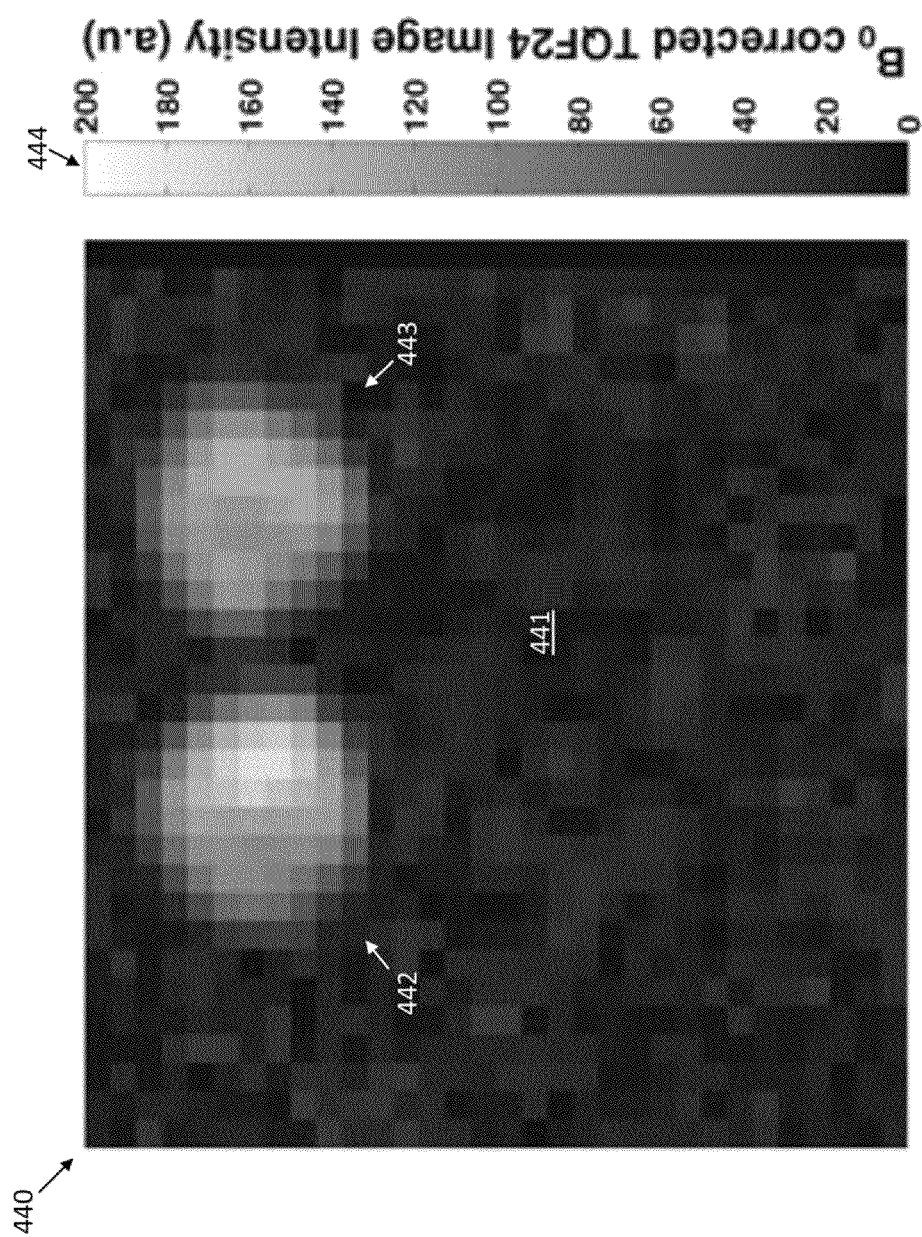
FIG. 4D is an exemplary triple-quantum-filtered image produced by a 24-step cycle procedure in accordance with certain exemplary embodiments of the present disclosure.

FIG. 4D shows an exemplary illustration of an image 440 of the same slice illustrated in the exemplary image 310 shown in FIG. 3A, but acquired with a $B_0$-corrected 24-step phase-cycle procedure. Image portion 441 corresponds with the 2 L bottle containing the sodium water solution, and image portions 442, 443 correspond with the two smaller bottles containing the agar gel with sodium. An exemplary scale 444 can be provided.

Figure 5A:
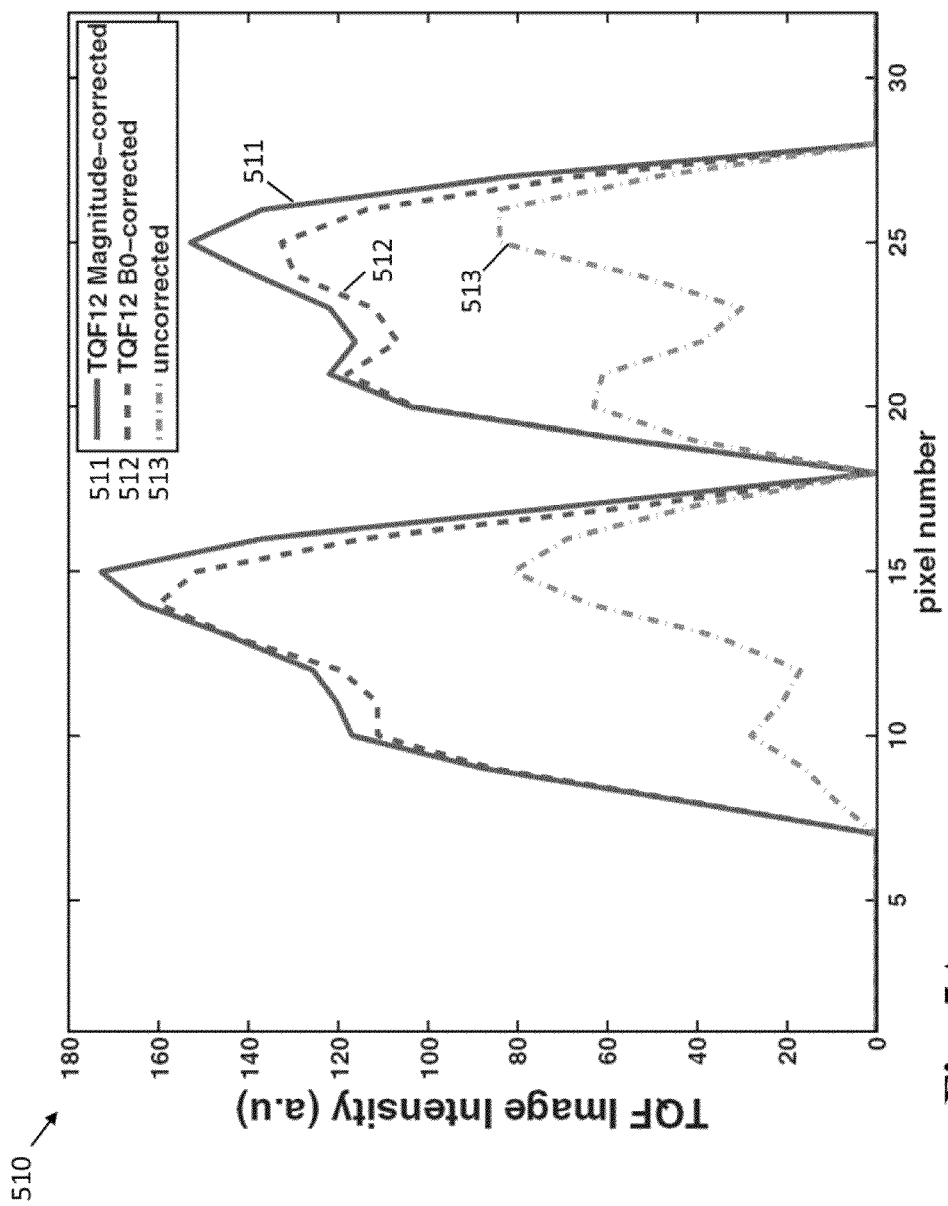
FIG. 5A is an exemplary illustration of a one-dimensional profile through the center of agar phantoms for images produced by an exemplary 12-step TQF cycle procedure in accordance with certain exemplary embodiments of the present disclosure.

FIG. 5A shows an exemplary graph 510 of a one-dimensional (1D) section through the centers of the agar-gel phantoms for an exemplary 12-step cycle TQF images in according to a certain exemplary embodiment of the present disclosure. As illustrated in FIG. 5A, e.g., profiles 511, 512, 513 represent TQF 12 Magnitude-corrected, TQF 12 $B_0$-corrected, and uncorrected, respectively, and can be superposed over one another to illustrate the differences between the two exemplary $B_0$ correction procedures and a procedure without $B_0$ correction. While the two exemplary gel phantoms were prepared with 1.4 ratio in sodium concentrations, the single-quantum images (see, e.g., FIG. 3A) show only a $1.27 \pm 0.06$ ratio. This exemplary deviation of about 10% from the nominal value can be attributed to spacial $B_0$- and $B_1$-variations, for example. It is also possible that because the two agar gels can have been produced independently, different amounts of air micro-bubbles could have formed in the two phantoms causing additional differences in phantoms' image intensities via different $T_2^*$ properties. Such effects can also be responsible for spurious image-intensity inhomogeneities observed in single- and triple-quantum images. Regardless of the cause of the effect, properly reconstructed TQF images can show the same signal ratio as the single-quantum ones. For example, exemplary $B_0$-corrected 12-step TQF images can provide and indicate a ratio of about $1.21 \pm 0.08$ between the signal from the two gel phantoms, as illustrated in, e.g., FIGS. 4A-4D, 5A and 5B, and confirm quantitatively that proper scaling in the TQF images can be preserved.

Figure 5B:
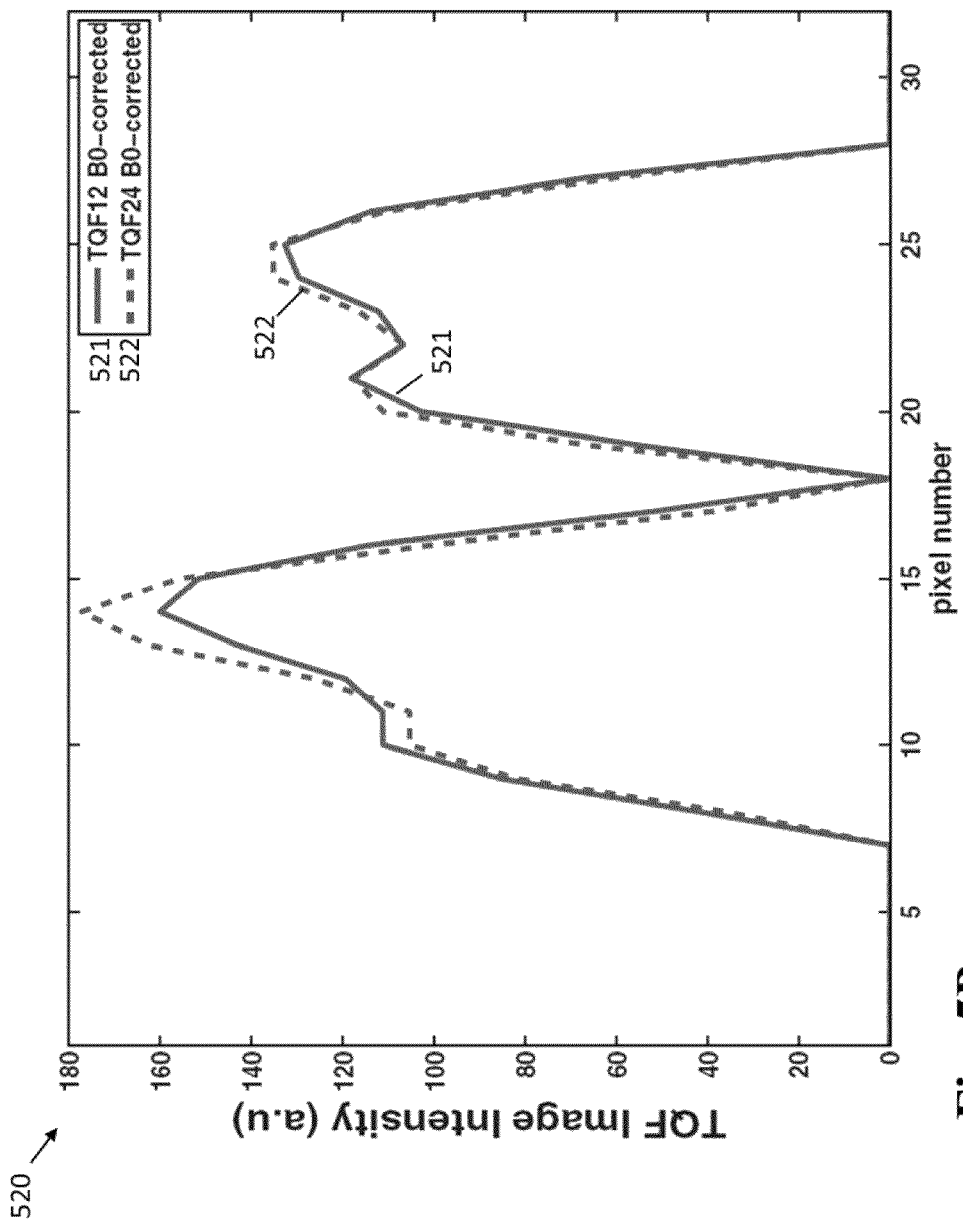
FIG. 5B is an exemplary illustration of a one-dimensional profile through the center of the agar phantoms for image produced by the exemplary 12-step TQF cycle procedure and an exemplary image in accordance with certain exemplary embodiments of the present disclosure, produced by the 24-step cycle procedure.

FIG. 5B shows an exemplary graph 520 of a one-dimensional (1D) section through the centers of the agar-gel phantoms for the exemplary 12-step cycle TQF image according to certain exemplary embodiments of the present disclosure, and an exemplary image generated using the embodiment of the system, arrangement, process and computer-accessible medium based on the exemplary 24-step cycle procedure. As illustrated in FIG. 5B, profiles 521, 522 can represent the exemplary 12-step cycle TQF $B_0$-corrected image and 24-step cycle TQF $B_0$-corrected, respectively, and can be superposed over one another to illustrate the differences between the two $B_0$ correction procedures. An exemplary measured SNR efficiency ratio between the 12-step and the 24-step procedures can be $\epsilon_{12}/\epsilon_{24} = 1.47 \pm 0.08$, which can be considered to be in a good agreement with a predicted and/or determined value of $\sqrt{2} \approx 1.41$, for example.

Description of Further Exemplary Embodiments

Because modern clinical scanners cannot provide $B_0$ homogeneity significantly better than several deca-Hertz, some measures can be taken to account for the dephasing between the TQF pathways. $B_0$ stability of a procedure can depend on the selected acquisition parameters. A exemplary choice of the parameters can be governed by the tissue properties providing unwelcome coupling between the tissue and the robustness of the procedure against $B_0$ inhomogeneities. Accordingly, it may be difficult to arbitrarily set a creation time $\tau_1$ to a small value in an attempt to improve $B_0$ stability of a procedure without severe SNR penalty.

An exemplary embodiment of an TQF imaging procedure according to the present disclosure can be robust against $B_0$-inhomogeneities and remove the undesired interaction between the tissue properties and $B_0$ sensitivity, for example. The stability of the exemplary procedure against $B_0$ inhomogeneities can be the same as of a classical SAR-intense TQF filter with a refocusing pulse and that of the modified less SNR-efficient cycle procedure. Additionally, the Exemplary procedure can provide up to a $\sqrt{2}$ increase in SNR efficiency compared to heretofore known $B_0$-correction procedures, such as described in, e.g., C. Tanase et al. and S. Wimperis et al. This can be an important improvement, since the exemplary 12-step cycle procedure can provide about twice shorter acquisition of the $B_0$-corrected TQF images with a similar or substantially same SNR as the 24-step cycle procedure, for example.

An exemplary 12-step phase-cycling procedure according to certain exemplary embodiments of the present disclosure can be provided which can facilitate acquisition and reconstruction of the TQ coherences in presence of magnetic field inhomogeneities. The exemplary procedure according to the present disclosure can provide an increase in SNR efficiency by about 40% (e.g., compared to heretofore known procedures such as described in, e.g., C. Tanase et al. and S. Wimperis et al. If SNR is relatively high (e.g., greater than or equal to about 10%), accurate $B_0$-corrected magnitude images can be produced without $B_0$-map and without any substantial loss in precision.

Exemplary Noise Calculation

For noise analysis, is possible to simplify the expression for the recovered TQF signal from exemplary Equation (9). According, it is possible to combine expressions in exemplary Equations (12) and (14) into:

$$B_{p_1+3} + B_{p_1-3} = \frac{1}{12} \sum_{k=0}^{5} (-1)^k [S(0, \xi_{2;k}) + ip_1 S(\pi/2, \xi_{2;k})], \quad (20)$$

$$p_1 \pm 1$$

Then, exemplary Equation (9) can become:

$$S^{TQ} = \frac{1}{12} e^{-i\Omega t} \sum_{k=0}^{5} \sum_{p_1=\pm 1} (-1)^k [p_1 S(0, \xi_{2,k}) + +iS(\pi/2, \xi_{2,k})] e^{ip_1 \Omega \tau_1} \quad (21)$$

And after summation over $p_1$, it is possible to obtain:

$$S^{TQ} = \frac{i}{6} e^{-i\Omega t} \sum_{k=0}^{5} (-1)^k \{S(\pi/2, \xi_{2,k}) \cos(\Omega \tau_1) + +S(0, \xi_{2,k}) \sin(\Omega \tau_1)\} \quad (22)$$

Since all measurements $S(\xi_1, \xi_2)$ can be subject to measurement noise with standard deviation $\sigma_0$, following a propagation of errors procedure, it is possible to obtain an estimate of noise in the TQF signal:

$$\sigma^2(S^{TQ}) = \frac{1}{36} \sum_{k=0}^{5} \{\sigma_0^2 \cos^2(\Omega \tau_1) + \sigma_0^2 \sin^2(\Omega \tau_1)\} = \quad (23)$$

$$= \frac{1}{6} \sigma_0^2$$

Because the normalization factors have been tracked throughout the calculation, direct substitution of signal from exemplary Equation (1) into exemplary Equation (22) can lead to the exemplary Equation (4) without any extra normalization needed. This can significantly simplify the SNR analysis procedure, and the SNR in the recorded TQF signal can be expressed as:

$$SNR_{12} = \frac{S^{TQ}}{\sigma_0} \sqrt{6} \quad (24)$$

Exemplary 14-Step Cycle Procedure

The exemplary 14-step cycle procedure according to certain exemplary embodiments of the present disclosure can facilitate a correct reconstruction of the triple-quantum filtered signal in the presence of $B_0$ inhomogeneities after exemplary 14 phase-steps without any loss (or substantial loss) in SNR efficiency.

For example, it is possible to use the following exemplary terms:

$$\xi_1 = (\phi_1 - \phi_2), \xi_2 = (\phi_2 - \phi_3), \xi_3 = (\phi_3 + \psi) \quad (25)$$

It is then possible to re-arrange the terms in exemplary Equation (1), so that it becomes:

$$S(\phi_1, \phi_2, \phi_3, \psi) = S(\xi_1, \xi_2, \xi_3) = e^{i\xi_3} \sum_{p_1=-1}^{1} \sum_{p_2=-3}^{3} e^{-i(p_1 \xi_1 + p_2 \xi_2)} B_{p_1 p_2} = \sum_{p_2=-3}^{3} e^{-ip_2 \xi_2} C_{p_2}(\xi_1, \xi_3) \quad (26)$$

where $C_{p_2}$ can be the total amplitude due to the level-$p_2$ coherence after the second excitation pulse. Hence, amplitudes $C_{\pm 3}$ can be of particular interest for an exemplary triple-quantum filter and can be provided by:

$$C_{\pm 3}(\xi_1, \xi_3) = e^{i\xi_3}(e^{-i\xi_1} B_{+1\pm 3} + e^{+i\xi_1} B_{-1\pm 3}) \quad (27)$$

From exemplary Equation (26), it is shown that by cycling the phases $\xi_1$, $\xi_2$ and $\xi_3$, the target amplitudes $B_{p1p2}$ can be extracted. A seven-step cycle procedure in $\xi_2$ according to $\xi_{2;k} = \alpha + 2\pi k/7$, $k=0, 1, \ldots, 6$ followed by an inverse Fourier transform applied to the collected signals along the cycle "index" k can lead to:

$$C_{p_2}(\xi_1, \xi_3) = \frac{1}{7} \left[ \sum_{k=0}^{6} S(\xi_1, \xi_{2;k}, \xi_3) e^{i\frac{2\pi p_2 k}{7}} \right] e^{+ip_2 \alpha} \quad (28)$$

$$\xi_{2;k} = \alpha + \frac{2\pi k}{7},$$

$$k = 0, 1, \ldots, 6$$

By cycling the phases $\xi_1$ and $\xi_3$ according to $\xi_{1;1}=0$, $\xi_{3;1}=0$ and $\xi_{1;2}=\pi/2$, $\xi_{3;2}=\pi/2$, using exemplary Equation (27), it can possible to recover individual amplitudes $B_{\pm 1 \pm 3}$:

$$B_{+1\pm 3} = \frac{1}{2} [C_{\pm 3}(0,0) + C_{\pm 3}(\pi/2, \pi/2)]$$

$$B_{-1\pm 3} = \frac{1}{2} [C_{\pm 3}(0,0) - C_{\pm 3}(\pi/2, \pi/2)] \quad (29)$$

In summary, all amplitudes $B_{\pm 1 \pm 3}$ contributing to the TQF signal can be measured using the exemplary 14-step cycling procedure. After application of $B_0$ correction, the proper triple-quantum filtered signal can be recovered using exemplary Equation 8, for example.

The exemplary acquisition of $B_0$-corrected triple-quantum filtered data can include a $B_0$-mapping acquisition followed by an exemplary 14-step phase cycle. The exemplary cycle can include 2×7 paired acquisitions with the following exemplary phase cycling rules:

Step 1. Acquire signals with $\phi_{1;k}=0+2\pi k/7$, $\phi_{2;k}=0+2\pi k/7$, $\phi_{3;k}=0$ and receiver phase $\psi=0$ for k=0, 1, . . . , 6.

Step 2. Acquire signals with $\phi_{1;k}=\pi/2+2\pi k/7$, $\phi_{2;k}=0+2\pi k/7$, $\phi_{3;k}=0$ and receiver phase $\psi=\pi/2$ for k=0, 1, . . . , 6.

The exemplary processing of the acquired data can include application of two-dimensional (2D) Fourier transformation to the exemplary 2×7 data set along the 2D "phase-cycle index" and proper recombination of the obtained amplitudes.

Exemplary SNR Analysis

Exemplary SNR analysis for the exemplary 14-step cycle procedure can be a similar procedure as for the exemplary 12-step cycle. Indeed, many of the same exemplary Equations described herein above with respect to the exemplary 12-step cycle procedure can be used for the exemplary 14-step cycle procedure upon being modified, e.g., based on there being 14-steps. For example, since noise in an NMR receiver can be considered Gaussian with a standard deviation $\sigma_0$, an exemplary SNR analysis procedure can be performed analytically and yield:

$$SNR_{14} = \frac{S^{TQ}}{\sigma_0} \sqrt{\frac{7}{2}}$$

Further, for comparison with other TQF procedures, a similar procedure as described herein above with respect to the 12-step cycle procedure can be used. For example, it is possible to introduce SNR efficiency or SNR per unit time=SNR/√N where N can be the number of phase-cycling steps. Based on an exemplary procedure having 14-steps, the exemplary SNR efficiency can be expressed as:

$$\epsilon_{14} = \frac{SNR_{14}}{\sqrt{14}} = \frac{S^{TQ}}{2\sigma_0}.$$

Thus, the exemplary 14-step procedure can have the same or substantially similar SNR efficiency as the exemplary 24 step cycle procedure described herein, thus possibly facilitating an acquisition of $B_0$-corrected TQF images in 14-steps. Exemplary $B_0$ correction without an ancillary $B_0$ map can be the same or similar procedure as described herein, for example.

An exemplary comparison of the SNR-efficiencies of the exemplary 14-step and 24-step TQF procedures can be performed by studying the noise in the image backgrounds. Indeed, mean value in the image background outside of the object can be proportional to the noise level. The ratio of these means corrected for acquisition duration provides the ratio of the SNR efficiencies of the two procedures. For example, if $\eta_{24}$ and $\eta_{14}$ can be the mean noise levels observed in the 24- and 14-step cycles respectively, then experimental ratio of the efficiencies $\epsilon_{14}/\epsilon_{24}$ can be:

$$\frac{\epsilon_{14}}{\epsilon_{24}} = \frac{\eta_{24}}{\eta_{14}} \sqrt{\frac{24}{14}} \quad (30)$$

Considering $\eta_{24}$ and $\eta_{14}$ can be subject to measurement noise themselves, the SNR efficiency ratio can differ from the predicted and/or determined value of 1 by chance. This random deviation can be evaluated by comparing the SNR efficiency ratios from different slices in the three-dimensional (3D) volume.

Because each of the measured quantities $B_{P1P2}$ can be subject to random Gaussian noise with $\sigma = \sigma_0/\sqrt{14}$, the magnitudes $|B_{P1P2}|$ can come from a Rice distribution with parameters $B_{P1P2}$ and $\sigma_0/\sqrt{14}$. Hence, a bias will appear in the areas of small SNR (such as regions outside of the imaged sample). Because Rician distribution approaches Gaussian distribution rapidly when SNR increases, for SNR levels of about 10, the difference between Rician and Gaussian distributions can be neglected.

Thus, $B_0$-corrected TQF image can be reconstructed without any knowledge of the $B_0$ distribution and without loss in accuracy and precision when SNR greater than about 10, for example.

Exemplary Results and Discussion

Using substantially the same or similar exemplary procedure as described herein above with respect to the exemplary 12-step cycle procedure, an exemplary embodiment of the exemplary 14-step cycle procedure was performed in accordance with the present disclosure. For example, a large bottle containing sodium in a water solution and two small bottles containing an agar gel with sodium were used. As described herein above, FIGS. 3A and 3B illustrate an exemplary single-quantum sodium image of the phantom arrangement and the $B_0$ field distribution in the same slice, respectively, generated using exemplary embodiments of a system, arrangement and computer-accessible medium according to the present disclosure.

Figure 6A:
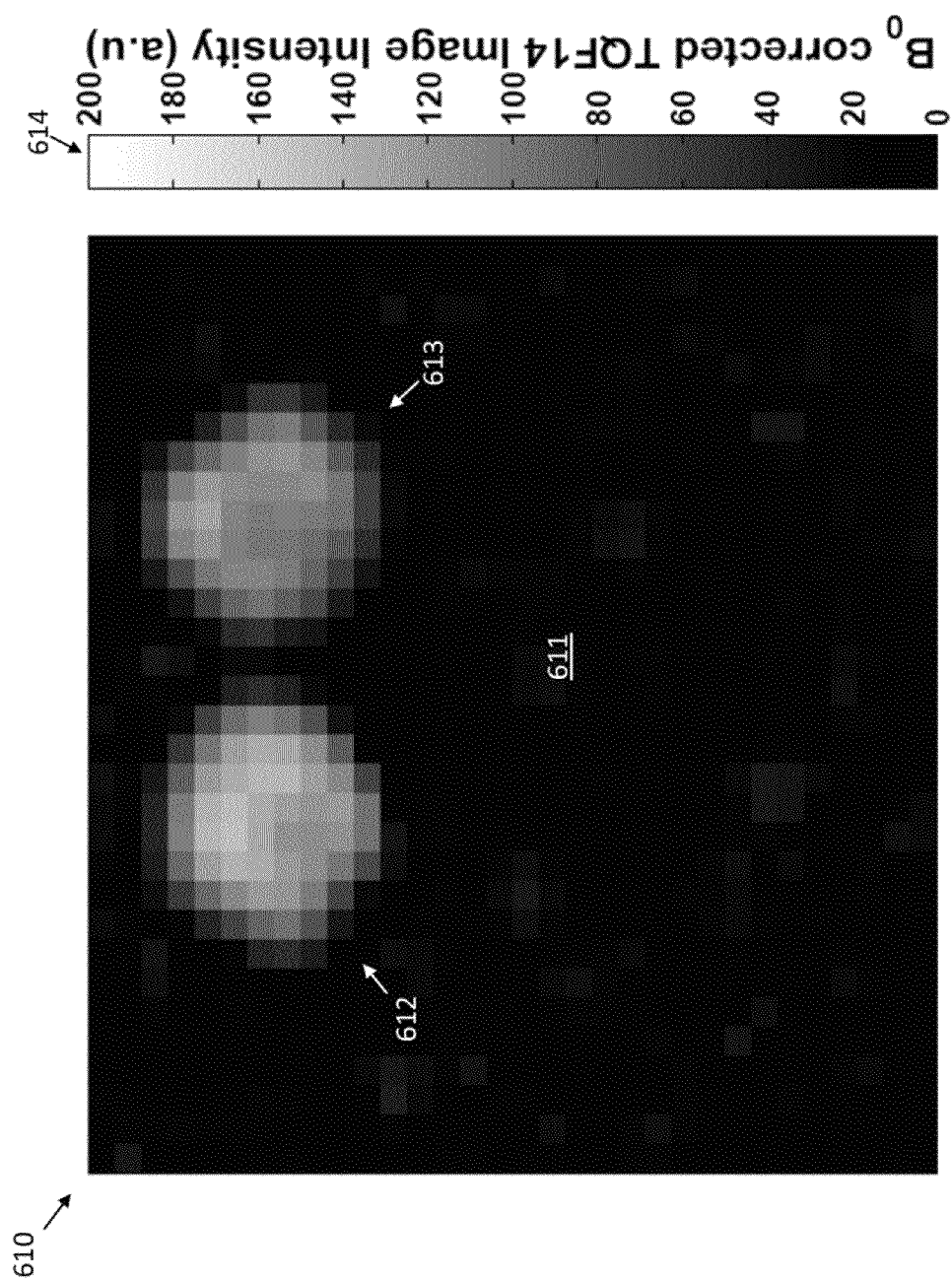
FIG. 6A is an exemplary illustration of the exemplary triple-quantum-filtered image of the slice illustrated in FIGS. 3A and 3B after $B_0$ correction generated using a system, arrangement and/or computer-accessible medium in accordance with certain exemplary embodiments of the present disclosure.
Figure 6B:
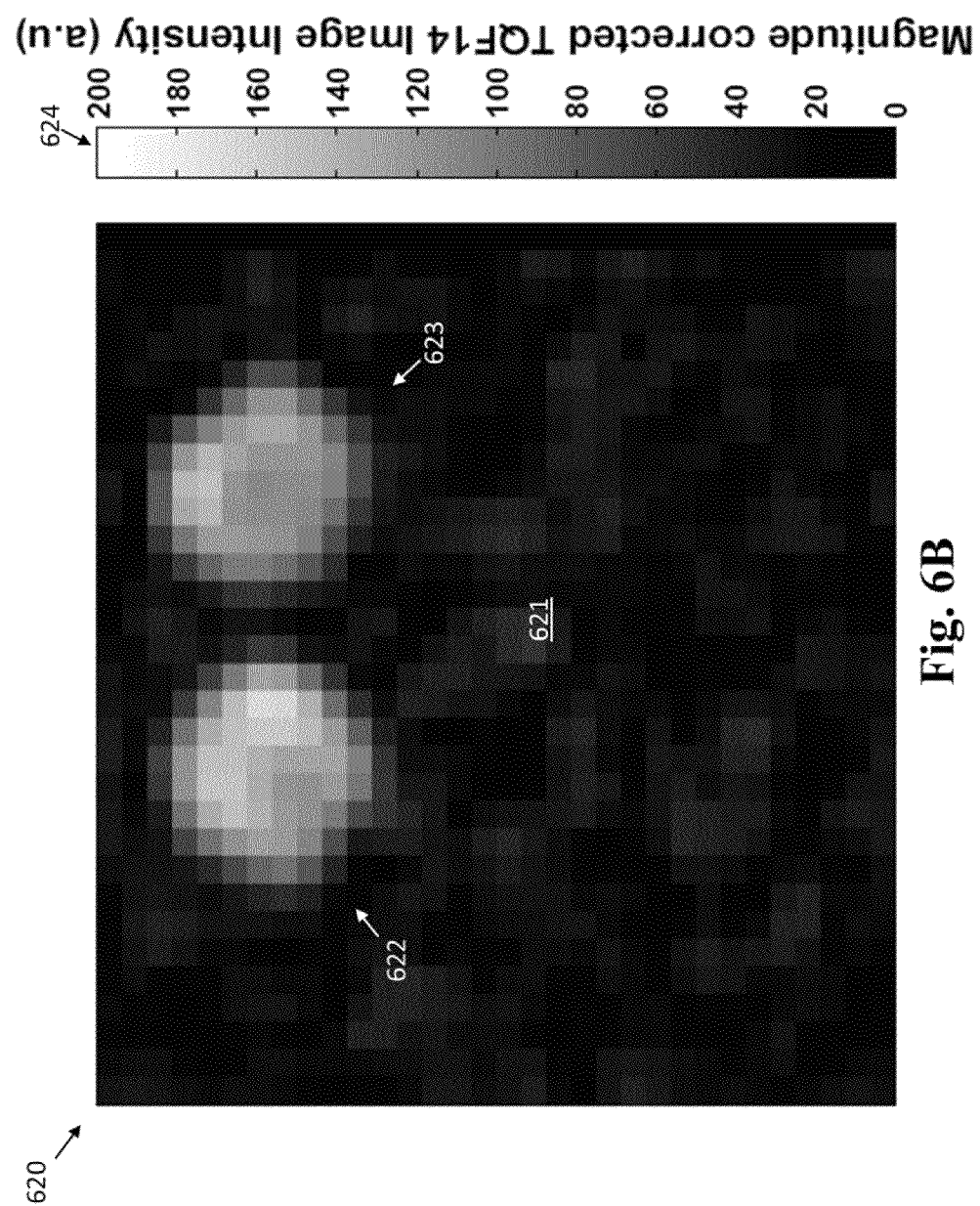
FIG. 6B is an exemplary illustration of the exemplary triple-quantum-filtered image of the slice illustrated in FIGS. 3A and 3B after magnitude $B_0$ correction generated using a system, arrangement and/or computer-accessible medium in accordance with certain exemplary embodiments of the present disclosure.
Figure 6C:
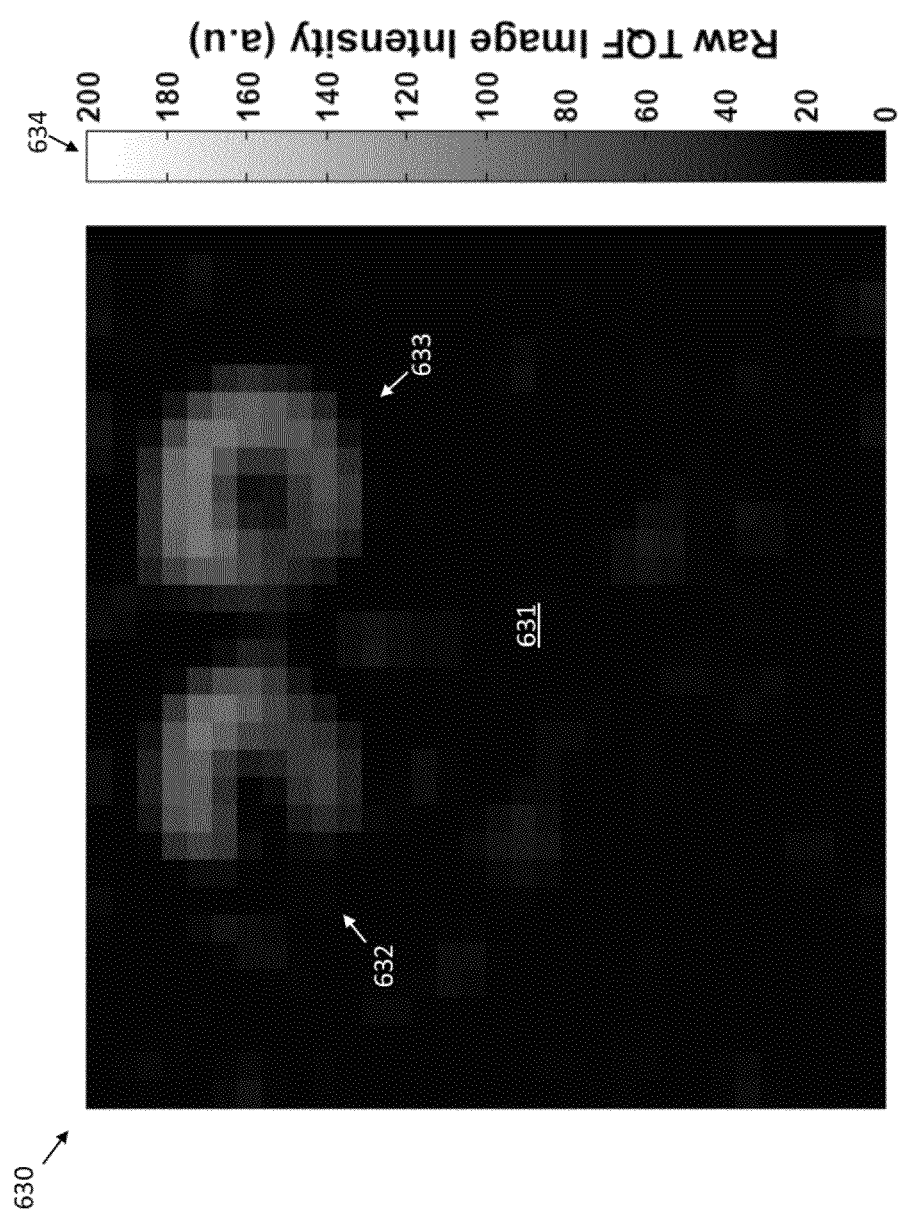
FIG. 6C is an exemplary illustration of an uncorrected image of the slice illustrated in FIGS. 3A and 3B generated using a system, arrangement and/or computer-accessible medium in accordance with certain exemplary embodiments of the present disclosure.

FIGS. 6A-6D illustrate an exemplary 14-step cycle procedure TQF images of the same slice according to an exemplary embodiment of the present disclosure. As illustrated in FIGS. 6A-6C, exemplary image portions 611, 621, 631 correspond to the 2 L bottle containing the sodium water solution, and exemplary image portions 612, 613, 622, 623, 632, 633 correspond to the smaller bottles containing the agar gel with sodium. Exemplary intensity scales 614, 624, 634 can be provided.

For example, FIG. 6A illustrates the exemplary triple-quantum-filtered image of the slice shown in FIGS. 3A and 3B after $B_0$ correction. As illustrated in FIG. 6A, after the exemplary $B_0$ correction has been applied, the image, artefacts due to $B_0$ inhomogeneities and offsets can be largely removed. As illustrated in FIG. 6B, the exemplary image can be similar to the exemplary image illustrated in FIG. 6A, both of which can be considered relatively robust against existing $B_0$ inhomogeneities, as can be illustrated in a comparison with the exemplary $B_0$-uncorrected image illustrated in FIG. 6C. As shown in the exemplary image of FIG. 6C, e.g., there can be signal dropouts in the areas of magnetic field offsets. Based on the acquisition parameters, the areas with field offsets of $\Omega \approx 45+91n$ (Hz), $n=0, \pm 1, \pm 2, \ldots$ can show relatively large signal dropouts whereas it can be possible that areas with $\Omega \approx 0+91n$ (Hz), $n=0, \pm 1, \pm 2, \ldots$ do not show any substantial effect, for example.

Figure 6D:
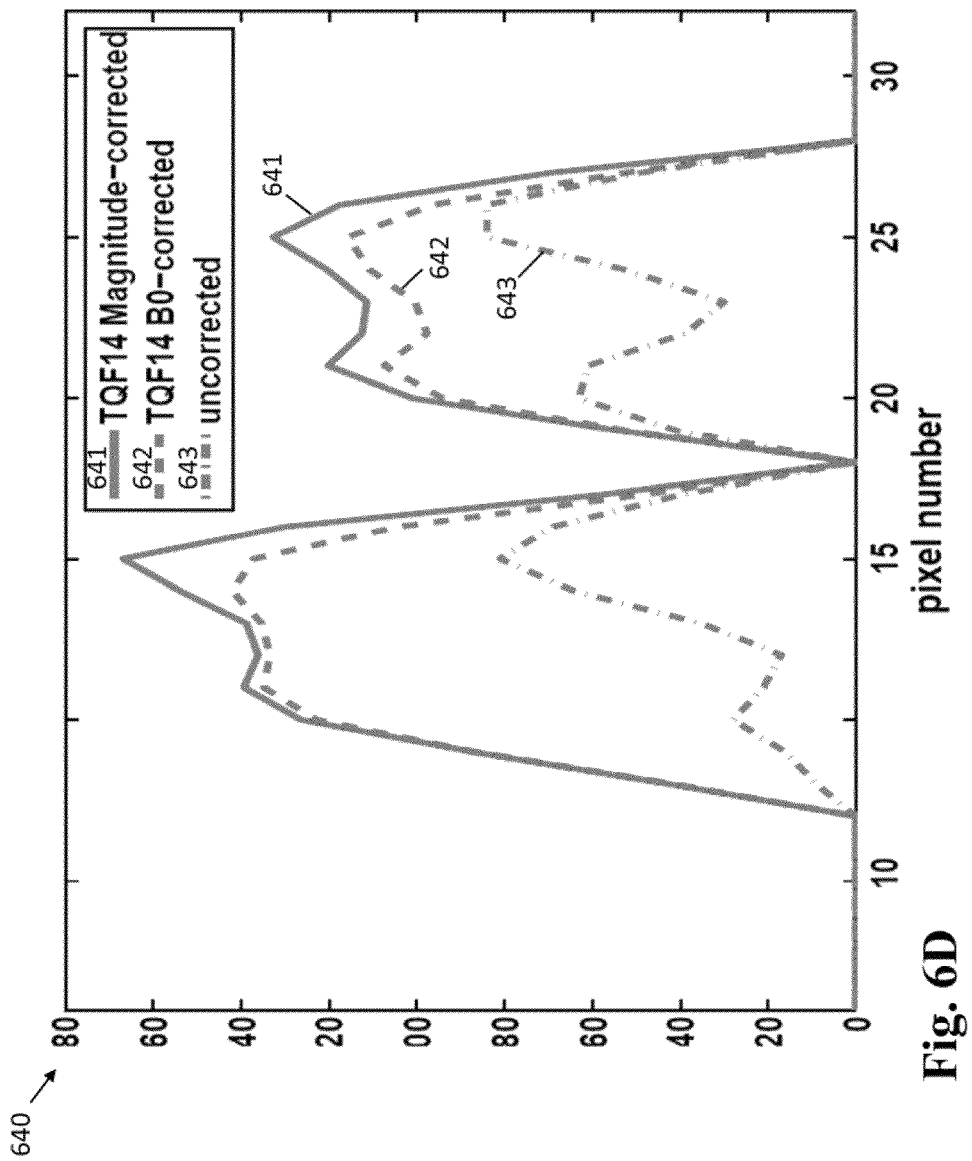
FIG. 6D is an exemplary graph illustrating a comparison of profiles of the images of the exemplary images illustrated in FIGS. 6A-6C generated using a system, arrangement and/or computer-accessible medium in accordance with certain exemplary embodiments of the present disclosure.

FIG. 6D shows an exemplary graph 640 which illustrates exemplary one-dimensional (1D) profiles 641, 642, 643 through the centers of agar phantoms for the three reconstructions illustrated in FIGS. 6A-6C, indicating the differences between the three exemplary reconstruction procedures. As illustrated in FIG. 6D, the exemplary 14-step cycle magnitude $B_0$ correction procedure in accordance with certain exemplary embodiments of the present disclosure can provide a beneficial TQF image intensity in comparison to the exemplary 14-step cycle $B_0$ correction procedure, both of which can provide beneficial intensity to the exemplary $B_0$-uncorrected image.

Figure 7A:
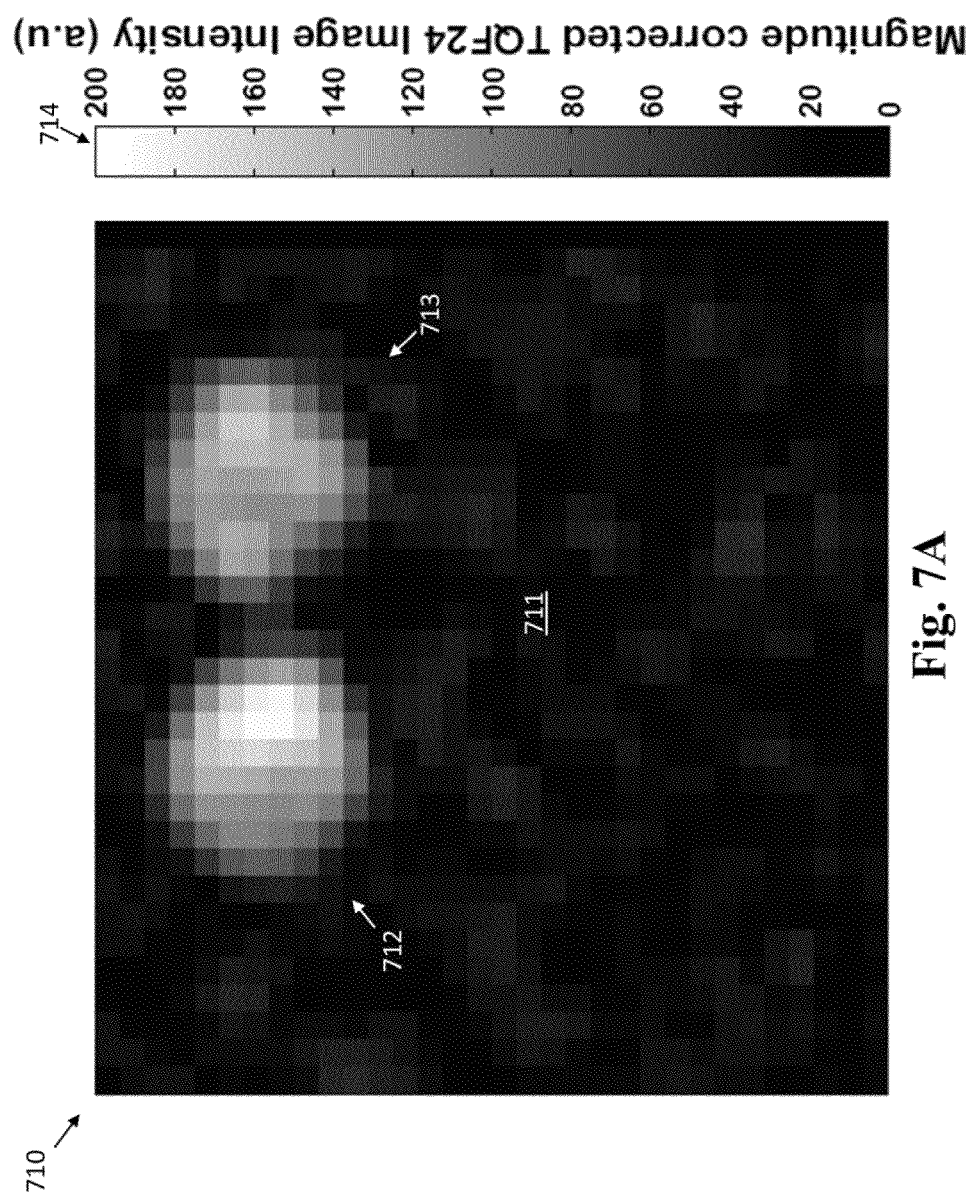
FIG. 7A is an illustration of a exemplary image based on a 24-step TQF cycle procedure in accordance with certain exemplary embodiments of the present disclosure.

FIG. 7A illustrates a triple-quantum filtered image corrected for $B_0$ inhomogeneities using a 24-step cycle procedure according to a certain exemplary embodiment of the present disclosure. An exemplary image portion 711 corresponds to the 2 L bottle containing the sodium water solution, and the exemplary image portions 712, 713 correspond to the smaller bottles containing the agar gel with sodium. An exemplary intensity scale 714 can be provided.

Figure 7B:
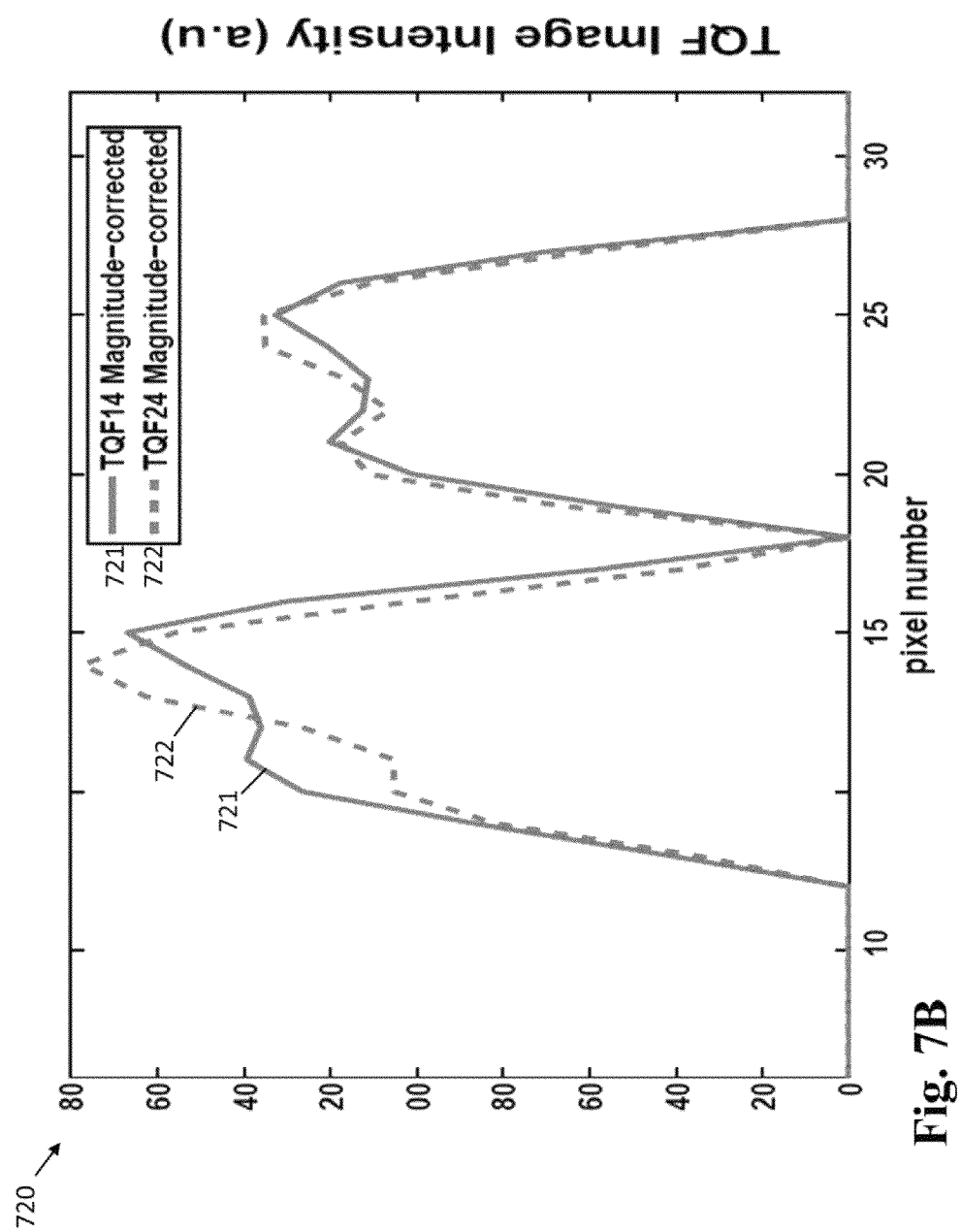
FIG. 7B is an exemplary illustration of a one-dimensional profile through the center of the agar phantoms for image produced by the exemplary 12-step TQF cycle procedure in accordance with further exemplary embodiments of the present disclosure and an exemplary image produced by the 24-step cycle procedure.

FIG. 7B shows an exemplary graph 720 providing a comparison between the exemplary 24-step cycle procedure and the exemplary 14-step cycle procedure of a triple-quantum filtered image corrected for $B_0$ inhomogeneities using the 1D sections through the centers of the agar-gel phantoms in accordance with certain exemplary embodiments of the present disclosure. These resulting profiles 721, 722 indicate that there can be relative good agreement between these two procedures. For example, the SNR efficiency ratio of the two procedures was $\epsilon_{14}/\epsilon_{24} = 0.99 \pm 0.05$, which can be considered to be in relatively good agreement with a predicted value of unity. Thus, the exemplary 14-step phase-cycling procedure can facilitate a reduction of $B_0$-corrected-TQF imaging time without loss of SNR efficiency compared to the previously known procedure.

Based on these exemplary results, it can appear that $B_0$ shimming can not be of concern since the developed procedure can be robust against $B_0$ variations and can operate even without $B_0$-mapping. However, the situation can be not that simplistic, and based on exemplary Equation (5), SNR efficiency of the conventional six-step TQ filter can be:

$$SNR_6 = \frac{S^{TQ}}{\sigma_0}\sqrt{6} \Rightarrow \epsilon_6 = \frac{SNR_6}{\sqrt{6}} = \frac{S^{TQ}}{\sigma_0} \quad (31)$$

Thus, a conventional six-step filter can provide twice higher SNR-efficiency compared to the exemplary $B_0$-correction procedures. While this can be considered as a set-back, the importance of the $B_1$- and $B_0$-correction procedures can be based on many factors. For example, $B_0$-offset can cause signal dropouts in excess of the factor of two. Additionally, a few tens of a percent variations in TQF image intensities caused by spatial modulation in $B_0$, can hamper quantitative interpretation of TQF images and can reduce its diagnostic potential. Further, capabilities of the clinical MR scanners can be limited by tissue inhomogeneities and hardware restrictions set by physiology of the subjects. Therefore, spatial variations in $B_1$ of the order of about 10-15% and spatial variations in $B_0$ of a few tens of Hz can be very common in clinical settings. The procedure described here has several advantages: it can be robust against spatial $B_1$- and $B_0$-variations can offer relatively high RF-efficiency and short acquisition times.

Exemplary Noise Calculation

Following a similar procedure as described above for exemplary noise calculation of an exemplary 12-step cycle procedure in accordance with the present disclosure, it is possible to obtain an exemplary noise calculation for an exemplary 12-step cycle procedure in accordance with the present disclosure which can be expressed as:

$$SNR_{14} = \frac{S^{TQ}}{\sigma_0}\sqrt{\frac{7}{2}} \quad (32)$$

Exemplary Double-Quantum Filtering (DQF)

The same exemplary data that can be used to extract NMR signal due to triple-quantum coherences in presence of $B_0$ in homogeneities can be used to extract an NMR signal due to double-quantum coherences, for example. This can provide additional information compared to TQF signal because, e.g., the DQF signals can arise from the 23Na nuclei that exhibit an anisotropic residual quadrupolar coupling or slow motion compared to the Larmor frequency. For TQF, the signal can arise, e.g., from the 23Na nuclei that can be in the slow motion regime.

For example, the maximum signal due to order 2 coherences can be expressed as:

$$S^{DQ} = A_{+1+2} + A_{+1-2} + A_{-1+2} + A_{-1-2} \quad (33)$$

From exemplary Equation (26), it is possible to obtain:

$$C_{\pm 2}(\xi_1, \xi_3) = e^{i\xi_3}(e^{-i\xi_1}B_{+1\pm 2} + e^{+i\xi_1}B_{-1\pm 2}) \quad (34)$$

The relationship between the amplitudes $C_{\pm 2}$ and the measured signal can be given in exemplary Equation (28). Therefore, $$B_{+1\pm 2} = \frac{1}{2}(C_{\pm 2}(0,0) + C_{\pm 2}(\pi/2, \pi/2))$$

$$B_{-1\pm 2} = \frac{1}{2}(C_{\pm 2}(0,0) - C_{\pm 2}(\pi/2, \pi/2)) \quad (35)$$

and a properly recombined DQF signal can be expressed as, e.g.:

$$S^{DQ} = (B_{+1-2}e^{+i(\tau_1-2\tau_2)\Omega} + B_{-1-2}e^{-i(\tau_1+2\tau_2)\Omega} + B_{-1+2}e^{-i(\tau_1-2\tau_2)\Omega} + B_{+1+2}e^{+i(\tau_1+2\tau_2)\Omega})e^{-i\Omega t} \quad (36)$$

In MRI, magnitude images can be sufficient, therefore, similarly as described herein above, an exemplary magnitude of a $B_0$-corrected image can be recovered without the knowledge of $B_0$ map in accordance with exemplary embodiments of the present disclosure. For example:

$$|S^{DQ}| = |A_{+1-2} + A_{-1-2} + A_{-1+2} + A_{+1+2}| = = |A_{+1-2}| + |A_{-1-2}| + |A_{-1+2}| + |A_{+1-2}| = = |B_{+1-2}| + |B_{-1-2}| + |B_{-1+2}| + |B_{+1+2}| \quad (37)$$

The SNR analysis of DQF SNR efficiency can be conducted in a fashion similar to that of the TQF signal. For example, it are shown that:

$$SNR_{14}^{DQ} = \frac{S^{DQ}}{\sigma_0}\sqrt{\frac{7}{2}} \quad (38)$$

and the exemplary SNR efficiency can be expressed as:

$$\epsilon_{14}^{DQ} = \frac{SNR_{14}^{DQ}}{\sqrt{14}} = \frac{S^{DQ}}{2\sigma_0} \quad (39)$$

Accordingly, double-quantum Filtered images can be reconstructed from the same data set as used for the exemplary 14-step cycle procedure described herein above. Similarly, double-quantum Filtered images can be reconstructed from the same data set as used for the exemplary 12-step cycle procedure described herein above. Thus, similar to the TQF images, $B_0$-inhomogeneities can cause strong signal dropouts which can be corrected by reconstructing double-quantum Filtered images in accordance with certain exemplary embodiments of the present disclosure.

Figure 8A:
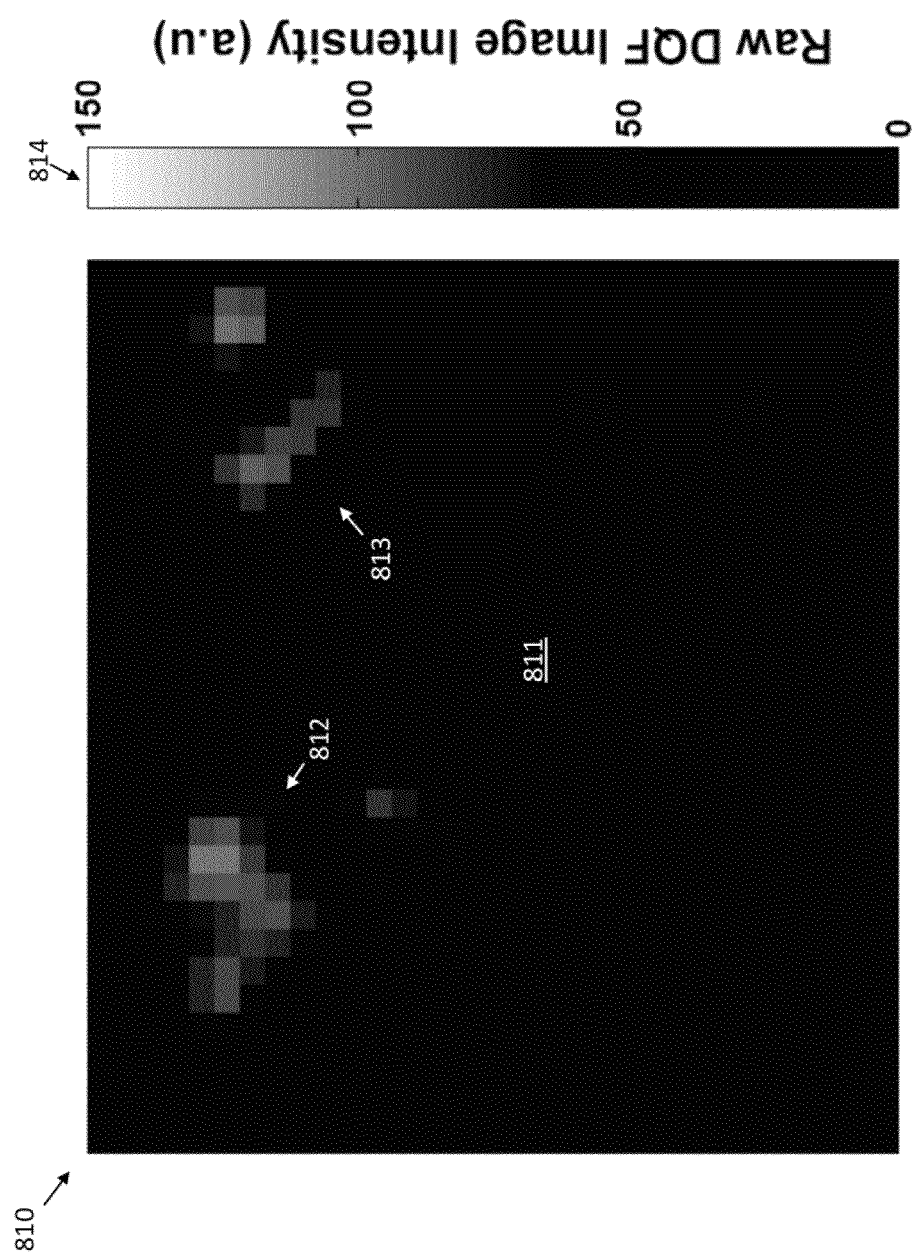
FIG. 8A is an illustration of an exemplary double-quantum-filtered image of a slice before $B_0$-correction which reveals signal dropouts in the areas of magnetic field offsets generated using a system, arrangement and/or computer-accessible medium in accordance with certain exemplary embodiments of the present disclosure.
Figure 8B:
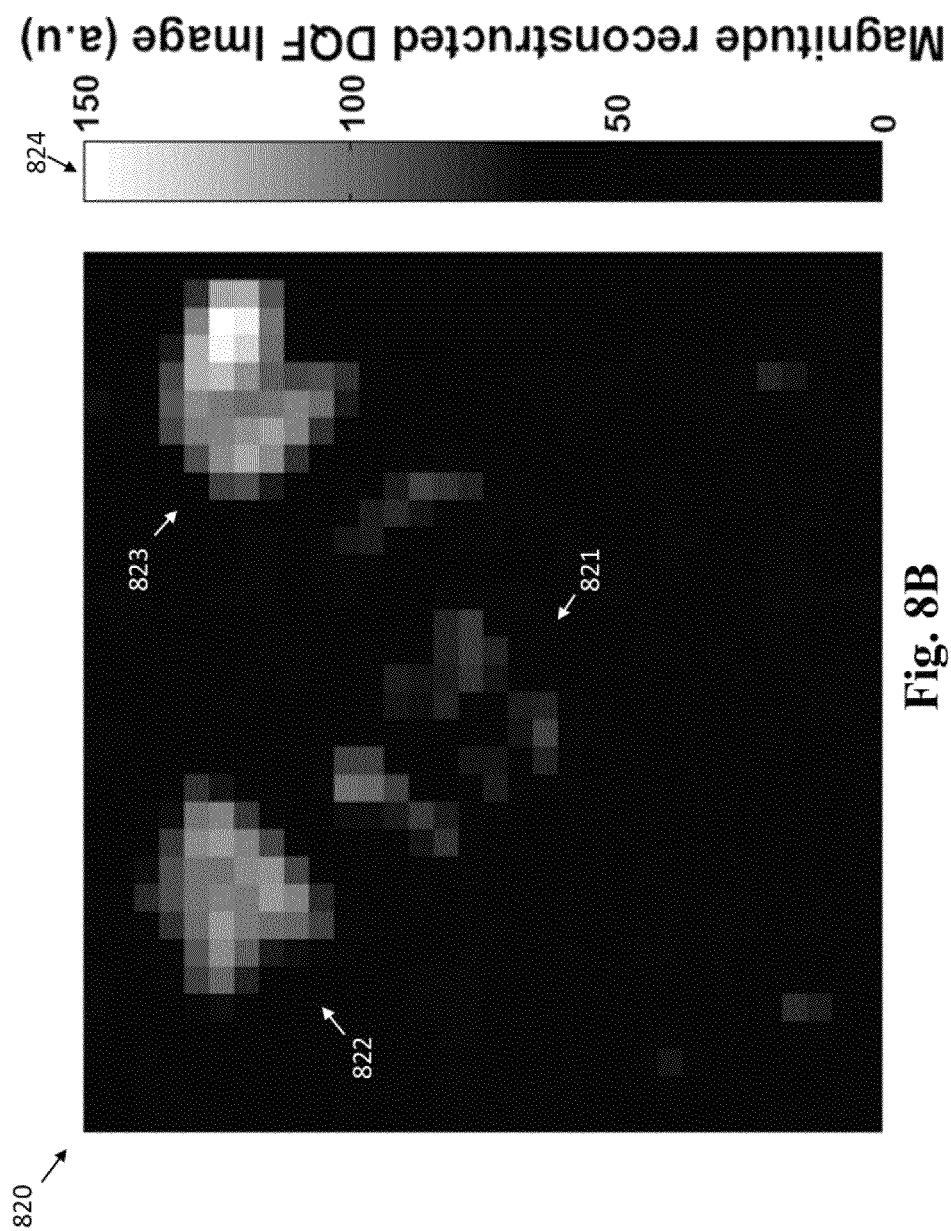
FIG. 8B is an illustration of an exemplary magnitude $B_0$-corrected image which illustrates proper recombination of the DQF amplitudes generated using a system, arrangement and/or computer-accessible medium in accordance with certain exemplary embodiments of the present disclosure.

FIG. 8A shows an exemplary double-quantum-filtered image of a slice before $B_0$-correction generated using an exemplary embodiment of the system, arrangement and/or computer/accessible medium according to the present disclosure which indicates signal dropouts in the areas of magnetic field offsets. FIG. 8B shows an exemplary magnitude $B_0$-corrected image which illustrates proper recombination of the DQF amplitudes generated using the system, arrangement and/or computer/accessible medium in accordance with certain exemplary embodiments of the present disclosure.

Exemplary Intracellular Sodium Non-invasive Quantification in a Human Brain

Sodium can be involved in many cellular functions such as regulation of mitosis, cellular proliferation, sodium/calcium-exchange mediation as well as cellular energy metabolism via active trans-membrane Na+/K+ transport. Most cell types maintain a large sodium ion concentration gradient across their membranes with an intracellular sodium concentration (ISC) of about 10-15 mmol/L and an extracellular sodium concentration (ESC) of about 140 mmol/L. This cross-membrane difference in sodium concentration can be essential for the generation and propagation of action potentials, cell volume regulation, and other cellular homeostatic and regulatory functions. Since the intracellular sodium volume fraction (ISVF) in healthy brain can be estimated to be between about 80% and about 95%, the calculated intracellular sodium molar fraction (ISMF) (defined as the ratio of the intracellular content (e.g., concentration, volume fraction, and/or total number of moles) to the total amount of sodium in the tissue) can be between about 22% and about 63%. Neurological disease processes can alter the trans-membrane sodium concentration gradient and the cell volume causing changes in ISC, ISVF and ISMF values. Therefore, non-invasive procedures for ISC, ISVF and ISMF quantification can be important for monitoring the function of healthy and diseased brain tissue, its disease progression and treatment success.

Similarly to proton-based MRI, conventional sodium MRI can be a non-invasive procedure based on a single-quantum (SQ) signal used for the quantification of the total tissue sodium concentration (TSC). The TSC represents a weighted average of the extracellular $[Na^+]_{ex}$ and intracellular $[Na^+]_{in}$ sodium content. For ISMF can be relatively high in healthy tissues and the sodium concentration in the extracellular space remains relatively constant as long as there can be adequate tissue perfusion, TSC can be sensitive to changes in the intracellular sodium volume fraction (cellular death or cellular swelling) as well as to changes in ISC due to impaired energy metabolism or other metabolic changes that affect sodium exchange across the cell membrane. Consequently, many pathological conditions can lead to changes in the bulk tissue sodium concentration. For example, neoplastic cell proliferation can disrupt normal cell packing and expand the extracellular volume. On the other hand, the ISC can be higher than in the healthy tissue because of differences in ion homeostasis within tumor cells. Hence, TSC in tumors can be increased compared to healthy tissue. Indeed, sodium MRI has been shown to be a useful procedure in the studies of several neurological disorders, tumors and the assessment of chemotherapeutic effects.

The TSC in brain tissue can also increase as a result of normal aging because cellular shrinkage and/or death will decrease the intracellular volume. In some diseases, such as multiple sclerosis, the increase of ISC might be accompanied by cellular swelling. This can not lead to any changes in TSC values, but would cause an increase in ISMF. This complex relationship between TSC and ISMF and the underlying ISC and ISVF are shown schematically. As described herein, a quantitative relationship between these four parameters can be established in accordance with certain exemplary embodiments of the present disclosure.

As changes in TSC can be attributed to several potential causes, differentiation between the extracellular and intracellular compartments can be highly desirable. Furthermore, ISC and ISVF rather than TSC can be of interest to determine tissue viability.

It is possible to analyze an exemplary relationship of physiologically and clinically relevant ISC and ISVF with the MRI-measurable quantities TSC and ISMF. It is possible to use this relationship and the known ISC and ISVF values for healthy brain tissue to estimate TSC and ISMF in the healthy brain. Then, it is possible employ single-quantum (SQ) and triple-quantum filtered (TQF) imaging with state-of-the-art filtering and correction procedures to perform the ISMF measurement in healthy human subjects at 7 T. It is also possible to combine ISMF and TSC measurements to obtain maps and histograms of ISC and ISVF in eight healthy subjects. The present disclosure demonstrates the feasibility and robustness of non-invasive spatially-resolved intracellular sodium quantification in vivo, paving the way for future clinical and research applications.

Exemplary Results

Figure 9:
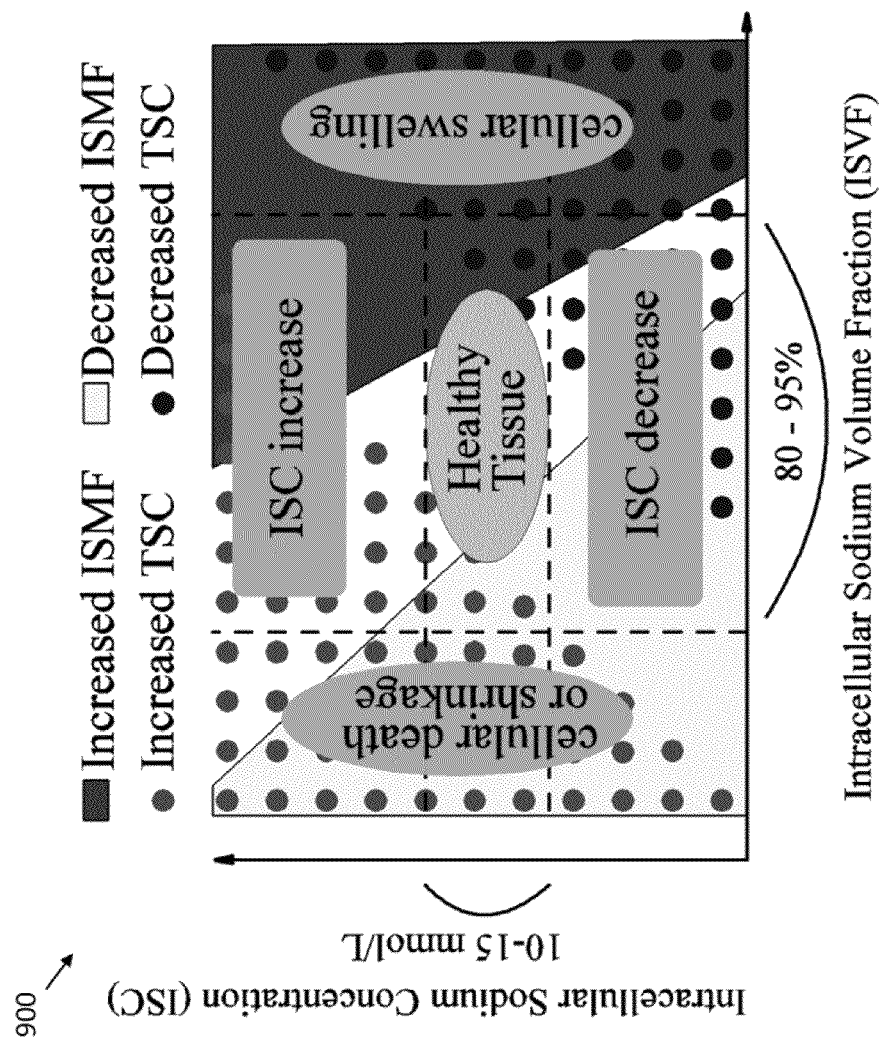
FIG. 9 is an exemplary schematic diagram illustrating the relationship between tissue viability, intracellular sodium concentration (ISC), and intracellular sodium volume fraction (ISVF) in accordance with certain exemplary embodiments of the present disclosure.

Exemplary Determinations for Intracellular Sodium Molar Fraction and Intracellular Sodium Volume Fraction The exemplary compartment tissue model described herein can establish a quantitative relationship between ISC, ISVF, TSC and ISMF. FIG. 9 shows an exemplary schematic diagram 900 illustrating an exemplary relationship between tissue viability, ISC and ISVF in accordance with certain exemplary embodiments of the present disclosure. The dashed lines can represent healthy ranges (e.g., about 7-10). Corresponding areas of increased and decreased tissue sodium concentration (TSC) and intracellular sodium molar fraction (ISMF) are also shown. Because both TSC and ISMF can depend on a combination of ISC and ISVF, they therefore can not provide a good measure of either ISC or ISVF if measured alone, for example. A presumption can be that brain tissue can be described by two compartments (e.g., the intracellular and the extracellular) with the extracellular sodium concentration fixed to 140 mmol/L.

Figure 10:
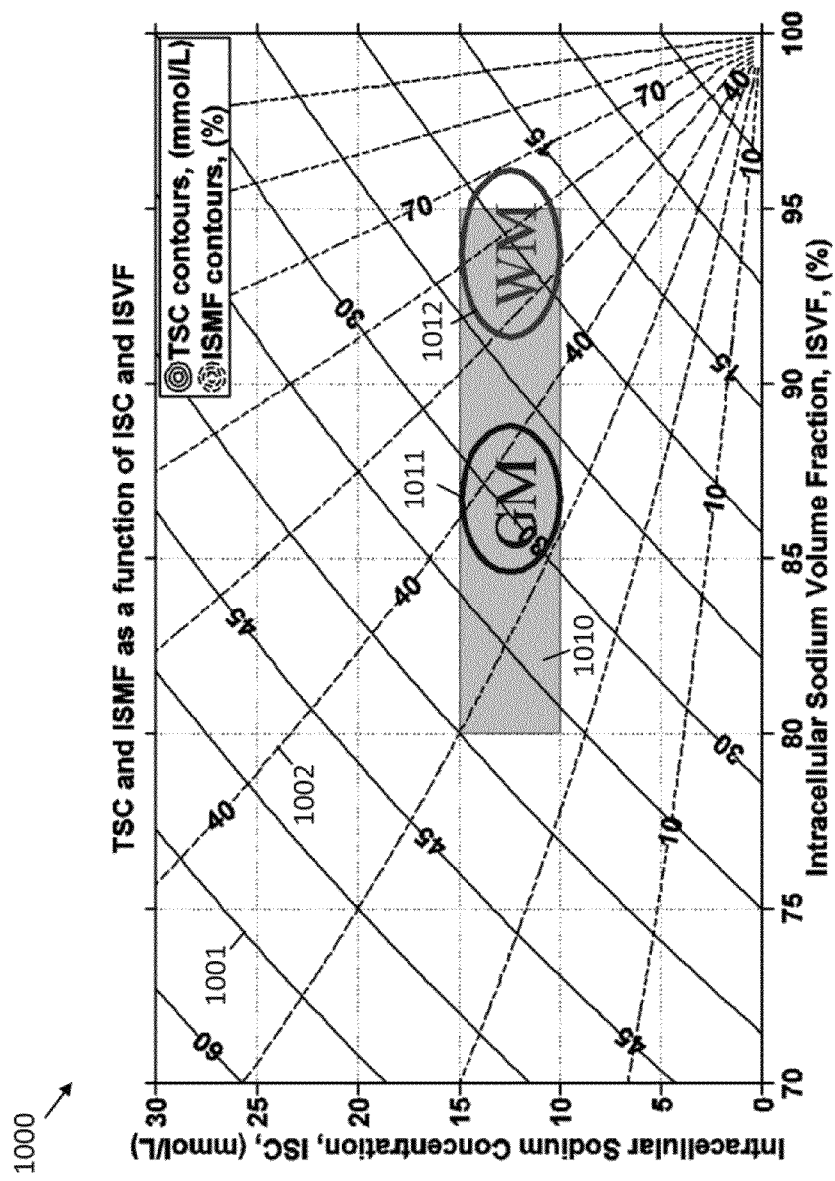
FIG. 10 is an exemplary graph illustrating the quantitative relationship between ISC, ISVF, TSC and ISMF represented in FIG. 9, in accordance with certain exemplary embodiments of the present disclosure.

Using the exemplary Equations described herein, it is possible to produce a graph which can quantify the exemplary relationship between ISC, ISVF, TSC and ISMF. For example, FIG. 10 is an exemplary graph 1000 illustrating the quantitative relationship between ISC, ISVF, TSC and ISMF shown in FIG. 9, in accordance with certain exemplary embodiments of the present disclosure. In the exemplary graph 1000 illustrated in FIG. 10, the horizontal and the vertical axes represent ISVF in percent and ISC in mmol/L, respectively, while the curves represent the contour lines of constant TSC values, represented by solid lines 1001 and ISMF values, represented by dashed lines 1002. The rectangular box 1010 illustrated in FIG. 10 can represent the range of ISC and ISVF values for healthy brain tissue based on reference measurements. For example, such reference measurements can include, e.g., results of studies. This graphical representation of the quantitative relationship can illustrate how any two out of the four quantities (ISC, ISVF, TSC, ISMF) can be computed based the remaining two. For example, assuming intracellular sodium concentration of about 10-15 mmol/L and ISVF between about 80% and 95%, it can be seen that TSC values above about 45 mmol/L can be extremely unlikely in healthy tissue as those would require either unreasonably low intracellular volume fractions or unreasonably high intracellular sodium concentrations. Furthermore, as shown in FIG. 10, the ISMF values in healthy brain tissue vary over a rather broad range between about 25% and 70%. Note that the only information used to produce these predictions can be that the tissue can be described by two compartments (intra- and extra-cellular), that the intracellular sodium concentration can be about 10-15 mmol/L, the intracellular sodium volume fraction can be about 80%-95%, and the extracellular sodium concentration can be fixed to about 140 mmol/L.

Conversely, assuming that TSC can be about 20 mmol/L for healthy white matter and about 30 mmol/L for healthy gray matter, and that ISC can be about 10-15 mmol/L, it is possible to estimate the expected values for ISMF and ISVF in gray and white matter as indicated by ovals 1011 and 1012 illustrated FIG. 10. Hence, the predicted and/or determined ISMF values for the two tissue types can be between about 28% and 72%, which can be considered to be in relatively good agreement with the previously reported values between about 26% and 57%. Correspondingly, the predicted ISVF values can be between about 85% and 96% which can be considered to be in relatively good agreement with the previously reported range of about 80%-95%. These exemplary predictions and/or determinations can be summarized as follows in Table 1.

EXEMPLARY TABLE 1

|  | WM, TSC = 20 mmol/L | GM, TSC = 30 mmol/L | BT, TSC = 25 mmol/L |
| --- | --- | --- | --- |
| ISVF (%) | 92-96 | 85-88 | 88-92 |
| ISMF (%) | 46-72 | 28-44 | 35-55 |

Exemplary Table 1 provides anticipated and/or determined ISMF and ISVF values for healthy white matter (WM), gray matter (GM) and combined brain tissue (BT), based on a two-compartment tissue model assuming ISC=10-15 mmol/L and ESC=140 mmol/L. These exemplary predictions and/or determinations can be in relatively good agreement with previously published measurements (see, e.g., Pelligrino D A, Musch T I, Dempsey J A. Interregional differences in brain intracellular pH and water compartmentation during acute normoxic and hypoxic hypocapnia in the anesthetized dog. Brain Res 1981; 214(2):387-404; Woodward D L, Reed D J, Woodbury D M. Extracellular space of rat cerebral cortex. Am J Physiol 1967; 212(2):367-370; Hirano A, Kato T. The Neuronal microenvironment. In: Boulton A A, Baker G B, Walz W, editors. Neuromethods. Volume 9. Clifton: Humana Press; 1988. p 105; and Ouwerkerk R, Bleich K B, Gillen J S, Pomper M G, Bottomley P A. Tissue sodium concentration in human brain tumors as measured with 23Na MR imaging. Radiology 2003; 227(2):529-537).

Exemplary Determinations of Intracellular Sodium Molar Fraction

Figure 11A:
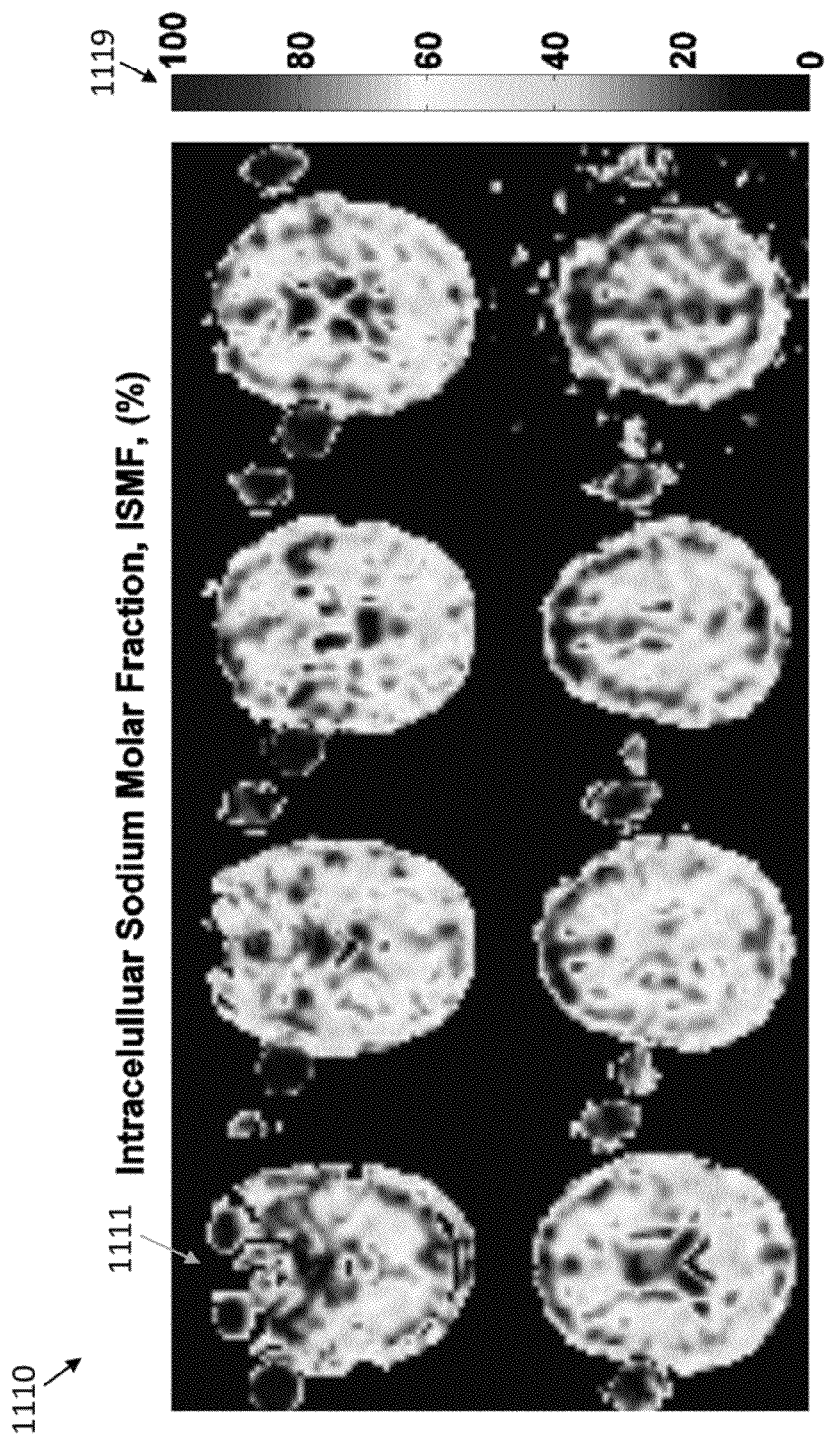
FIG. 11A is an exemplary illustration of exemplary quantitative ISMF maps from a relatively young subject, in accordance with certain exemplary embodiments of the present disclosure.
Figure 11B:
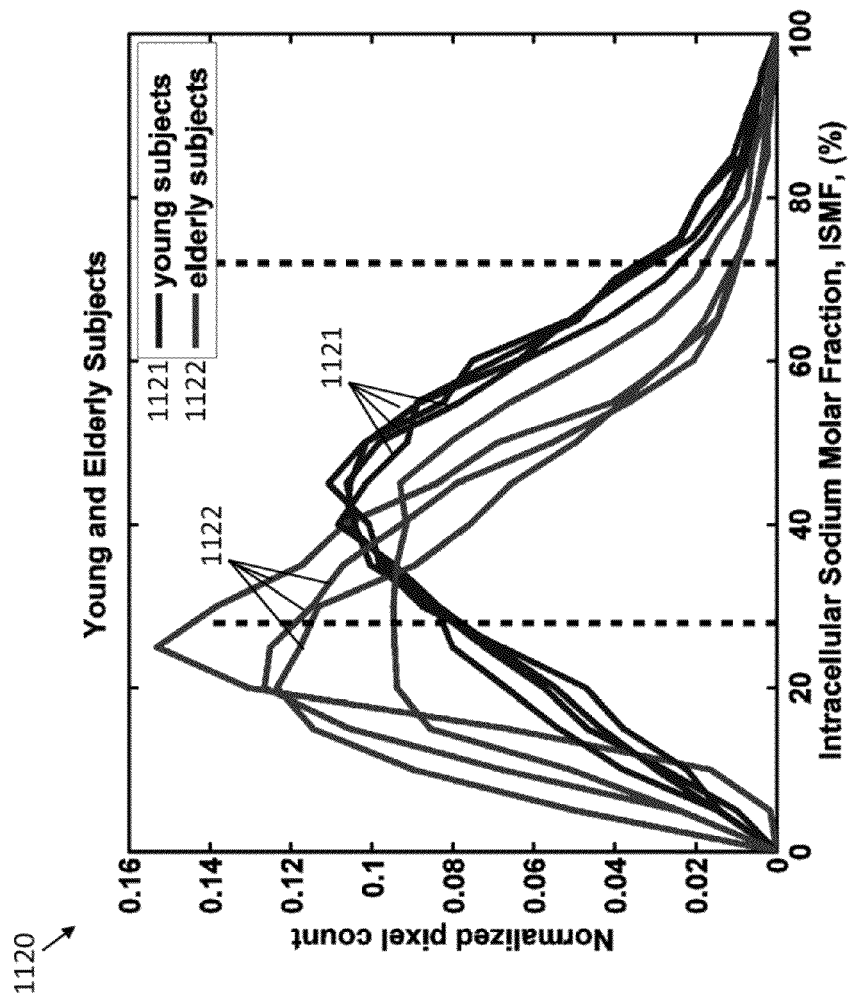
FIG. 11B are exemplary histograms of the ISMF in each of the eight subjects corresponding to the ISMF maps of FIG. 11A generated using a system, arrangement and/or computer-accessible medium in accordance with certain exemplary embodiments of the present disclosure.

FIG. 11A shows an exemplary illustration 1110 of selected contiguous axial slices of intracellular sodium molar fraction maps 1111 from a 27-year-old healthy subject generated using the system, arrangement, process and/or computer-accessible medium according to certain exemplary embodiments of the present disclosure. An image intensity scale 1119 is also provided. FIG. 11B shows an exemplary graph 1120 with whole-brain ISMF histograms 1121, 1122 from eight healthy subjects (4 elderly (mean age 65.0±1.8) and 4 young (mean age 27.5±1.3)). Areas with known fast isotropic motion of sodium ions (such as cerebral ventricles or vitreous body of the eyes) can show relatively low ISMF (in the order of below about 10%), whereas brain tissue, with sodium ions in an anisotropic environment can show ISMF values generally between about 25% and 75%. This can be considered to be in relatively good agreement with the theoretically predicted values of about 28% to 72% for the young human brain. Based on exemplary data, the mean ISMF value in the young human brain can be about 43% which can be in relatively good agreement with the anticipated value of about 35% to 55% (see, e.g., exemplary Table 1). The exemplary ISMF distributions from the various young subjects can be substantially similar to each other.

It can be well-known that healthy aging can be associated with brain tissue atrophy caused by death and shrinkage of brain cells. Therefore, the intracellular sodium molar fraction in brain tissue can decrease with age if the aging cells maintain ISC at a constant level. The exemplary data presented as exemplary histograms in FIG. 11B show a similar trend. The distributions of ISMF for the elderly subjects 1122 can be shifted towards lower values (e.g., to the left of graph 1120) compared to those of younger subjects 1121.

Regional assessment of ISMF can also be performed. Exemplary measurements and determinations were focused to the periventricular white matter, cerebellum and the splenium of corpus callosum. Based on the obtained data, the mean ISMF value in the white matter can be about 61.5±6% which can be in relatively good agreement with the anticipated value of 46% to 72%. (See, e.g., Table 1 and FIG. 10).

Figure 12A:
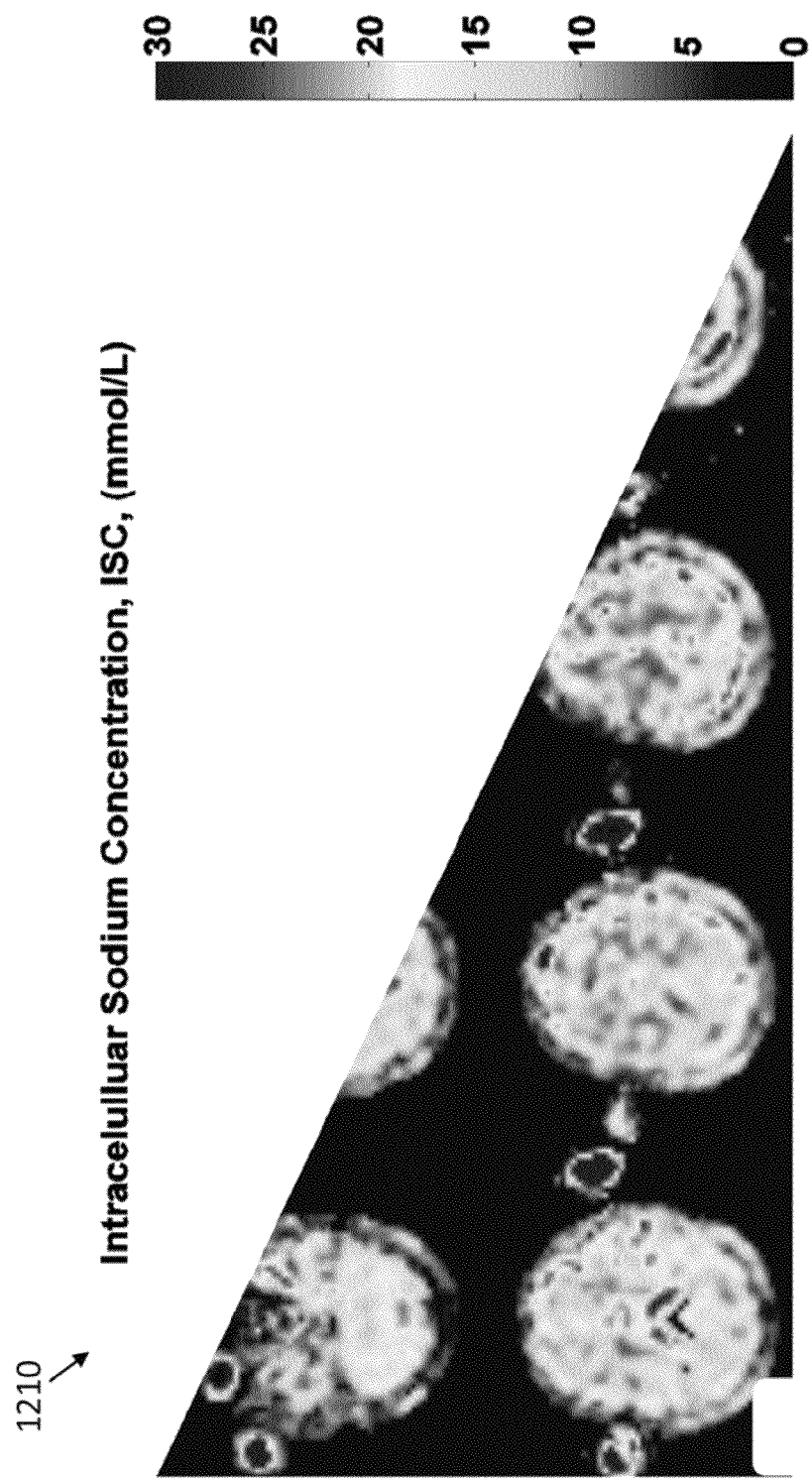
FIG. 12A is an exemplary ISC map derived from MRI measurements in a healthy relatively young subject, generated using a system, arrangement and/or computer-accessible medium in accordance with certain exemplary embodiments of the present disclosure.
Figure 12B:
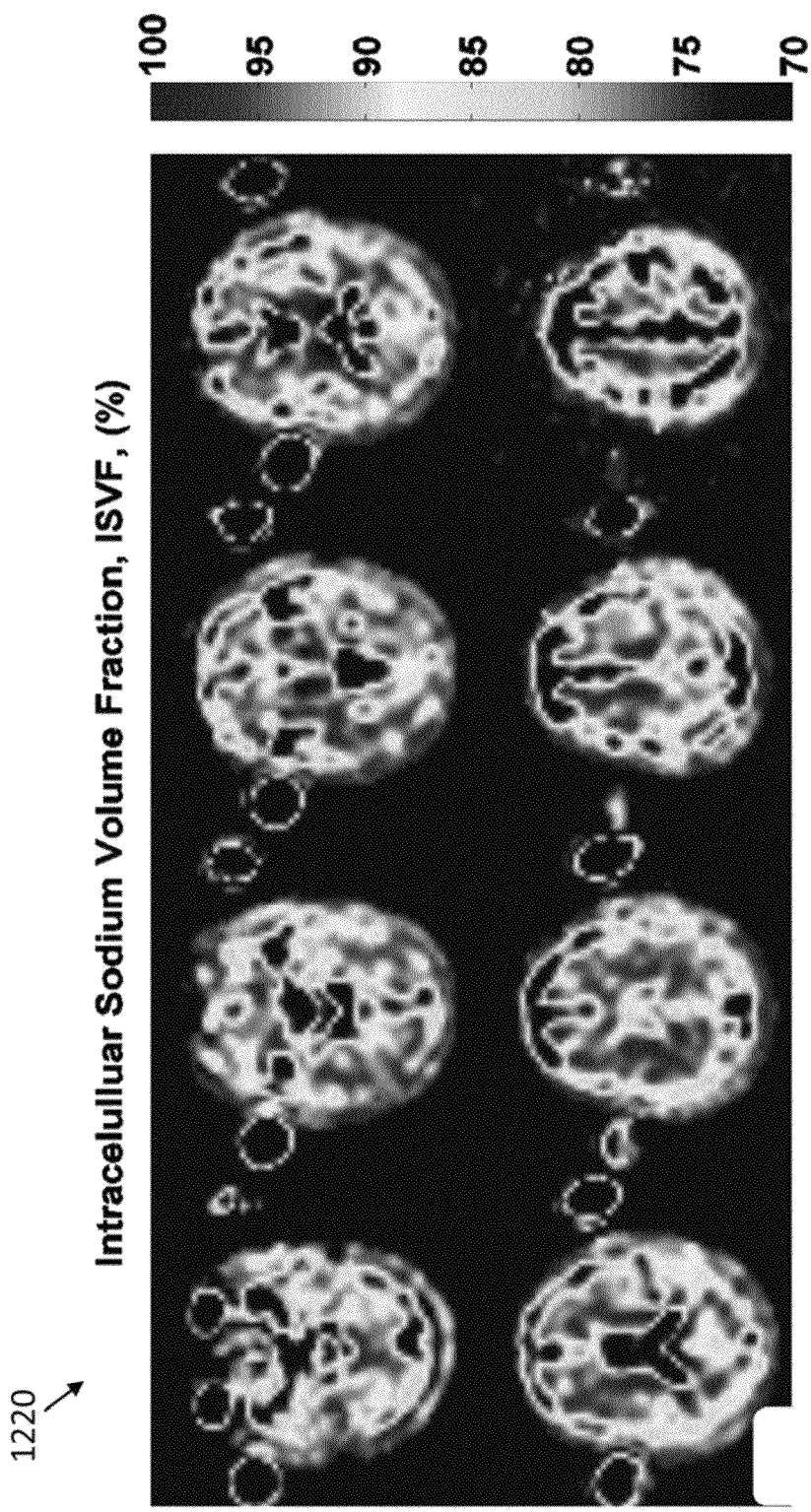
FIG. 12B is an exemplary ISVF map derived from MRI measurements in a healthy relatively young subject generated using a system, arrangement and/or computer-accessible medium in accordance with certain exemplary embodiments of the present disclosure.
Figure 12C:
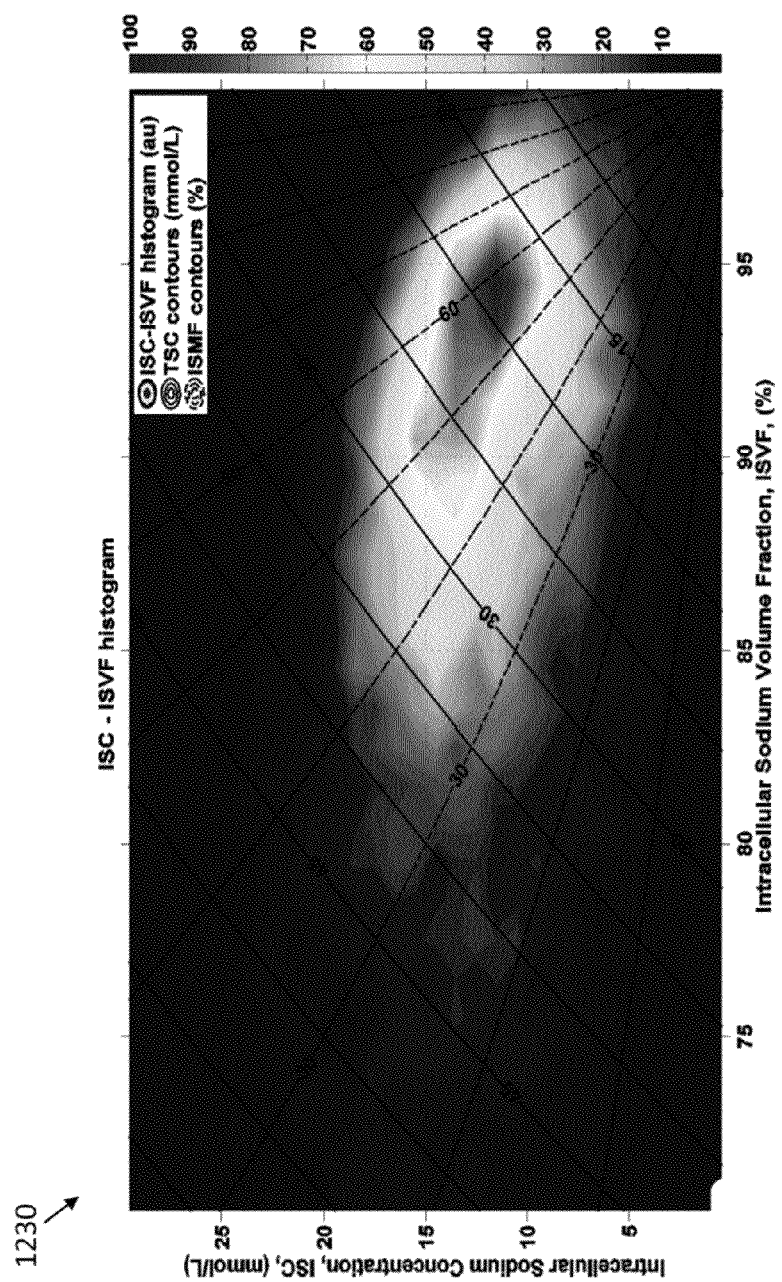
FIG. 12C is an exemplary ISC-ISVF histogram from the same subject of FIGS. 12A and 12B generated using a system, arrangement and/or computer-accessible medium in accordance with certain exemplary embodiments of the present disclosure.
Figure 12D:
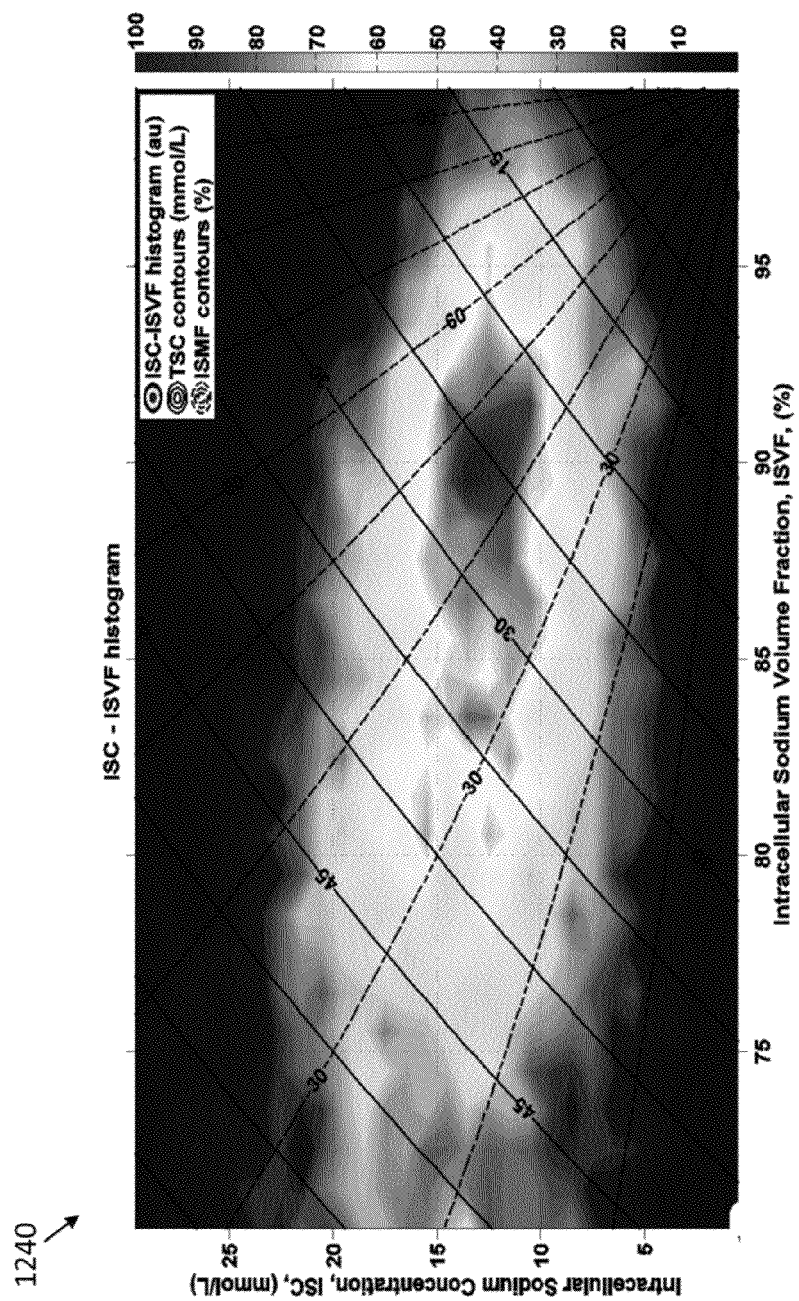
FIG. 12D is an exemplary ISC-ISVF histogram from a healthy relatively elderly subject generated using a system, arrangement and/or computer-accessible medium in accordance with certain exemplary embodiments of the present disclosure.

Exemplary Determinations of Intracellular Sodium Concentration and Intracellular Sodium Volume Fraction FIG. 12A shows an exemplary ISC map 1210 and FIG. 12B illustrates an exemplary ISVF map 1220 derived from MRI measurements in a healthy young subject. FIG. 12C is an exemplary ISC-ISVF histogram 1230 from the same subject generated using the system, arrangement, process and/or computer-accessible medium according to certain exemplary embodiments of the present disclosure. The ISC and ISVF values are within the expected range (see FIG. 2) for a healthy brain. For comparison, FIG. 12D is an exemplary illustration of an exemplary ISC-ISVF histogram 1240 from a healthy elderly subject. Comparing histograms 1230 and 1240, ICS can remain constant while ISVF can decrease consistently with an expected normal aging process.

As illustrated in FIGS. 12A and 12B, the intracellular sodium concentrations of GM and WM regions can be relatively uniform at about 13.0±3.9 mmol/L and ISVF can be about 94.8±5.4%. As shown from the corresponding exemplary histograms 1230, 1240, ISC and ISVF measured in-vivo can be within the expected range. The ISVF for the WM can be higher than for the GM consistent with results of heretofore known procedures which did not use noninvasive MR and the ISC remains within the expected range between of about 10-15 mmol/L. The ISC-ISVF histogram for an elderly subject are shown in FIG. 12. The ISC value can be 12.5±4.3 mmol/L, similar to that in the young brain, while the ISVF can be decreased (e.g., about 86.7±6.6%). This corresponds to a decrease in intracellular volume caused by normal aging while the intracellular concentration remains constant, although, as described herein, the exemplary MR procedure according to the present disclosure provides for noninvasive in vivo access to correct values, whereas the known procedures against which the exemplary results can be being compared can be based on invasive measures in animals or ex vivo human tissues.

Exemplary Discussion

A healthy human body is capable of regulating its inner environment in response to fluctuations in the outside environment. Disease development and progression can derange the cell and tissue homeostasis causing cellular death. This homeostasis can be disturbed by exogenous factors such as traumatic injury, exposure to extreme temperatures or radiation, deficiency of oxygen or basic nutrients, exposure to toxic compounds and viruses. The endogenous factors such as immunopathalogical reactions, neurological and genetic disorders can also damage the tissue homeostasis. In addition, cell damage occurs during normal aging, often resulting in tissue atrophy. The altered cellular activities of aging cells can lead to metaplasia, dysplasia, or neoplasia because such cells can be more susceptible to destruction of their DNA, RNA and vital proteins. Consequently, a plurality of tools has been developed to diagnose, monitor and restore the cellular homeostasis. Many of such procedures can be non-focal or invasive limiting their usefulness. Sodium magnetic resonance imaging can be a promising procedure capable of providing means to assess tissue viability non-invasively and focally by detecting changes in cell ion homeostasis.

Interest in sodium imaging has likely grown due to improved MR hardware. It is possible to perform routine sodium MR scans in clinical practice. However, most previous sodium imaging studies can be based on a single-quantum approach which provides a global measure of the tissue sodium content (i.e. TSC). While this measure can be sensitive to many changes in the cellular environment, the intracellular compartment contains the most useful information about tissue viability. Therefore, it can be of great interest to clinical and basic research communities to develop a non-invasive procedure capable of separating the signals from the intra- and extra-cellular compartments.

Using common assumptions of the intra- and extra-cellular brain-tissue compartmentalization with constant 140 mmol/L extracellular sodium concentration, It is possible to obtain a quantitative relationship between the clinically meaningful ISC and ISVF and the MRI-measurable TSC and ISMF values. This relationship can be used to predict TSC and ISMF values for different tissue types and diseases if ISC and ISVF can be known from other, often invasive, measures. For example, it is possible used this relationship to predict TSC and ISMF values for the healthy brain tissue. The results of these predictions (see, e.g., Table 1) can be consistent with previous reports. Then, combining TQF and SQ imaging, it is possible to perform in-vivo ISMF measurements in the human brain. The mean ISMF value for the white matter was 61.5±6% which can be consistent with a TSC value of about 20 mmol/L and can be in good agreement with theoretically calculated ISMF between about 46% and 72%. The agreement between independently measured TSC and ISMF values suggests that most of the TQF signal comes from the intracellular compartment.

As illustrated in, e.g., FIG. 10, exemplary TSC and ISMF quantifications can provide complementary information about the tissue sodium content. For example, in a pathological condition leading to cellular swelling and increase in ISC, ISMF can increase, while TSC can remain constant. On the other hand, increase in ISC accompanied by the cellular death can lead to an increase in TSC without any change in ISMF. In other words, since TSC and ISMF can be compound measures of ISC and ISVF, TSC and ISMF can be sensitive to changes in ISC and ISVF, but can be not specific to any particular one. Therefore, a combination of TSC and ISMF measurements can be useful to obtain ISC and ISVF values.

The quantitative nature of the developed procedure was validated with phantom procedures. To simulate the intracellular space, agar gel was used. The extracellular space was simulated by saline solution. The results show that relatively good agreement between the designed and the measured values for the ISC can be obtained. As indicated, there were no significant differences between ISVF values for the two agar phantoms used.

Both TSC and ISMF were acquired in a single session from several healthy subjects. Exemplary generated two-dimensional TSC-ISMF histograms are shown in FIGS. 12A and 12B. The data cluster between the 10-15 mmol/L ISC and 85-95% ISVF range. The ISVF value for the WM of about 93% can be consistent with a previously reported value of 95%. In addition, in vivo ISC and ISVF maps were produced. Comparison of ISVF between young and elderly subjects can indicate a decrease of the intracellular space consistent with a 0.1-0.2% decrease of brain volume per year previously reported in healthy subjects.

The absolute quantification of sodium MRI-derived metrics can require correction for several acquisition and tissue specific parameters. Key among these can be instrumental (such as $B_0$- and $B_1$-field inhomogeneities) and molecular environment factors (such as the longitudinal $T_1$ and transverse $T_2$ relaxation times). Because of relatively rapid sodium $T_1$ relaxation in vivo, (e.g., $T_1$<about 50 ms) the use of repetition times (TR) of ~450 ms led to negligible (<about 5%) quantification errors. $B_0$-inhomogeneity-insensitive TQF acquisition was used to minimize possible $B_0$-related errors, while $B_1$-inhomogeneities were corrected in post-processing with the help of the auxiliary $B_1$-maps as described in the Procedures section. Slow and fast $T_2$ decay rate components were measured using an exemplary $B_0$- and $B_1$-insensitive procedure and applied to the measured TQF and SQ data as described herein.

To improve SNR and shorten the acquisition time, it is possible to presume that the brain tissue can be characterized by a single pair of $T_s$ and $T_f$ values in the decay rate measurement. It is further possible estimate that potential small differences in relaxation properties between gray and white matter can lead to a small (e.g., less than about 10%) effect on sodium quantification because of the relatively short TE used.

Since noise can follow the Rice distribution in magnitude reconstructed MR images, a small overestimation in intracellular sodium molar fraction can be expected in areas of weak signal. Accordingly, it can be expected that areas with low ISMF (such as cerebral ventricles and vitreous body of the eyes) can show ISMF values in the order of about 10%. This bias might cause a slight elevation in the ISVF value associated with a dramatic increase in the ISC. This effect can be clearly seen in CSF, cerebral ventricles and the vitreous body of the eyes, as illustrated in FIGS. 12A and 12B, for example. Because the phantom scans can have a considerably higher SNR, this effect can be significantly reduced in the phantom experiment. Improvements in coil technology and data acquisition strategies can be expected aid in the removal of this bias.

Throughout the present disclosure, it can have been presumed that the TQF signal can come from the intracellular space only. If there was a significant contribution to the TQF signal from the extracellular space, it would have caused a bias in ISMF and an overestimation of the ISC and ISVF values. However, the values obtained for ISC and ISVF were within the expected range, indicating that possible contribution to TQF signal from the extracellular compartment can remain relatively small.

According to an exemplary embodiment of the present disclosure, it is possible to analyze the relationship between the intracellular sodium concentration (ISC) and the intracellular sodium volume fraction (ISVF) with the MRI-accessible bulk tissue sodium concentration (TSC) and the intracellular sodium molar fraction (ISMF). It is possible to utilize single- and triple-quantum filtered sodium imaging procedures to obtain ISMF, ISC and ISVF maps in-vivo in healthy subjects at 7 T. ISC and ISVF values measured with the described procedure can be in a good agreement with the previous invasive and/or ex-vivo studies, indicating potential importance of the developed procedure for clinical and research applications. The exemplary procedure can allow quantitative mapping of the ISMF, ISVF and ISC in-vivo and can be used in the future to study the function of healthy and diseased organs, to monitor disease progression and to guide treatment.

Exemplary Procedures

Exemplary Intracellular/Extracellular Sodium Separation Using MRI

Sodium NMR signals from the intracellular and extracellular compartments are isochromatic and cannot be discriminated based on their natural chemical shift. An introduction of membrane-impermeable frequency shift reagents may facilitate the monitoring of important trans-membrane sodium concentration gradients. Such shift agents do not cross cell membranes and therefore create a detectible frequency offset for the sodium nuclei in the extracellular space. The intracellular and extracellular compartments can then be distinguished by the means of magnetic resonance spectroscopy or spectroscopic imaging. Unfortunately, the shift reagent does not always enter all of the extracellular space causing the unshifted signal to contain some contribution from the extracellular compartment. This can lead to an overestimation of ISMF. The problem is particularly acute in brain tissue where the reagent is not able to cross the blood-brain-barrier. Furthermore, despite their useful properties, currently available shift reagents are toxic, and likely cannot be administered to humans.

Because sodium ions in the extra-cellular space have a higher mobility than those in the intra-cellular space, diffusion based procedures can be used to separate signals form the two compartments. However, the fast signal decay rates of sodium coupled with the low sodium gyromagnetic ratio preclude the effective use of this procedure in clinical practice. Nonetheless, the presence of restricted motion and ordered structures in tissue has other important consequences for the properties of the sodium NMR signal. In solutions, fast isotropic motion of the sodium ions averages out the dipolar and quadrupolar interactions producing a mono-exponential NMR signal decay.

In an anisotropic environment, non-zero residual dipolar and quadrupolar interactions can lead to the creation of higher-order coherences and a bi-exponential NMR signal decay. As a result, intracellular and extracellular compartments can be differentiated with triple-quantum filtered (TQF) sodium imaging. This procedure uses coherence transfer to isolate MR signals due to sodium nuclei with correlation times longer than the Larmor period in-vivo. NMR compartments, defined as regions of tissue where nuclei have different NMR properties, generally do not coincide with compartments in the physiological sense. For example, signal from extracellular sodium in locally ordered tissues such as cartilage, muscles, and connective tissue may be similar to that of the intracellular sodium. However, because most of the sodium TQF signal from brain tissue is of intracellular origin, the brain TQF signal may be interpreted as due to the intracellular compartment only. Compared to shift reagents and diffusion-based procedures, TQF imaging is both sensitive and non-invasive, placing this procedure in a favorable position for clinical applications.

Several other technical and practical issues can be considered in order to implement such procedure. For example, the TSC in brain tissue is generally significantly smaller than the tissue water-hydrogen concentration. In addition, the gyromagnetic ratio for sodium is about 3.8 times smaller than that of hydrogen, leading to a further reduction of sodium NMR signal. Combining these two factors, sodium NMR signal can be about 10000 times weaker than the water-hydrogen signal. Therefore, to achieve a reasonable SNR in clinically acceptable acquisition times, high and ultra-high magnetic field scanners and large voxel sizes are required for sodium measurements. This requirement, however, is coupled with further difficulties of stringent specific-absorption-rate (SAR) limitations and increased magnetic field inhomogeneities at high field strengths. This also applies to TQF imaging which is highly susceptible to $B_1$ and $B_0$ inhomogeneities, and employs high radio-frequency power. However, recent developments in high efficiency $B_0$ inhomogeneity-insensitive TQ filtering schemes have made high-field in-vivo TQF applications feasible. To obtain quantitative information about the intracellular sodium content, corrections for $B_1$-inhomogeneities, $T_1$ relaxations, and $T_2$ decays must be applied.

Exemplary Two Compartment Tissue Model

If the extracellular sodium concentration ($\rho_{ex}$) is known, it is possible to obtain the values of intracellular sodium concentration (ISC) ($\rho_{in}$ and intracellular sodium volume fraction (ISVF) ($\eta_{in}$) given the bulk tissue sodium concentration (TSC) ($\rho_T$) and the intracellular sodium molar fraction (ISMF) ($\chi$). First, it is possible consider the bulk tissue sodium concentration:

$$\rho_T = \frac{M_{in} + M_{ex}}{V_{in} + V_{ex}} \qquad (40)$$
$$= \frac{\rho_{in} V_{in} + \rho_{ex} V_{ex}}{V_{in} + V_{ex}}$$
$$= \rho_{ex} - (\rho_{ex} - \rho_{in}) \frac{V_{in}}{V_{in} + V_{ex}} \Rightarrow$$
$$\eta_{in} = \frac{V_{in}}{V_{in} + V_{ex}}$$
$$= \frac{\rho_{ex} - \rho_T}{\rho_{ex} - \rho_{in}}$$

where $M_{in}$ and $M_{ex}$ are the intra- and extra-cellular sodium contents (in moles) occupying volume $V_{in}$ and $V_{ex}$ respectively. Here, it is possible have assumed that the tissue can be described by the two compartments only. Second, it is possible consider the intracellular sodium concentration $\rho_{in}$:

$$\rho_{in} = \frac{M_{in}}{V_{in}} \qquad (41)$$
$$= \frac{M_{in}}{M_{in} + M_{ex}} \cdot \frac{M_{in} + M_{ex}}{V_{in} + V_{ex}} \cdot \frac{V_{in} + V_{ex}}{V_{in}}$$
$$= \chi \cdot \rho_T \cdot \frac{1}{\eta_{in}}$$

where the intracellular sodium molar fraction $\chi$ is:

$$\chi = \frac{M_{in}}{M_{in} + M_{ex}} \qquad (42)$$

Combining exemplary Equations (40) and (41), it is possible obtain the intracellular sodium concentration $\rho_{in}$ and the intracellular sodium volume fraction $\eta_{in}$ terms of MRI-assessable tissue sodium concentration $\rho_T$ and the intracellular sodium molar fraction $\chi$:

$$\begin{cases} \rho_{in} = \frac{\chi \rho_T \rho_{ex}}{\rho_{ex} - (1-\chi) \rho_T} \\ \eta_{in} = 1 - (1-\chi) \frac{\rho_T}{\rho_{ex}} \end{cases} \qquad (43)$$

It is possible to presume that $\rho_{ex}$=140 mmol/L in well-perfused tissue and $\rho_T$ can be obtained using TSC-mapping. The intracellular sodium molar fraction $\chi$ can be measured from SQ and TQF imaging. Indeed, the image intensities recorded using SQ and TQF sequences are related to the intra- and extra-cellular sodium voxel contents as:

$$S_{SQ} = C \frac{M_{in}}{5} \left( 3 e^{-TE/T_{f,in}} + 2 e^{-TE/T_{s,in}} \right) \sin\alpha + C M_{ex} e^{-TE/T_{s,ex}} \sin\alpha \qquad (44)$$

$$S_{TQF} = C \frac{9 M_{in}}{40} \left( e^{-\tau_1/T_{f,in}} - e^{-\tau_1/T_{s,in}} \right) \left( e^{-TE/T_{f,in}} - e^{-TE/T_{s,in}} \right) \sin^5\alpha \qquad (45)$$

where $T_{s,ex}$, $T_{s,in}$ and $T_{f,in}$ are the slow and fast decay constants for extra- and intra-cellular components, $\tau_1$ and TE are the acquisition parameters. The proportionality constant C denotes the coil sensitivity and $\alpha$ is the flip angle.

Thus, exemplary Equations (44) and (45) can be solved to extract the intracellular sodium molar fraction $\chi$ (see exemplary Equation (42)) from the measured SQ and TQF signals facilitating quantitative measurements of intracellular sodium concentration and intracellular sodium volume fraction (see exemplary Equation (43)).

Figure 13A:
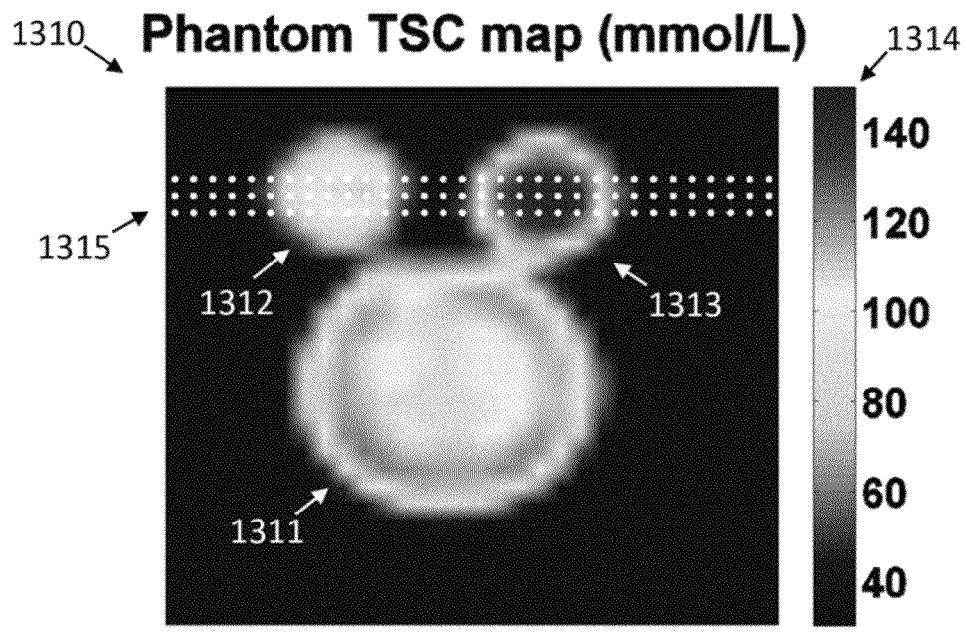
FIG. 13A is an illustration of an exemplary TSC map of a slice from a phantom setup in accordance with certain exemplary embodiments of the presented disclosure.
Figure 13B:
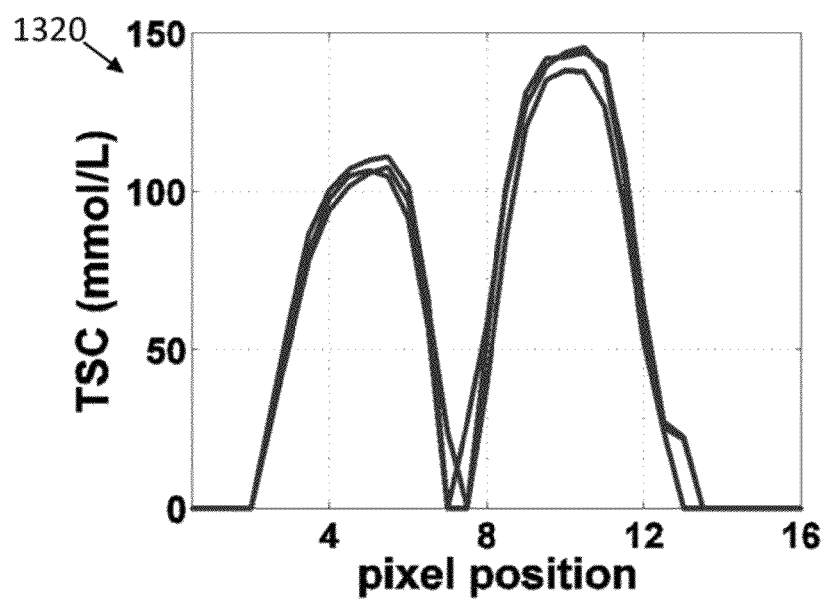
FIG. 13B is an illustration of an exemplary one-dimensional profile corresponding to the map of FIG. 13A generated using a system, arrangement and/or computer-accessible medium in accordance with certain exemplary embodiments of the present disclosure.

FIGS. 13A, 13C, 13E show exemplary illustrations of TSC, ISC and ISVF maps 1310, 1330, 1350, respectively, from the exemplary phantom in accordance with certain exemplary embodiments of the presented disclosure. The dotted lines 1315, 1335, 1355 in the TSC, ISC, and ISVF maps 1310, 1330, 1350 illustrate the location of the corresponding 1D profiles 1320, 1340, 1360 shown in FIGS. 13B, 13D and 13F, respectively. As expected, the measured TSC (137±7 and 103±6 mmol/L) and ISC (136±8 and 100±7 mmol/L) values are close to the design values of 140±1 and 100±1 mmol/L, respectively. ISVF values in the two gel phantoms, which are expected to be identical due to the phantom preparation process, were 91±3% and 94±4%. It is possible that the phantom manufacturing process led to the phantom's "intracellular" concentration being about equal to TSC. The measured ISCs in the phantom can be 136±8 mmol/L and 100±7 mmol/L while the measured TSC values are 137±7 mmol/L and 103±6 mmol/L which is in good agreement with the design values. It is expected that ISVF values in the two gel phantoms are equal, and they were found to be 91±3% and 94±4%.

Figure 14C:
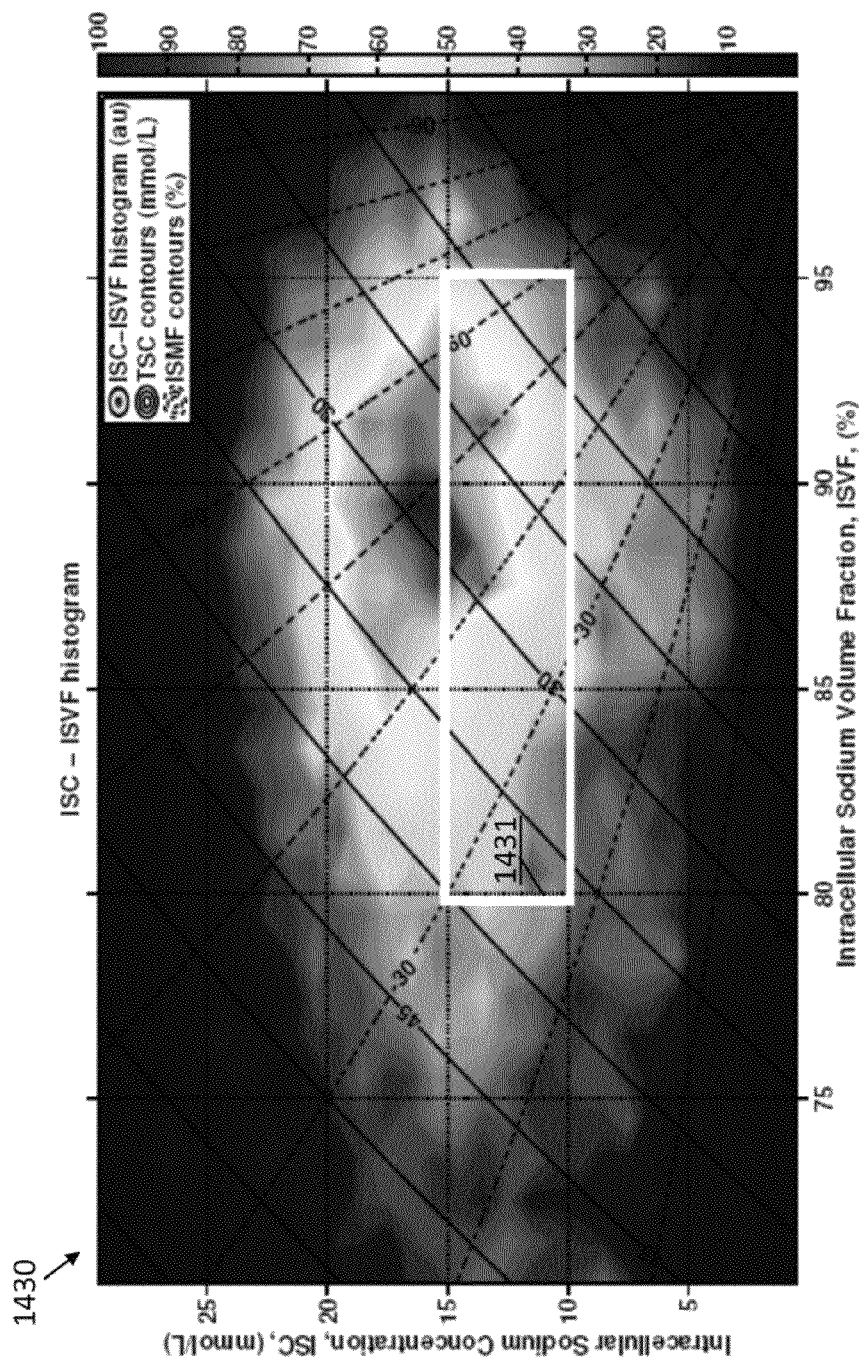
FIG. 14C is an exemplary ISC-ISVF histogram from the same ill person of FIGS. 14A and 14B, generated using a system, arrangement and/or computer-accessible medium in accordance with certain exemplary embodiments of the present disclosure.
Figure 14D:
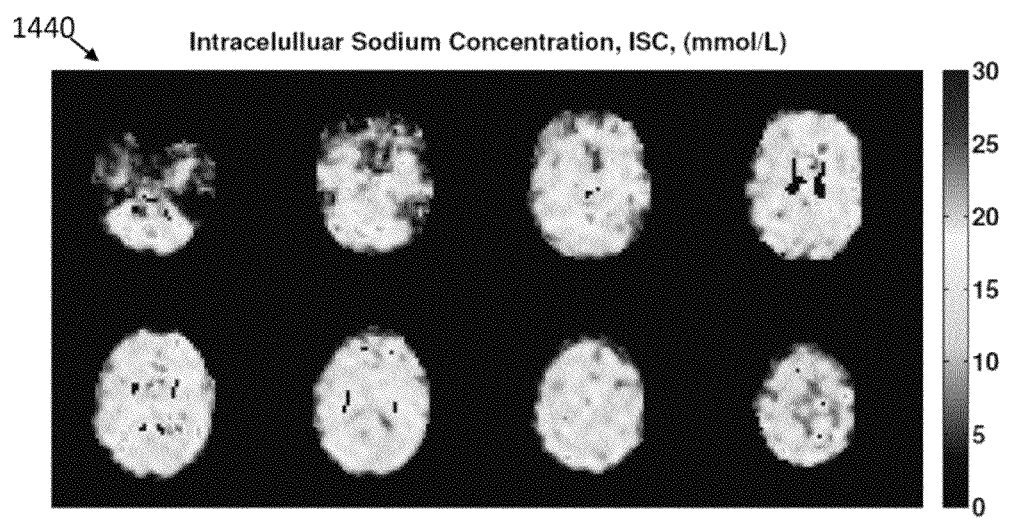
FIG. 14D is an exemplary ISC map derived from MRI measurements from a relatively healthy person, generated using a system, arrangement and/or computer-accessible medium in accordance with certain exemplary embodiments of the present disclosure.
Figure 14E:
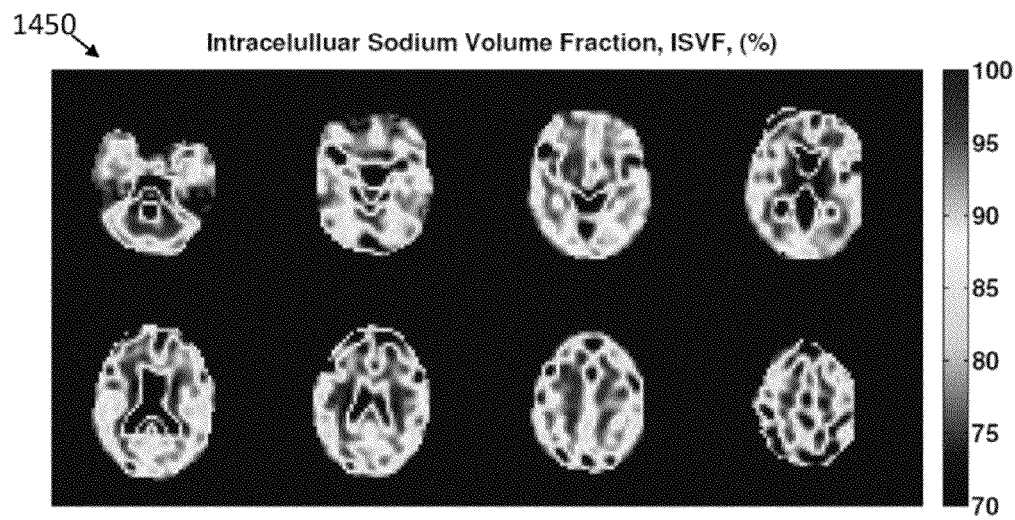
FIG. 14E is an exemplary ISVF map derived from MRI measurements from a relatively healthy person, generated using a system, arrangement and/or computer-accessible medium in accordance with certain exemplary embodiments of the present disclosure.
Figure 14F:
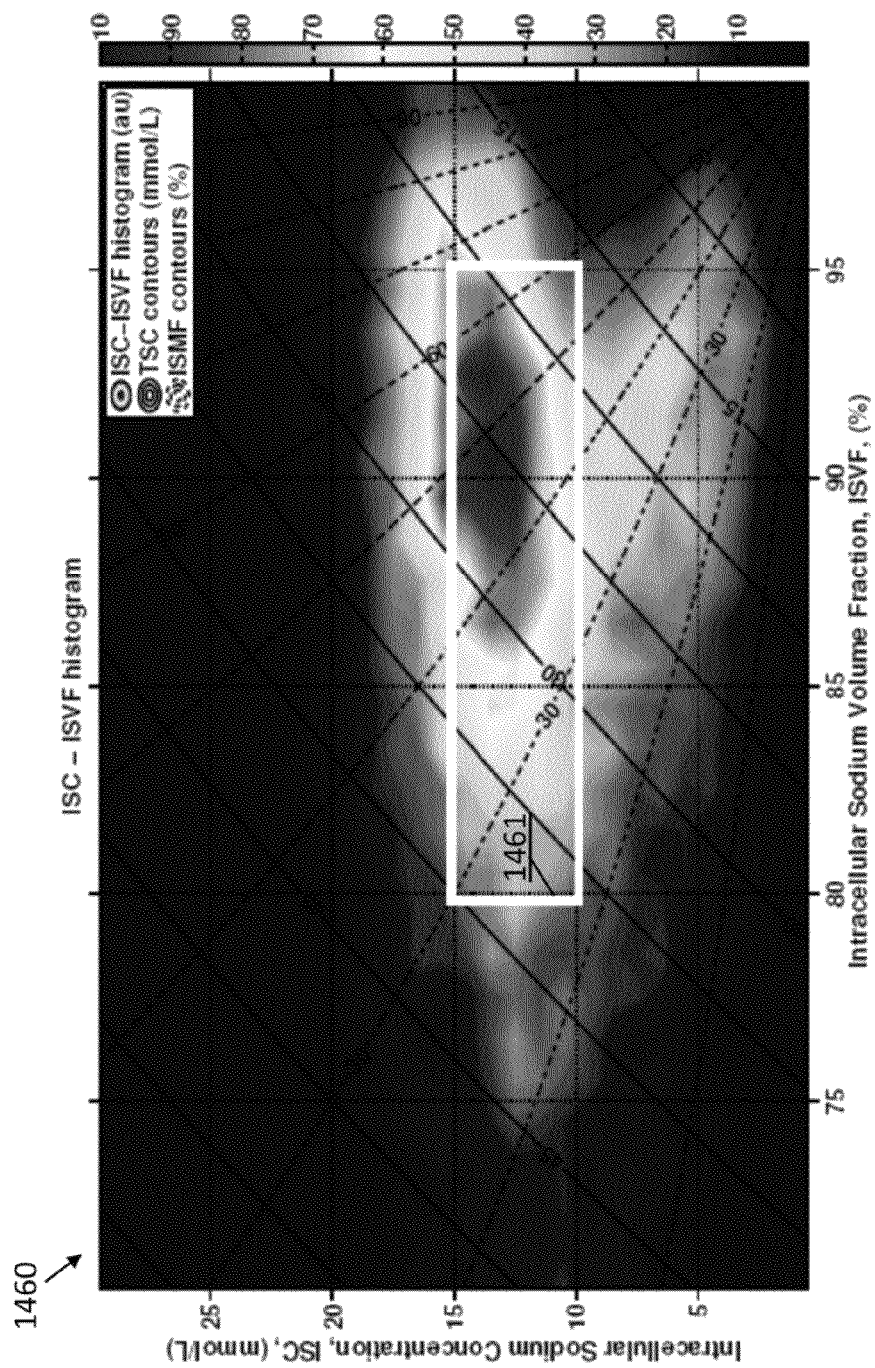
FIG. 14F is an exemplary ISC-ISVF histogram from the same relatively healthy person of FIGS. 14D and 14E, generated using a system, arrangement and/or computer-accessible medium in accordance with certain exemplary embodiments of the present disclosure.

FIGS. 14A and 14B show exemplary illustrations of an ISC map 1410 and an ISVF map 1420 for a ill person, respectively. FIGS. 14D and 14E show exemplary illustrations of an ISC map 1440 and an ISVF map 1450 for a relatively healthy person, respectively. FIGS. 14C and 14F show exemplary illustrations of ISC-ISCF histograms 1430 and 1460 associated with the sick person and healthy person, respectively. As illustrated in FIG. 14C, the ISC values for the sick person are higher than the expected range indicated by rectangle 1431. In comparison, as illustrated in FIG. 14F, the ISC values for the relatively healthy person are primarily located within the expected range indicated by rectangle 1461. Further, as illustrated in FIG. 14F, for example, the distribution of ISMF for the relatively healthy person is primarily located towards the right section of the rectangle, indicating that the person is relatively young. As the person ages, the distribution of ISMF for the relatively healthy person can be expected to shift towards lower values (e.g., to the left of rectangle 1461) upon remaining relatively healthy, as opposed to the distribution shifting vertically upwards, which would indicate that the person has become ill (e.g., as illustrated in FIG. 14C).

Exemplary MRI Acquisition and Experiments

Eight healthy volunteers (4 elderly (mean age 65.0±1.8) and 4 young (mean age 27.5±1.3)) were enrolled in this study. Approval for this study was obtained from the Institutional Review Board of New York University Langone Medical Center and written informed consent was obtained from all subjects.

Figure 15:
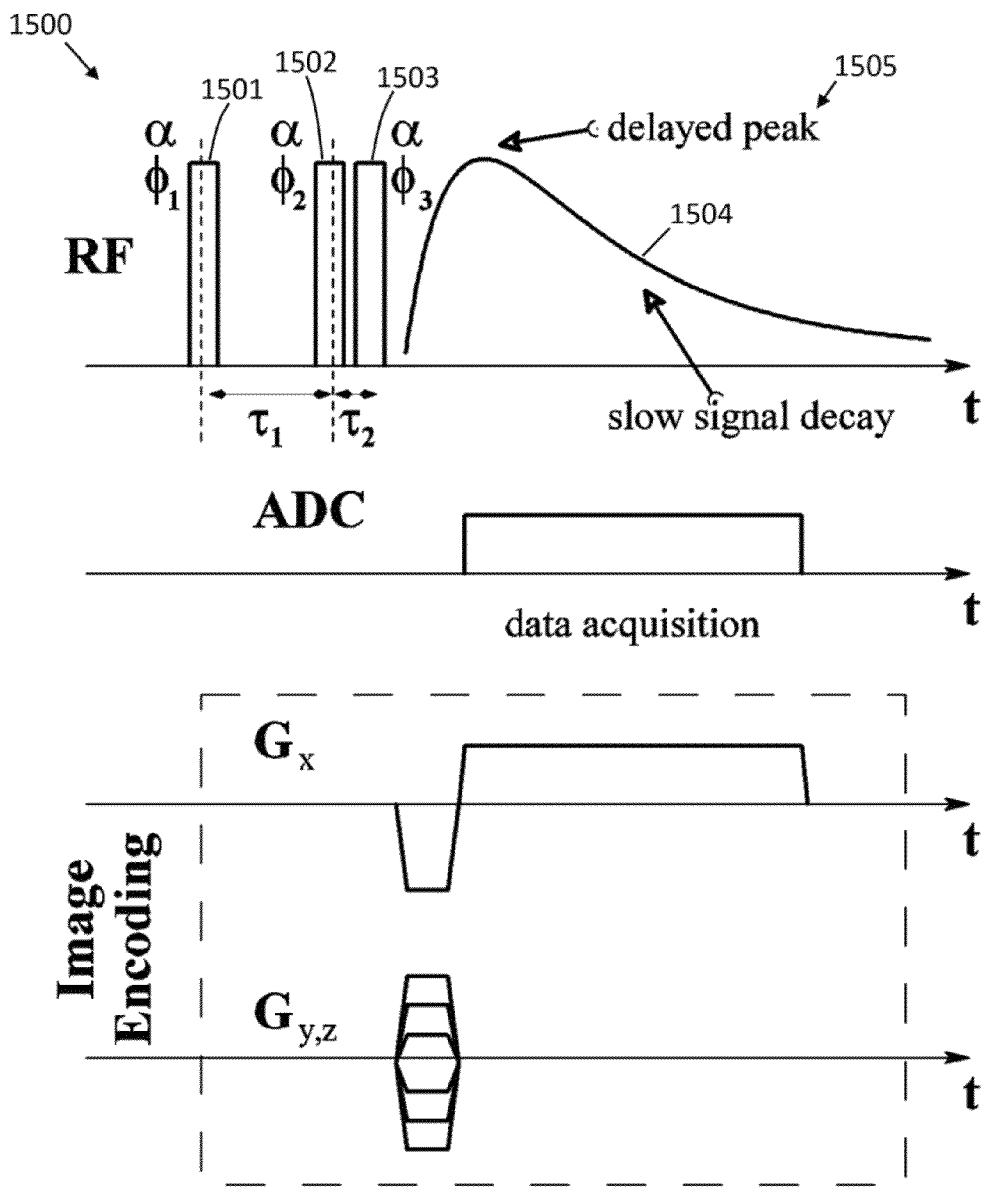
FIG. 15 is an exemplary schematic diagram of the triple-quantum-filter (TQF) imaging sequence, including TQF excitation block super-posed with TQF signal evolution and imaging readout generated using a system, arrangement and/or computer-accessible medium in accordance with certain exemplary embodiments of the present disclosure.

Exemplary procedures were performed using an exemplary system comprising a 7 T whole-body MAGNETOM scanner (Siemens Healthcare, Erlangen, Germany) with a custom-built dual-tuned TX/RX $^1$H/$^{23}$Na head coil and a modified 3D GRE sequence. FIG. 15 is an exemplary illustration of a schematic diagram of the triple-quantum-filter (TQF) imaging sequence 1500 with three pulses 1501, 1502, 1053, including an exemplary TQF excitation block superposed with TQF signal evolution and imaging readout. Due to delayed peak 1505 formation and slow signal decay 1504, Cartesian (GRE) readout can be well suited for sodium TQF imaging. For the decay-rate measurements the image encoding block was not executed during the acquisition. For further details about the TQF acquisition used in this work and its $B_0$ and $B_1$ stability.

To minimize head motion, foam pads were inserted into the space between the subject's head and the interior of the coil. A vendor-provided semi-automated shimming procedure was performed iteratively 5 to 10 times until it converged and yielded whole-head water line-width of 45±4 Hz full width at half maximum (FWHM). Acquisition parameters for the exemplary 12-step $B_0$-corrected TQF imaging sequence were 240×240×240 mm$^3$ FOV with 30×30×24 encoding matrix; TR=150 ms, TE=6.8 ms, FA=90° and $\tau_1$=6.8 ms $\tau_2$=150 μs. The RF excitation train was comprised of three non-selective pulses of 900 μs duration each. The SQ sodium imaging was performed with the same imaging parameters as the TQF one. This ensures common (if any) distortions in the two images and simplifies data processing. For $B_0$-correction, $B_0$-maps were computed from the phase difference between the two SQ images acquired with TE=6.8 and TE=8.8 ms, TR=150 ms. $B_1$-maps were computed from the ratio of two additional SQ images acquired with FA=60° and 120°, TR=150 ms using the double-flip angle procedure. Using the $B_1$-maps, $B_1$-correction was applied to SQ and TQF images according to exemplary Equations (44) and (45). Due to long TRs compared to sodium longitudinal relaxation rates, $T_1$-weighting leads to negligible (<about 5%) quantification errors and, therefore, was ignored. For the purposes of quantification, two reference tubes with known sodium concentrations (approximately 50 mmol/L and approximately 100 mmol/L) were introduced into the field of view of the SQ imaging.

Knowledge of the relaxation rates can be needed not only for determination of the optimal $\tau_1$ and TE values for TQF imaging itself, but also to obtain ISMF value, as described herein above, for example. While relaxation rates for various tissue types are available in the literature, no such values are reported for human brain tissue at 7 T. The transverse relaxation constants $T_s$ and $T_f$ were measured from the whole head using a TQF procedure. The procedure relies on the free induction decay (FID) data acquired with variable delay constants $\tau_1$ and by processing the data at TE=$\tau_1$ (see, e.g., FIG. 15). An advantage of this procedure can be that it can provide a high SNR by collecting data from the whole head and is insensitive to $B_1$ and $B_0$ magnetic field inhomogeneities. Therefore, an FID sequence with a TQF cycle was used. The creation time $\tau_1$ was varied in 1 ms increments between 1 ms and 50 ms, TR=250 ms, sampling interval was 200 μs, and 512 complex samples were acquired with 10 averages. Total acquisition time was less than 30 min. These data were acquired in a separate session.

To test data acquisition and quantification procedures, separate measurements were conducted on agar-gel phantoms. Two phantoms were manufactured with 4% agar concentration and 100±1 mmol/L and 140±1 mmol/L sodium concentrations. In addition, a phantom with 86 mmol/L sodium water solution was used. The imaging matrix for the phantom scans was 16×16×16 with all other data acquisition parameters and processing steps the same as above.

Exemplary Image Processing

From exemplary Equations (44) and (45), the intracellular sodium molar fraction was computed based on the measured relaxation constants and the TQF and SQ images according to the expression:

$$\chi = \frac{5e^{-TE/T_{s,ex}} S_{TQF}}{\left(5e^{-TE/T_{s,ex}} - 3e^{-TE/T_{f,in}} - 2e^{-TE/T_{s,in}}\right) S_{TQF} + \frac{9 S_{SQ}}{8}\left(e^{-\tau_1/T_{f,in}} - e^{-\tau_1/T_{s,in}}\right)\left(e^{-TE/T_{f,in}} - e^{-TE/T_{s,in}}\right)\sin^4\alpha} \quad (46)$$

From exemplary Equation (44), TSC concentration in the brain tissue was computed by combining the measured relaxation rates, SQ and the intracellular sodium molar fraction images for the brain tissue and for the reference tubes according to:

$$\rho_T = \frac{S_{SQ}}{S_{SQ,ref}} \frac{\left[\left(3e^{-TE/T_{f,in}} + 2e^{-TE/T_{s,in}}\right)\chi + 5e^{-TE/T_{s,ex}}(1-\chi)\right]_{ref}|C_{ref}|\sin\alpha_{ref}}{\left[\left(3e^{-TE/T_{f,in}} + 2e^{-TE/T_{s,in}}\right)\chi + 5e^{-TE/T_{s,ex}}(1-\chi)\right]|C|\sin\alpha} \rho_{T,ref} \quad (47)$$

According to certain exemplary embodiments of the present disclosure, the reciprocity principle can be used to calculate $|C_{ref}/C|$ based on the $B_1$-maps, for example.

While certain aspects of the exemplary embodiments according to the present disclosure described herein can be used with a sodium quantum system of an anatomical structure, one having ordinary skill in the art should appreciate in view of the teachings provided herein that such exemplary procedures, computer-accessible medium and/or systems can be adapted, configured and/or structured to be used with other anatomical quantum systems and/or molecular nuclei in accordance with the present disclosure. For example, any quantum system based on an odd number molecular nuclei (e.g., odd number of protons and/or neutrons) and capable of generating higher-order quantum coherences can be preferable for facilitating particle spin during an imaging procedure.

Exemplary System, Apparatus and/or Arrangement

Figure 16:
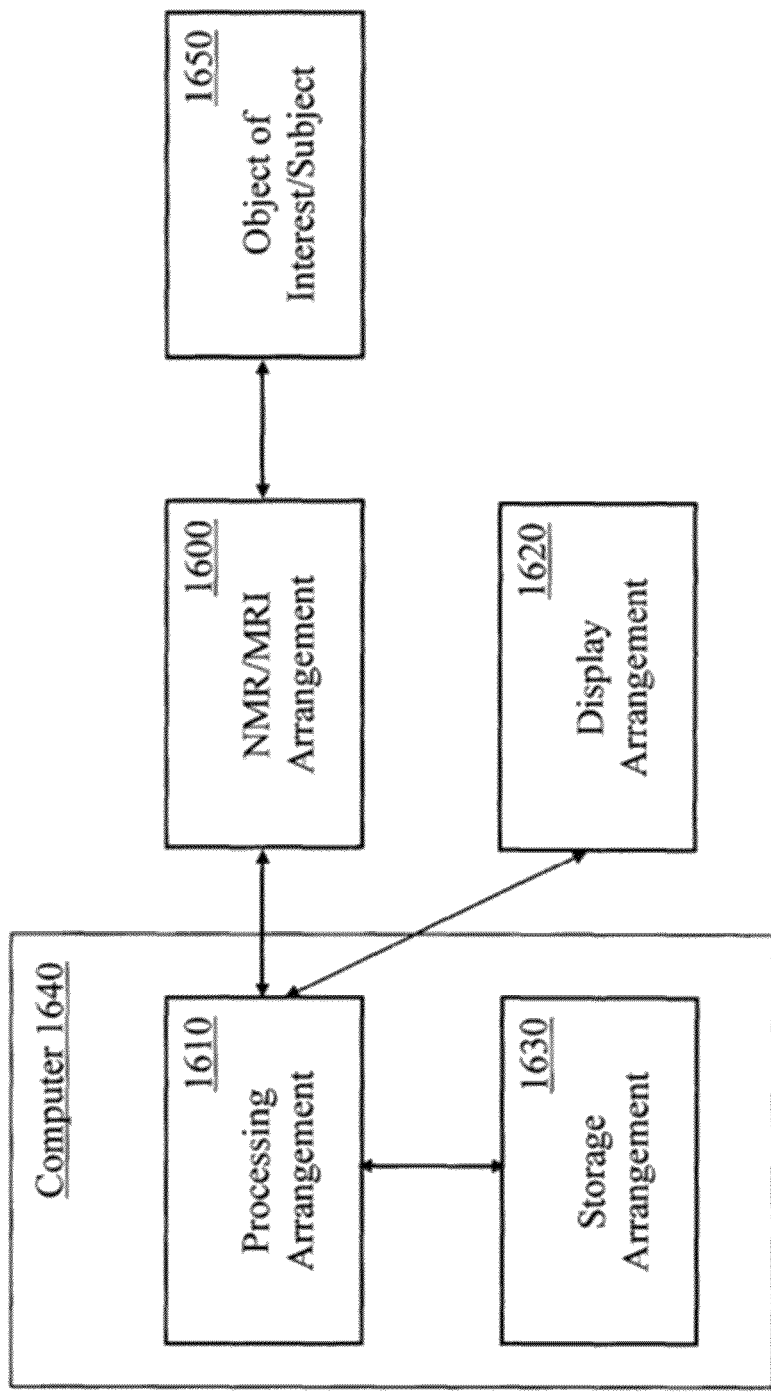
FIG. 16 is an illustration of an exemplary block diagram of an exemplary system in accordance with certain exemplary embodiments of the present disclosure.

In addition, a description of an exemplary embodiment of system, apparatus, computer-accessible medium and/or arrangement according to the present disclosure as they can be related to FIG. 16 is provided. In particular, FIG. 16 illustrates a schematic block diagram of an exemplary embodiment of system, apparatus and/or arrangement according to the present disclosure. For example, a Nuclear Magnetic Resonance (NMR) or Magnetic Resonance Imaging (MRI) arrangement 1600 can be controlled by a processing arrangement 1610, and can be connected to a display arrangement 1620 and a storage arrangement 1630 (or other computer accessible medium). A computer 1640 (which can preferably be a physical hardware device and/or a series of such devices) can incorporate and/or be coupled to the processing arrangement 1610, and can optionally further incorporate or be coupled to the storage arrangement 1630 and/or the display arrangement 1620. The processing arrangement 1610 can preferably be a physical device which can include hardware, which can be or include one or more processors, for example. The processing arrangement 1610 can control the NMR/MRI arrangement 1600 to acquire signals, which can be then processed by the processing or computing hardware arrangement 1610 and utilize the procedures, procedures and/or processes according to exemplary embodiments of the present disclosure.

In a further exemplary embodiment of the present disclosure, the processing arrangement 1610 can be used to generate an image relating to MQF, which can then be displayed on output display 1620. In further embodiment, the processing arrangement 1610 can retrieve instructions from storage arrangement 1630 and execute such instructions to cause the processing/computing arrangement 1610 utilize the procedures, procedures and/or processes according to exemplary embodiments of the present disclosure. The exemplary processing/computing arrangement 1610 can also store data and results of the present invention in the storage arrangement 1630. An object of interest 1650, often a live subject such as a human, can be placed in an operative positive relative to the NMR or MRI arrangement 1600 to acquire data from. The NMR/MRI arrangement 1600, the processing/computing arrangement 1610, the storage arrangement 1630 and the display arrangement 1640 can each be separate or can be combined/integrated in any combination.

The storage hardware arrangement 1630 (or other computer accessible medium) can include, but certainly not limited to hard drive, floppy disk, memory stick, CD-ROM, RAM, ROM, multiples thereof and/or combination thereof.

Figure 17:
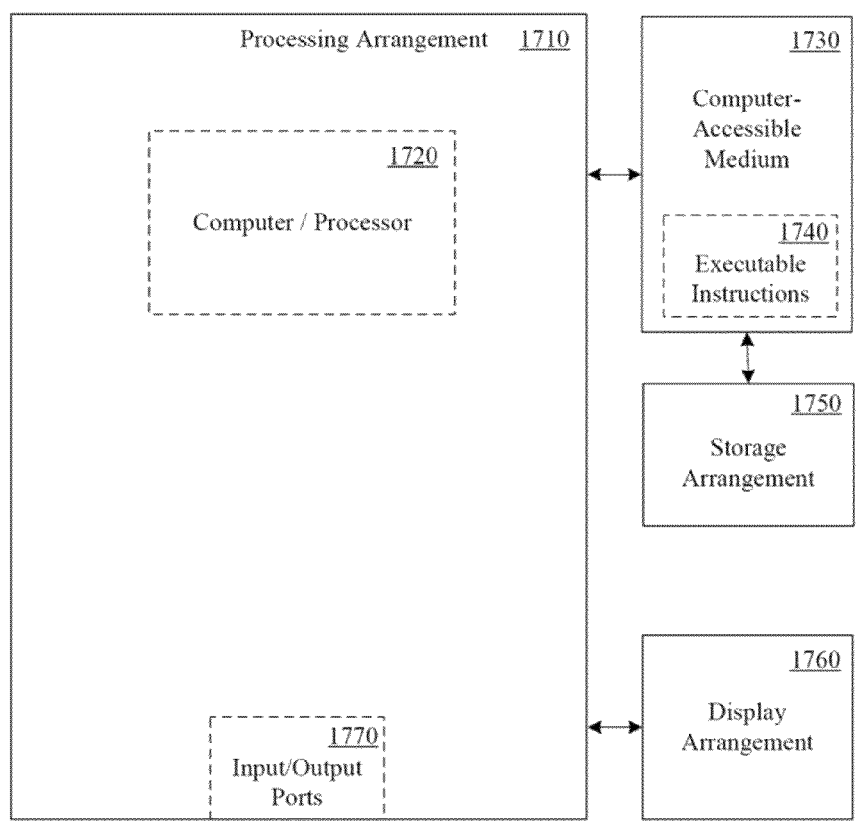
FIG. 17 is an illustration of another exemplary block diagram of an exemplary system, in accordance with certain exemplary embodiments of the present disclosure.

FIG. 17 shows an exemplary block diagram of an exemplary embodiment of a system according to the present disclosure. For example, an exemplary procedure in accordance with the present disclosure can be performed by a processing arrangement and/or a computing arrangement 1710. Such processing/computing arrangement 1710 can be, e.g., entirely or a part of, or include, but not limited to, a computer/processor 1720 that can include, e.g., one or more microprocessors, and use instructions stored on a computer-accessible medium (e.g., RAM, ROM, hard drive, or other storage device).

As shown in FIG. 17, e.g., a computer-accessible medium 1730 (e.g., as described herein above, a storage device such as a hard disk, floppy disk, memory stick, CD-ROM, RAM, ROM, etc., or a collection thereof) can be provided (e.g., in communication with the processing arrangement 1710). The computer-accessible medium 1730 can contain executable instructions 1740 thereon. In addition or alternatively, a storage arrangement 1750 can be provided separately from the computer-accessible medium 1730, which can provide the instructions to the processing arrangement 1710 so as to configure the processing arrangement to execute certain exemplary procedures, processes and methods, as described herein above, for example.

Further, the exemplary processing arrangement 1710 can be provided with or include an input/output arrangement 1770, which can include, e.g., a wired network, a wireless network, the internet, an intranet, a data collection probe, a sensor, etc. As shown in FIG. 17, the exemplary processing arrangement 1710 can be in communication with an exemplary display arrangement 1760, which, according to certain exemplary embodiments of the present disclosure, can be a touch-screen configured for inputting information to the processing arrangement in addition to outputting information from the processing arrangement, for example. Further, the exemplary display 1760 and/or a storage arrangement 1750 can be used to display and/or store data in a user-accessible format and/or user-readable format.

Figure 18:
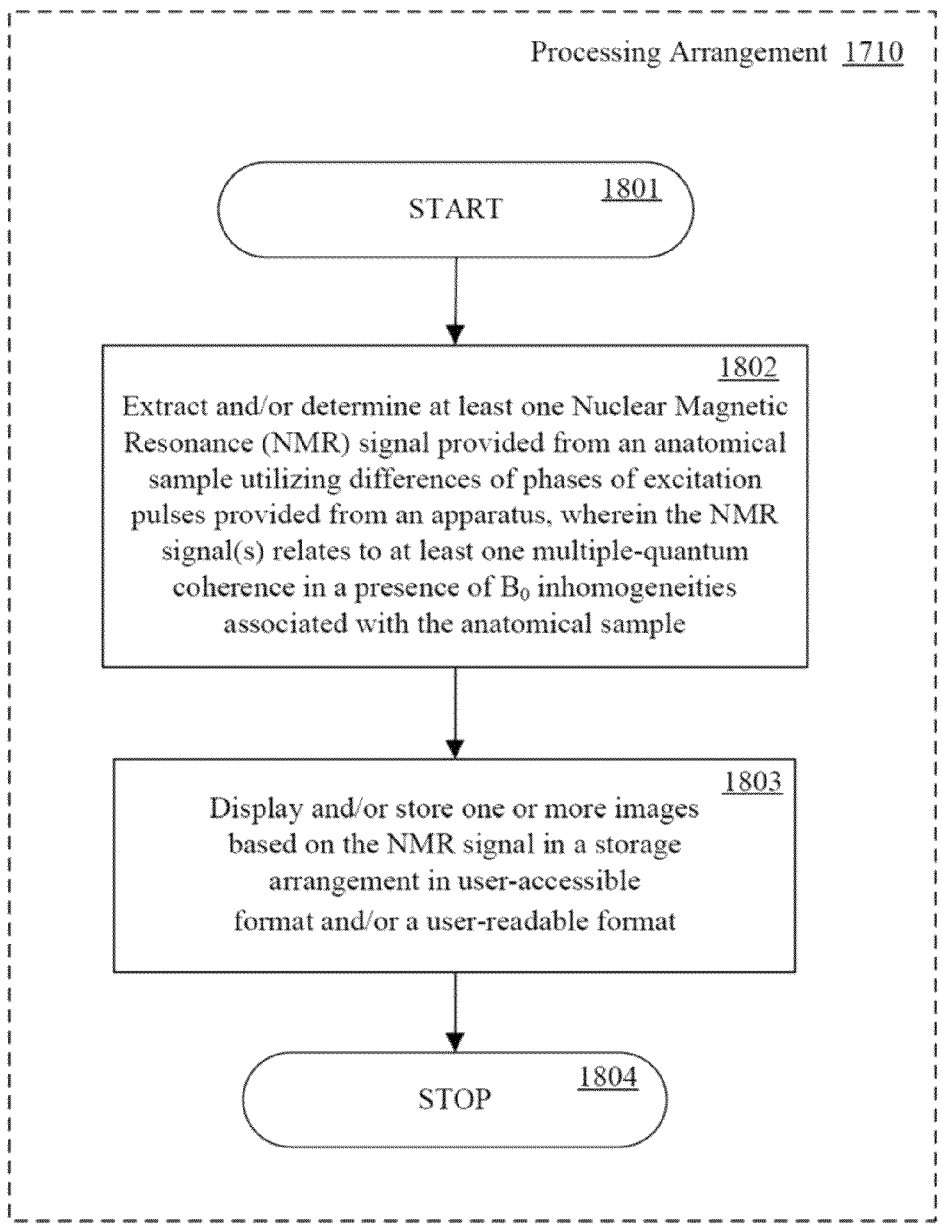
FIG. 18 is flow diagram of a procedure for generating tracer concentration data associated with a structure in accordance with certain exemplary embodiments of the present disclosure.

FIG. 18 shows a flow diagram of an exemplary procedure in accordance with certain exemplary embodiments of the present disclosure. As shown in FIG. 18, the exemplary procedure illustrated in FIG. 18 can be executed on and/or by, e.g., the processing/computing arrangements 1610 and/or 1710. For example, starting at subprocess 1801, the exemplary procedure can, in subprocess 1802, extract and/or determine at least one Nuclear Magnetic Resonance (NMR) signal provided from an anatomical sample utilizing differences of phases of excitation pulses provided from an apparatus, where the NMR signal(s) relates to at least one multiple-quantum coherence in a presence of $B_0$ inhomogeneities associated with the anatomical sample. Then, in subprocess 1830, the exemplary procedure can display and/or store one or more images based on the NMR signal in a storage arrangement a user-accessible format and/or a user-readable format.

Figure 19:
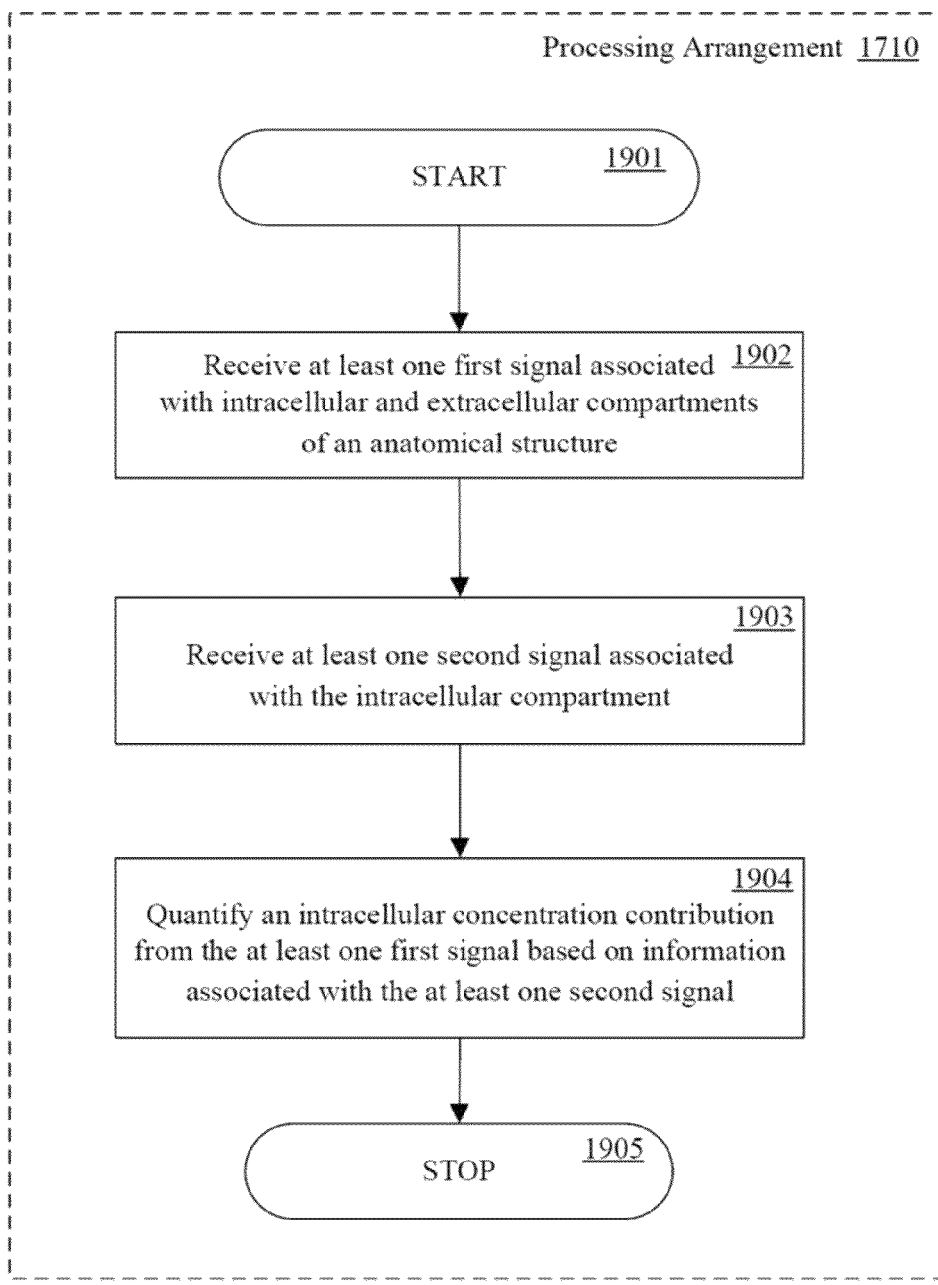
FIG. 19 is a flow diagram of another exemplary procedure in accordance with certain exemplary embodiments of the present disclosure.

FIG. 19 shows a flow diagram of another exemplary procedure in accordance with certain exemplary embodiments of the present disclosure. As shown in FIG. 19, the exemplary procedure illustrated in FIG. 19 can be executed on and/or by, e.g., the processing/computing arrangements 1610 and/or 1710. For example, starting at subprocess 1901, the exemplary procedure can, in subprocess 1902, receive at least one first signal associated with intracellular and extracellular compartments of an anatomical structure. In subprocess 1903, the exemplary procedure can receive at least one second signal associated with the intracellular compartment. Then, in subprocess 1904, the exemplary procedure can quantify an intracellular concentration contribution from the at least one first signal based on information associated with the at least one second signal.

Exemplary Representations of Methods/Procedures According to the Present Disclosure Exemplary Representation of a 14-Step Cycle Procedure in Accordance with Certain Exemplary Embodiments of the Present Disclosure.

Figure 20:
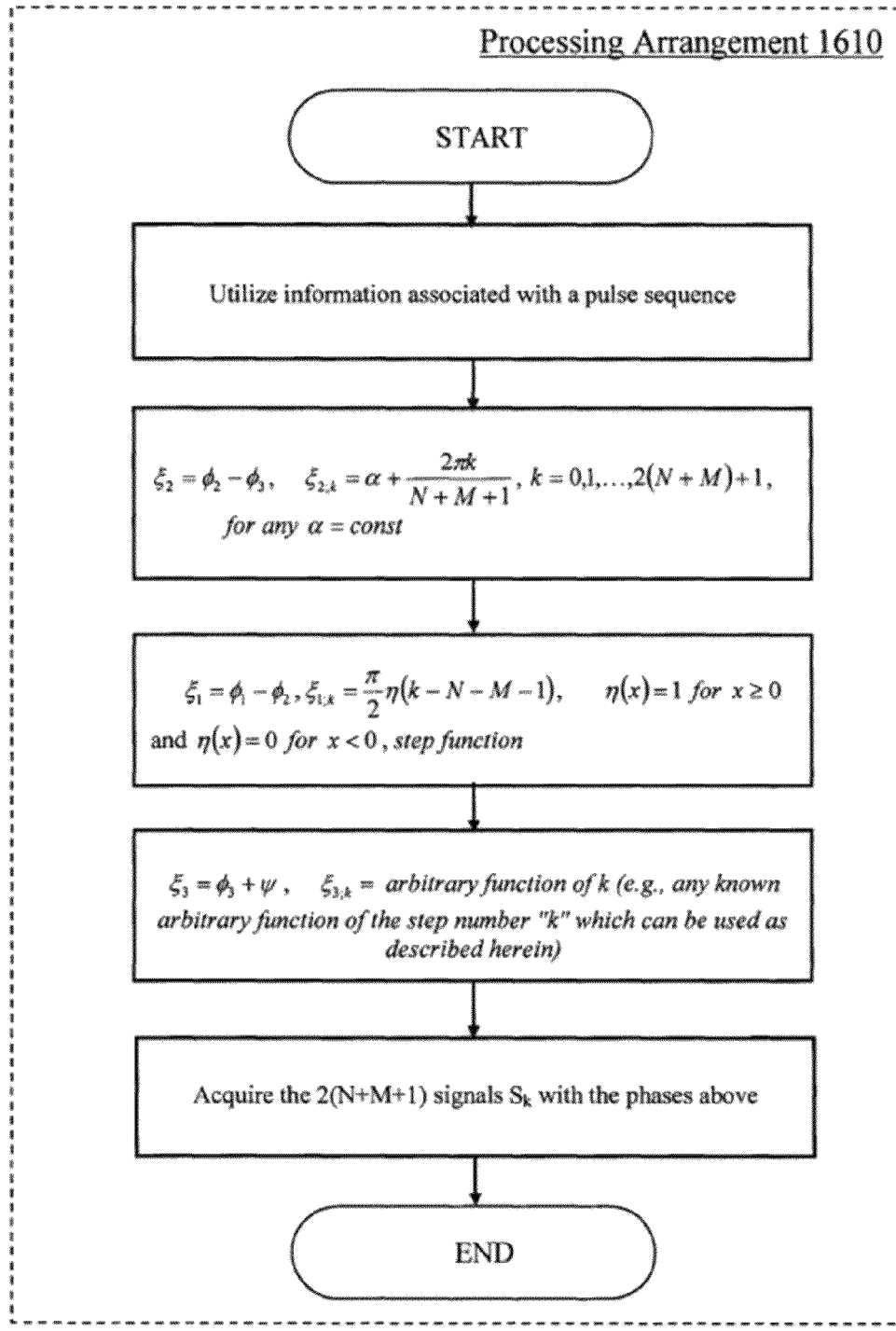
FIG. 20 is a flow diagram of yet another exemplary procedure in accordance with certain exemplary embodiments of the present disclosure.

The following exemplary procedure can be used to extract $B_0$-corrected MQF signals of coherence order up to M (inclusive) in a system with N-th order of coherence (M≤N) using 2(N+M+1) steps, for example. As illustrated in FIG. 20, the following exemplary procedure can be executed on and/or by, e.g., the processing/computing arrangements 1610 and/or 1710.

Figure 1B:
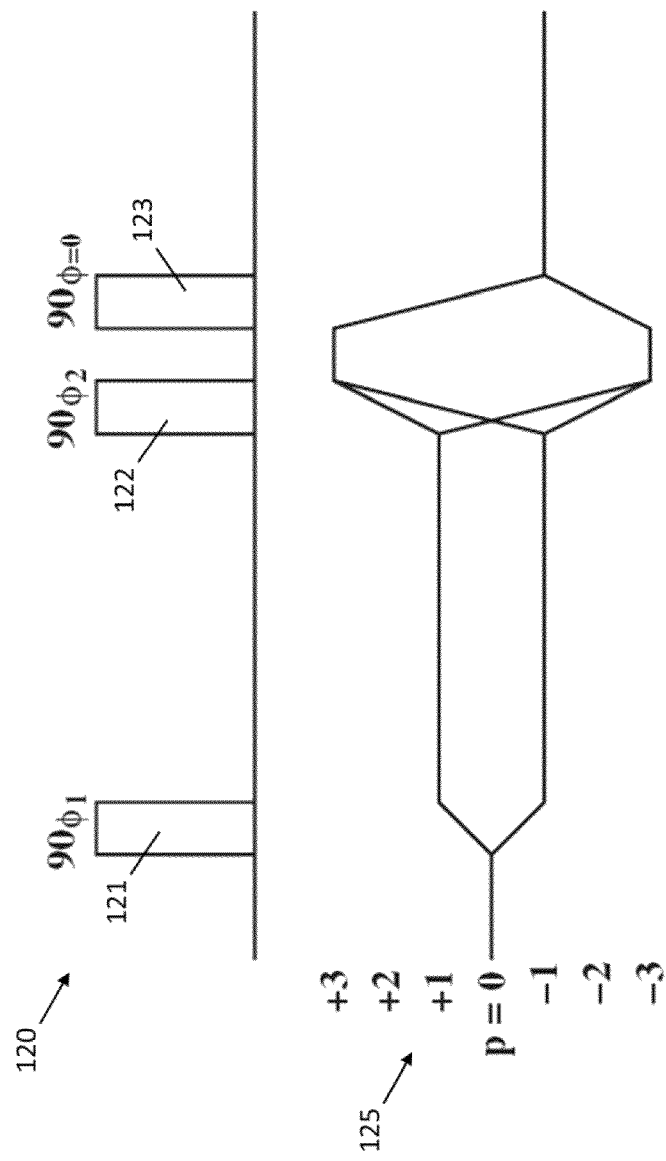
FIG. 1B is a pulse sequence and coherence-transfer-pathway diagram for triple-quantum-filtration generated using a TQF procedure according to a second exemplary implementation.
Figure 1C:
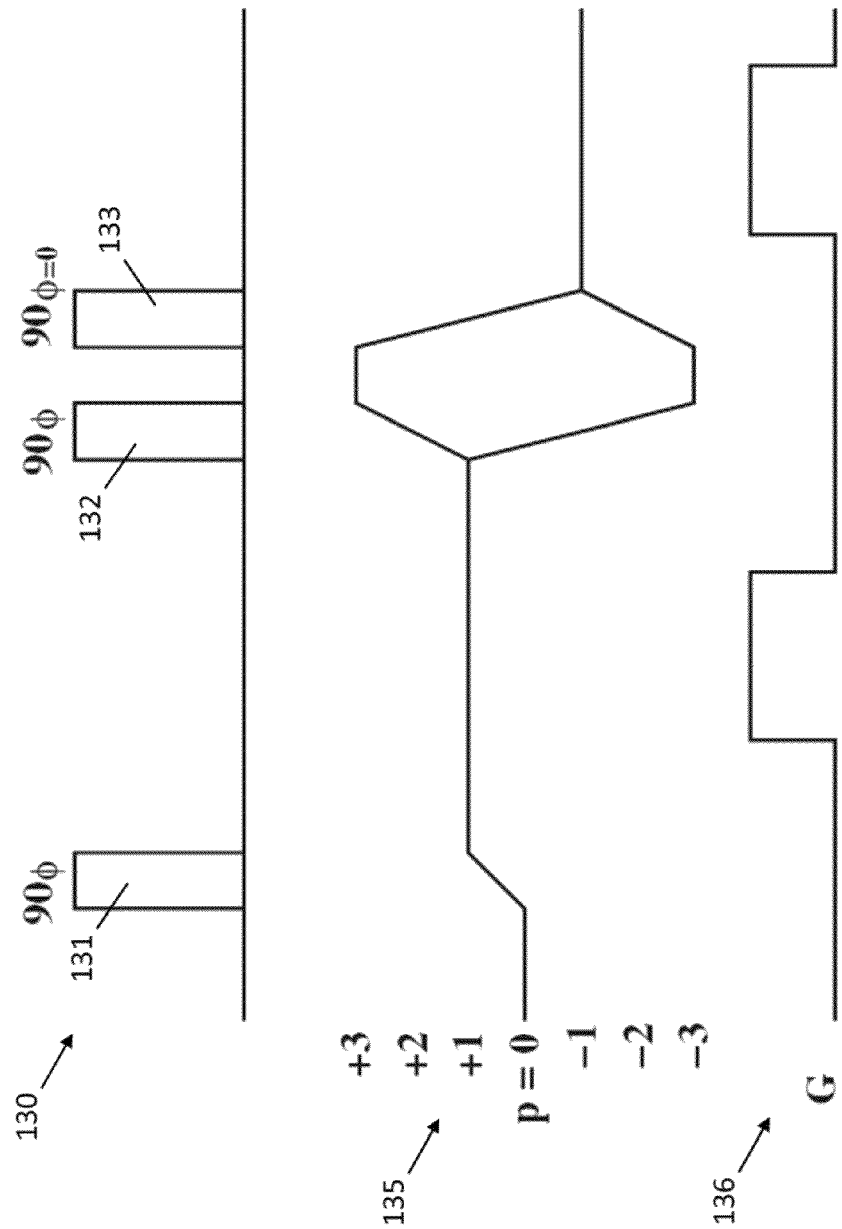
FIG. 1C is an exemplary pulse sequence and coherence-transfer-pathway diagram for triple-quantum-filtration generated using a TQF procedure according to a third exemplary implementation.

1. Utilize information associated with a pulse sequence such as illustrated in FIG. 1 and described herein, for example;
2. $\xi_2 = \phi_2 - \phi_3$, $$\xi_{2;k} = \alpha + \frac{2\pi k}{N+M+1},$$

k=0, 1, . . . , 2 (N+M)+1, for any α=const;
3. $\xi_1 = \phi_1 - \phi_2$, $$\xi_{1;k} = \frac{\pi}{2}\eta(k - N - M - 1),$$

η(x)=1 for x≥0 and η(x)=0 for x<0, step function;
4. $\xi_3 = \phi_3 + \psi$, $\xi_{3;k}$=arbitrary function of k (e.g., any known arbitrary function of the step number "k" which can be used as described in exemplary Equation 27;
5. Acquire the 2(N+M+1) signals $S_k$ with the phases above; Exemplary Data Processing.
1. Multiply $S_k$ by $e^{-i\xi_{3;k}}$ to remove its effect.
2. Arrange data according to cycle index into 2×(N+M+1) array.

| k = 0 | k = 1 | . . . | k = N + M |
| k = N + M + 1 | k = N + M + 2 | . . . | k = 2(N + M) + 1 |

3. Multiply the Data in the second row by i.
4. Apply 2D Fourier transformation to the array.
5. Multiply each column by corresponding $e^{ip_2\alpha}$ (index $p_2$ depends on the FFT implementation). This provides the individual coherence transfer amplitudes $B_{p_1p_2}$.
6. Correct the obtained amplitudes of order up to M (inclusive) with phase due to $B_0$-offset $e^{i(p_1\tau_1+p_2\tau_2)\Omega}$.
7. Recombine the corrected amplitudes as needed.

Exemplary amplitudes due to orders of coherence up to M can be reconstructed in the exemplary method. The 14-step cycle paper considers example with N=3, M=3 and the supplement demonstrates how m=2 can be extracted when N=3, M=3 acquisition is used.

Figure 21:
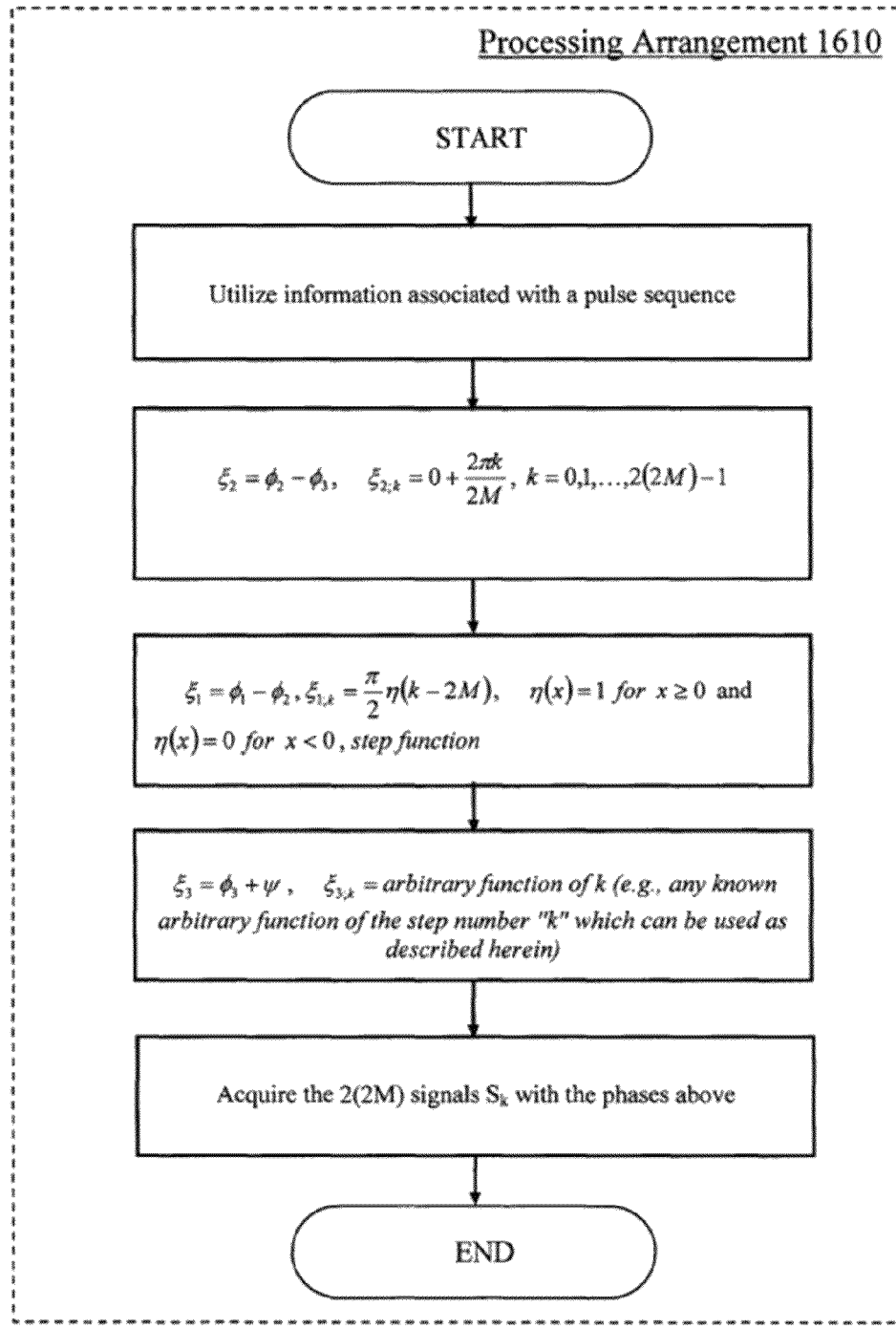
FIG. 21 is a flow diagram of still yet another exemplary procedure in accordance with certain exemplary embodiments of the present disclosure.

Exemplary Representation of a 12-Step Cycle Procedure in Accordance with Certain Exemplary Embodiments of the Present Disclosure The following exemplary procedure can be used to more efficiently (e.g., relative to other procedures) $B_0$-corrected MQF signals of coherence order M in a system with N-th order of coherence (N/3<M<=N) using 4M steps. Further, certain exemplary embodiments according to the present disclosure the following procedure can provide for extraction of up to (M−N/3) (inclusive) coherence transfer amplitudes with substantially the same or similar efficiency as the certain exemplary embodiments of the 14-Step Cycle Procedure described herein above, for example. As illustrated in FIG. 21, the following exemplary procedure can be executed on and/or by, e.g., the processing/computing arrangements 1610 and/or 1710.

1. Utilize information associated with a pulse sequence such as illustrated in FIG. 1 and described herein, for example;
2. $\xi_2 = \phi_2 - \phi_3$, $$\xi_{2;k} = 0 + \frac{2\pi k}{2M},$$

k=0, 1, . . . , 2(2M)−1;
3. $\xi_1 = \phi_1 - \phi_2$, $$\xi_{1;k} = \frac{\pi}{2}\eta(k - 2M),$$

η(x)=1 for x≥0 and η(x)=0 for x<0, step function;
4. $\xi_3 = \phi_3 + \psi$, $\xi_{3;k}$=arbitrary function of k (e.g., any known arbitrary function of the step number "k" which can be used as described in exemplary Equation 27).
5. Acquire the 2(2M) signals $S_k$ with the phases above; and Exemplary Data Processing
1. Multiply $S_k$ by $e^{-i\xi_{3;k}}$ to remove its effect. (e.g., the phase ψ (or $\xi_3$) can be irrelevant and removed when known to exist);
2. Arrange data according to cycle index into a 2×(2M) array, such as follows;

| k = 0 | k = 1 | . . . | k = 2M − 1 |
| k = 2M | k = 2M + 1 | . . . | k = 2(2M) − 1 |

3. Multiply the Data in the second row of the array by I;
4. Apply a 2D Fourier transformation to the array;
5. This can provide the individual coherence transfer amplitudes ($B_{p_1}^{+M} + B_{p_1}^{-M}$) (indexing into the array depends on FFT implementation);
6. Correct the obtained amplitudes of order M with phase due to $B_0$-offset $e^{ip_1\tau_1\Omega}$;
7. Recombine the corrected amplitudes as needed;
8. Coherences of order up to (M−N/3) (inclusive) can be reconstructed as described in herein above with respect to the exemplary representation of a 14-step cycle procedure in accordance with certain exemplary embodiments of the present disclosure, but with a substitution of N=M−1, for example.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. In addition, all publications and references referred to above can be incorporated herein by reference in their entireties. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and claims thereof, can be used synonymously in certain instances, including, but not limited to, e.g., data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it can be explicitly being incorporated herein in its entirety. All publications referenced above can be incorporated herein by reference in their entireties.

What is claimed is:

1. A non-transitory computer-accessible medium having stored thereon computer-executable instructions configured for generating $B_0$ corrected Nuclear Magnetic Resonance (NMR) data regarding at least one arbitrary anatomical sample, wherein, when a computer arrangement executes the instructions, the computer arrangement is configured to perform procedures comprising:
    causing the generation of at least one NMR signal utilizing phase differences of excitation pulses, wherein the at least one NMR signal relates to at least one multiple-quantum coherence existing in the arbitrary anatomical sample while in a presence of $B_0$ inhomogeneities associated with the at least one arbitrary anatomical sample;
    receiving the at least one generated NMR signal;
    generating the $B_0$ corrected NMR data from the received at least one NMR signal by applying a $B_0$ correction to the received at least one NMR signal in order to remove destructive interference in the presence of $B_0$ inhomogeneities, contributing to the received at least one NMR signal; and
    at least one of displaying or storing in a storage arrangement the $B_0$ generated corrected NMR data.

2. The non-transitory computer-accessible medium of claim 1, wherein the multiple quantum coherence is a triple quantum coherence.

3. The non-transitory computer-accessible medium of claim 1, wherein the computer arrangement is further configured to utilize twelve phase cycling procedures.

4. The non-transitory computer-accessible medium of claim 3, wherein the computer arrangement is further configured to phase correct amplitudes due to coherence pathways of the at least one generated NMR signal based on a $B_0$-map prior to a recombination of the amplitudes.

5. The non-transitory computer-accessible medium of claim 4, wherein the at least one generated NMR signal is measured without a separated measurement of each of the coherence pathways.

6. The non-transitory computer-accessible medium of claim 1, wherein the computer arrangement is further configured to utilize the fourteen phase cycling procedure.

7. The non-transitory computer-accessible medium of claim 1, wherein the multiple quantum coherence is a double quantum coherence.

8. The non-transitory computer-accessible medium of claim 1, wherein the computer arrangement is further configured to at least one of generate or correct multiple-quantum-filtered images associated with the arbitrary anatomical structure for $B_0$ inhomogeneity without a $B_0$ map regarding the arbitrary anatomical structure.

9. The non-transitory computer-accessible medium of claim 1, wherein the at least one NMR signal is provided from the arbitrary anatomical sample in vivo.

10. The non-transitory computer-accessible medium of claim 1, wherein the computer arrangement is further configured to apply the $B_0$ correction in order to remove the destructive interference in the presence of $B_0$ inhomogeneities corresponding to spatial variations in $B_0$ of ten to thirty Hz.

11. The non-transitory computer-accessible medium of claim 1, wherein the computer arrangement is further configured to apply the $B_0$ correction in order to remove the destructive interference in the presence of $B_0$ inhomogeneities corresponding to a whole-sample water line-width of at least about 45 Hz full width at half maximum (FWHM).

12. The non-transitory computer-accessible medium of claim 1, wherein the $B_0$ inhomogeneities are sample-dependent spatially-varying $B_0$ inhomogeneities.

13. A method of generating $B_0$ corrected Nuclear Magnetic Resonance (NMR) data regarding at least one arbitrary anatomical sample, comprising:
    causing the generation of at least one NMR signal utilizing phase differences of excitation pulses, wherein the at least one NMR signal relates to at least one multiple-quantum coherence existing in the arbitrary anatomical sample while in a presence of $B_0$ inhomogeneities associated with the at least one arbitrary anatomical sample;
    receiving the at least one generated NMR signal;
    generating the $B_0$ corrected NMR data from the received at least one NMR signal by applying a $B_0$ correction to the received at least one NMR signal in order to remove destructive interference, in the presence of $B_0$ inhomogeneities, contributing to the received at least one NMR signal; and
    using a computer hardware arrangement, at least one of displaying or storing in a storage arrangement the $B_0$ generated corrected NMR data.

14. The method of claim 13, wherein the multiple quantum coherence is at least one of a double quantum coherence of a triple quantum coherence.

15. The method of claim 13, wherein the at least one signal is provided from the arbitrary anatomical sample in vivo.

16. The method of claim 13, further comprising applying the $B_0$ correction in order to remove the destructive interference in the presence of $B_0$ inhomogeneities corresponding to spatial variations in $B_0$ of ten to thirty Hz.

17. The method of claim 13, further comprising applying the $B_0$ correction in order to remove the destructive interference in the presence of $B_0$ inhomogeneities corresponding to a whole-sample water line-width of at least about 45 Hz full width at half maximum (FWHM).

18. The method of claim 13, wherein the $B_0$ inhomogeneities are sample-dependent spatially-varying $B_0$ inhomogeneities.

19. The method of claim 13, wherein the multiple quantum coherence is at least one of a double quantum coherence or a triple quantum coherence.

20. The method of claim 13, wherein the computer hardware arrangement is further configured to utilize at least one of twelve or fourteen phase cycling procedures.

21. An NMR compatible system configured for generating $B_0$ corrected Nuclear Magnetic Resonance (NMR) data regarding at least one arbitrary anatomical sample, comprising:
 a computer hardware arrangement configured for:
  causing the generation of at least one NMR signal utilizing phase differences of excitation pulses, wherein the at least one NMR signal relates to at least one multiple-quantum coherence existing in the arbitrary anatomical sample while in a presence of $B_0$ inhomogeneities associated with the at least one arbitrary anatomical sample;
  receiving the at least one generated NMR signal;
  generating the $B_0$ corrected NMR data from the received at least one NMR signal by applying a $B_0$ correction to the received at least one NMR signal in order to remove destructive interference, in the presence of $B_0$ inhomogeneities, contributing to the received at least one NMR signal; and
 at least one of displaying or storing in a storage arrangement the $B_0$ generated corrected NMR data.

22. The NMR compatible system of claim 21, wherein the multiple quantum coherence is at least one of a double quantum coherence or a triple quantum coherence.

23. The NMR compatible system of claim 21, wherein the computer hardware arrangement is further configured to utilize at least one of twelve or fourteen phase cycling procedures.

24. The NMR compatible system of claim 21, wherein the computer hardware arrangement is further configured to at least one of generate or correct multiple-quantum-filtered images associated with the arbitrary anatomical structure for $B_0$ inhomogeneity without a $B_0$ map regarding the arbitrary anatomical structure.

25. The NMR compatible system of claim 21, wherein the at least one NMR signal is provided from the arbitrary anatomical sample in vivo.

26. The NMR compatible system of claim 21, wherein the computer arrangement is further configured to apply the $B_0$ correction in order to remove the destructive interference in the presence of $B_0$ inhomogeneities corresponding to spatial variations in $B_0$ of ten to thirty Hz.

27. The NMR compatible system of claim 21, wherein the computer arrangement is further configured to apply the $B_0$ correction in order to remove the destructive interference in the presence of $B_0$ inhomogeneities corresponding to a whole-sample water line-width of at least about 45 Hz full width at half maximum (FWHM).

28. The NMR compatible system of claim 21, wherein the $B_0$ inhomogeneities are sample-dependent spatially-varying $B_0$ inhomogeneities.

29. A non-transitory computer-accessible medium having stored thereon computer-executable instructions configured for displaying a quantified representation of an intracellular concentration contribution of at least one anatomical structure, wherein, when a computer arrangement executes the instructions, the computer arrangement is configured to perform procedures comprising:
 receiving, from a magnetic resonance compatible system, at least one first magnetic resonance signal associated with intracellular and extracellular compartments of the anatomical structure;
 receiving, from the magnetic resonance compatible system, at least one second magnetic resonance signal associated with the intracellular and extracellular compartments of the anatomical structure, wherein intensities of the at least one first and second magnetic resonance signals relate differently to intracellular and extracellular content;
 quantifying the intracellular concentration contribution from the at least one first magnetic resonance signal based on information associated with the at least one second magnetic resonance signal; and
 displaying the quantified representation of the intracellular concentration contribution with the quantified representation display;
 wherein at least one of the first magnetic resonance signal or the second magnetic resonance signal comprises a single-quantum signal (S_SQ), and wherein the second signal comprises a triple-quantum filtered signal (S_TQF);
 determining a magnetic resonance signal decay associated with at least one of the S_SQ or the S_TQF;
 compensating at least one of the S_SQ or the S_TQF for the magnetic resonance signal decay;
 determining a presence of flip angle errors associated with at least one of the S_SQ or the S_TQF based on the anatomical structure; and
 correcting at least one of the S_SQ or the S_TQF based on the determined presence of the flip angle errors.

30. The non-transitory computer-accessible medium of claim 29, further comprising at least one of displaying or storing one or more magnetic resonance images based on the quantified representation of the intracellular concentration contribution in a storage arrangement in at least one of a user-accessible format or a user-readable format.

31. A magnetic resonance compatible system configured for displaying a quantified representation of an intracellular concentration contribution of at least one anatomical structure, comprising:
 at least one magnetic resonance arrangement with a quantified representation display comprising a processor and which is configured to:
  receive, from the magnetic resonance compatible system, at least one first magnetic resonance signal associated with intracellular and extracellular compartments of the anatomical structure;
  receive, from the magnetic resonance compatible system, at least one second magnetic resonance signal associated with the intracellular and extracellular compartments of the anatomical structure, wherein intensities of the at least one first and second magnetic resonance signals relate differently to intracellular and extracellular content;
  quantify the intracellular concentration contribution from the at least one first magnetic resonance signal based on information associated with the at least one second magnetic resonance signal; and
  display the quantified representation of the intracellular concentration contribution with the quantified representation display;
 wherein at least one of the first magnetic resonance signal or the second magnetic resonance signal comprises a single-quantum signal (S_SQ), wherein the second signal comprises a triple-quantum filtered signal (S_TQF), and wherein the at least one magnetic resonance arrangement is further configured to quantify the intracellular concentration contribution by:
determining a magnetic resonance signal decay associated with at least one of the S_SQ or the S_TQF;
compensating at least one of the S_SQ or the S_TQF for the magnetic resonance signal decay;
determining a presence of flip angle errors associated with at least one of the S_SQ or the S_TQF based on the anatomical structure; and
correcting at least one of the S_SQ or the S_TQF based on the determined presence of the flip angle errors.

32. The magnetic resonance compatible system of claim 31, wherein the at least one magnetic resonance arrangement is further configured to quantify the intracellular concentration contribution by:
converting the S_SQ into a tissue molecular concentration (TMC) using a further S_SQ obtained from a reference; and
computing an intracellular molecular molar fraction (IMMF) based on at least one of the S_SQ or the S_TQF.

33. The magnetic resonance compatible system of claim 32, wherein the TMC comprises a tissue sodium concentration (TSC), and wherein the IMMF comprises an intracellular sodium molar fraction (ISMF).

34. The magnetic resonance compatible system of claim 32, wherein the at least one magnetic resonance arrangement is further configured to quantify the intracellular concentration contribution by:
computing an intracellular molecular concentration (IMC) and an intracellular molecular volume fraction (IMVF) based on the IMMF and the TMC; and
quantifying the intracellular concentration contribution based on at least one of the computed IMC or the computed IMVF.

35. The magnetic resonance compatible system of claim 34, wherein the IMC comprises an intracellular sodium concentration (ISC), and wherein the IMVF comprises an intracellular sodium volume fraction (ISVF).

36. The magnetic resonance compatible system of claim 34, wherein the ISMF is computed based on at least one of (i) a measured relaxation constant, or (ii) information associated with at least one of the S_SQ or the S_TQF.

37. The magnetic resonance compatible system of claim 31, wherein the at least one magnetic resonance arrangement is further configured to quantify the intracellular concentration contribution using an intracellular sodium molar fraction (ISMF).

38. A method of displaying a quantified representation of an intracellular concentration contribution of at least one anatomical structure, comprising:
receiving, from a magnetic resonance compatible system, at least one first magnetic resonance signal associated with intracellular and extracellular compartments of the anatomical structure;
receiving, from the magnetic resonance compatible system, at least one second magnetic resonance signal associated with the intracellular and extracellular compartments of the anatomical structure, wherein intensities of the at least one first and second magnetic resonance signals relate differently to intracellular and extracellular content;
quantifying the intracellular concentration contribution from the at least one first magnetic resonance signal based on information associated with the at least one second magnetic resonance signal; and
displaying the quantified representation of the intracellular concentration contribution with the quantified representation display;
wherein at least one of the first magnetic resonance signal or the second magnetic resonance signal comprises a single-quantum signal (S_SQ), and wherein the second signal comprises a triple-quantum filtered signal (S_TQF);
determining a magnetic resonance signal decay associated with at least one of the S_SQ or the S_TQF;
compensating at least one of the S_SQ or the S_TQF for the magnetic resonance signal decay;
determining a presence of flip angle errors associated with at least one of the S_SQ or the S_TQF based on the anatomical structure; and
using a computer hardware arrangement, correcting at least one of the S_SQ or the S_TQF based on the determined presence of the flip angle errors.

39. The method of claim 38, wherein the quantified representation quantified representation of the intracellular concentration contribution is a magnetic resonance image and the magnetic resonance image is at least one of displayed or stored in a storage arrangement in at least one of a user-accessible format or a user-readable format.

* * * * *